US012804288B2

(12) United States Patent
Kawasaki

(10) Patent No.: US 12,804,288 B2
(45) Date of Patent: Nov. 17, 2026

(54) IMAGE SENSOR WITH LAYERED STRUCTURE FOR SIZE REDUCTION

(71) Applicant: Sony Semiconductor Solutions Corporation, Kanagawa (JP)

(72) Inventor: Ryohei Kawasaki, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 33 days.

(21) Appl. No.: 18/855,654

(22) PCT Filed: Apr. 24, 2023

(86) PCT No.: PCT/JP2023/016160
§ 371 (c)(1),
(2) Date: Oct. 10, 2024

(87) PCT Pub. No.: WO2023/218934
PCT Pub. Date: Nov. 16, 2023

(65) Prior Publication Data

US 2025/0287122 A1 Sep. 11, 2025

(30) Foreign Application Priority Data

May 10, 2022 (JP) ................................ 2022-077702

(51) Int. Cl.
*H04N 25/772* (2023.01)
*H10F 39/00* (2025.01)

(52) U.S. Cl.
CPC ......... *H04N 25/772* (2023.01); *H10F 39/802* (2025.01); *H10F 39/803* (2025.01)

(58) Field of Classification Search
CPC ...... H04N 25/772; H04N 25/79; H04N 25/70; H10F 39/802; H10F 39/803
See application file for complete search history.

(56) References Cited

U.S. PATENT DOCUMENTS 9,001,251 B2 * 4/2015 Smith ................. H04N 25/766 348/308
11,315,330 B1 * 4/2022 Liu ....................... G06V 20/64
(Continued)

FOREIGN PATENT DOCUMENTS

JP 2020-072410 A 5/2020
JP 2020-113809 A 7/2020

OTHER PUBLICATIONS

International Search Report and Written Opinion mailed on Jul. 11, 2023, received for PCT Application No. PCT/JP2023/016160, filed on Apr. 24, 2023, 9 pages including English Translation.

*Primary Examiner* — Chiawei Chen
(74) *Attorney, Agent, or Firm* — Xsensus LLP

(57) ABSTRACT

An image sensor according to the present technology has a layered structure that includes a first layer, a second layer, and a third layer. The first layer includes a pixel array unit where multiple pixels are two-dimensionally arrayed. The second layer includes a conversion processing unit configured to perform A/D conversion for converting an analog signal based on a pixel signal output from the pixel array unit, into a digital signal, and a second layer storage unit configured to store image data for each frame, the image data being digital data based on the digital signal. The third layer includes an inference processing unit configured to perform an inference process on the basis of the image data as an input tensor.

11 Claims, 39 Drawing Sheets

(56) References Cited

U.S. PATENT DOCUMENTS

| | | | | |
|---|---|---|---|---|
| 11,350,046 | B2 * | 5/2022 | Eki | H04N 23/61 |
| 11,490,043 | B2 * | 11/2022 | Tokunaga | H03M 1/56 |
| 11,568,609 | B1 * | 1/2023 | Liu | G06N 3/0464 |
| 11,735,614 | B2 * | 8/2023 | Eki | G06F 18/214<br>348/222.1 |
| 11,792,551 | B2 * | 10/2023 | Eki | H10F 39/1825<br>348/294 |
| 12,446,350 | B2 * | 10/2025 | Eki | G06V 20/58 |
| 2010/0220436 | A1 * | 9/2010 | Miyamoto | G06F 1/187<br>361/679.32 |
| 2015/0189214 | A1 * | 7/2015 | Kurose | H10F 39/8037<br>250/208.1 |
| 2015/0288908 | A1 * | 10/2015 | Shen | G06F 30/392<br>348/308 |
| 2017/0358564 | A1 * | 12/2017 | Lee | H01L 25/18 |
| 2018/0226441 | A1 * | 8/2018 | Kondo | H04N 25/70 |
| 2019/0035154 | A1 * | 1/2019 | Liu | G06F 18/241 |
| 2021/0057473 | A1 * | 2/2021 | Wada | H10F 39/802 |
| 2021/0264679 | A1 * | 8/2021 | Liu | G06V 40/19 |
| 2022/0196967 | A1 * | 6/2022 | Dai | G03B 3/10 |
| 2022/0309394 | A1 * | 9/2022 | Huh | G06N 20/00 |
| 2023/0204769 | A1 * | 6/2023 | Seta | G01S 17/93<br>702/159 |
| 2023/0421927 | A1 * | 12/2023 | Moue | H04N 25/00 |
| 2024/0155270 | A1 * | 5/2024 | Eki | H04N 25/00 |
| 2024/0388444 | A1 * | 11/2024 | Wang | G06F 21/16 |
| 2025/0301243 | A1 * | 9/2025 | Bobda | H04N 25/79 |

* cited by examiner

IMAGE SENSOR WITH LAYERED STRUCTURE FOR SIZE REDUCTION

CROSS-REFERENCE TO RELATED APPLICATIONS

The present application is based on PCT filing PCT/JP2023/016160, filed Apr. 24, 2023, which claims priority from Japanese Patent Application No. 2022-077702, filed May 10, 2022, the entire contents of each are incorporated herein by reference.

TECHNICAL FIELD

The present technology relates to a technical field of an image sensor which performs an inference process using an artificial intelligence model.

BACKGROUND ART

There is such a type of image sensor that is included in a camera device and that is capable of performing an inference process by use of an artificial intelligence model deployed in the image sensor. Such an image sensor enables various processes to be performed on an edge side device, and thus is suited for use applications in view of prevention of concentration of processing loads and concentration of data on a server.

For example, this corresponds to such an image sensor including a lamination of multiple dies as disclosed in PTL 1 listed below.

CITATION LIST

Patent Literature

[PTL 1]
Japanese Patent Laid-open No. 2020-113809

SUMMARY

Technical Problem

A known configuration of such an image sensor includes a first layer where pixels are two-dimensionally arrayed and a second layer where all elements other than the pixels are provided.

Meanwhile, an attempt of performance improvement which may be made for the image sensor, such as use of AI (Artificial Intelligence) for executing image processing, increases the number of elements mounted in the second layer, and therefore increases a chip size of the second layer.

This increase in the chip size of the second layer further increases a chip size of the first layer, and consequently may produce a surplus region containing no part to be mounted.

The present technology has been developed in consideration of the problem described above. It is an object of the present technology to achieve size reduction of an image sensor where an artificial intelligence model is deployed.

Solution to Problem

An image sensor according to the present technology has a layered structure that includes a first layer, a second layer, and a third layer. The first layer includes a pixel array unit where multiple pixels are two-dimensionally arrayed. The second layer includes a conversion processing unit configured to perform A/D conversion for converting an analog signal based on a pixel signal output from the pixel array unit, into a digital signal, and a second layer storage unit configured to store image data for each frame, the image data being digital data based on the digital signal. The third layer includes an inference processing unit configured to perform an inference process on the basis of the image data as an input tensor.

This configuration can achieve size reduction of an image sensor where an artificial intelligence model is deployed.

DESCRIPTION OF EMBODIMENT

An information processing device according to an embodiment of the present technology will hereinafter be described in the following order with reference to the accompanying drawings.

<1. Overall configuration of information processing system>
<2. Registration of AI model and AI application>
<3. System function outline>
<4. Configuration of imaging device>
<5. Configuration of image sensor>
<6. Different examples of configuration of image sensor>
<7. Examples of AI image processing>
<7-1. First example>
<7-2. Second example>
<7-3. Third example>
<7-4. Fourth example>
<7-5. Fifth example>
<8. Flow of processing>
<8-1. First example and second example>
<8-2. Third example>
<8-3. Fourth example>
<8-4. Fifth example>
<9. Timing chart>
<10. Configuration for privacy protection>
<10-1. Configuration example 1 of image sensor>
<10-2. Configuration example 2 of image sensor>
<10-3. Configuration example 3 of image sensor>
<11. Modifications>
<12. Deployment of AI model and AI application>
<13. Hardware configuration of information processing device>
<14. Others>
<15. Screen example of marketplace>
<16. Summary>
<16-1. Summary 1>
<16-2. Summary 2>
<16-3. Summary 3>
<17. Present technology>

1. Overall Configuration of Information Processing System

Figure 1:
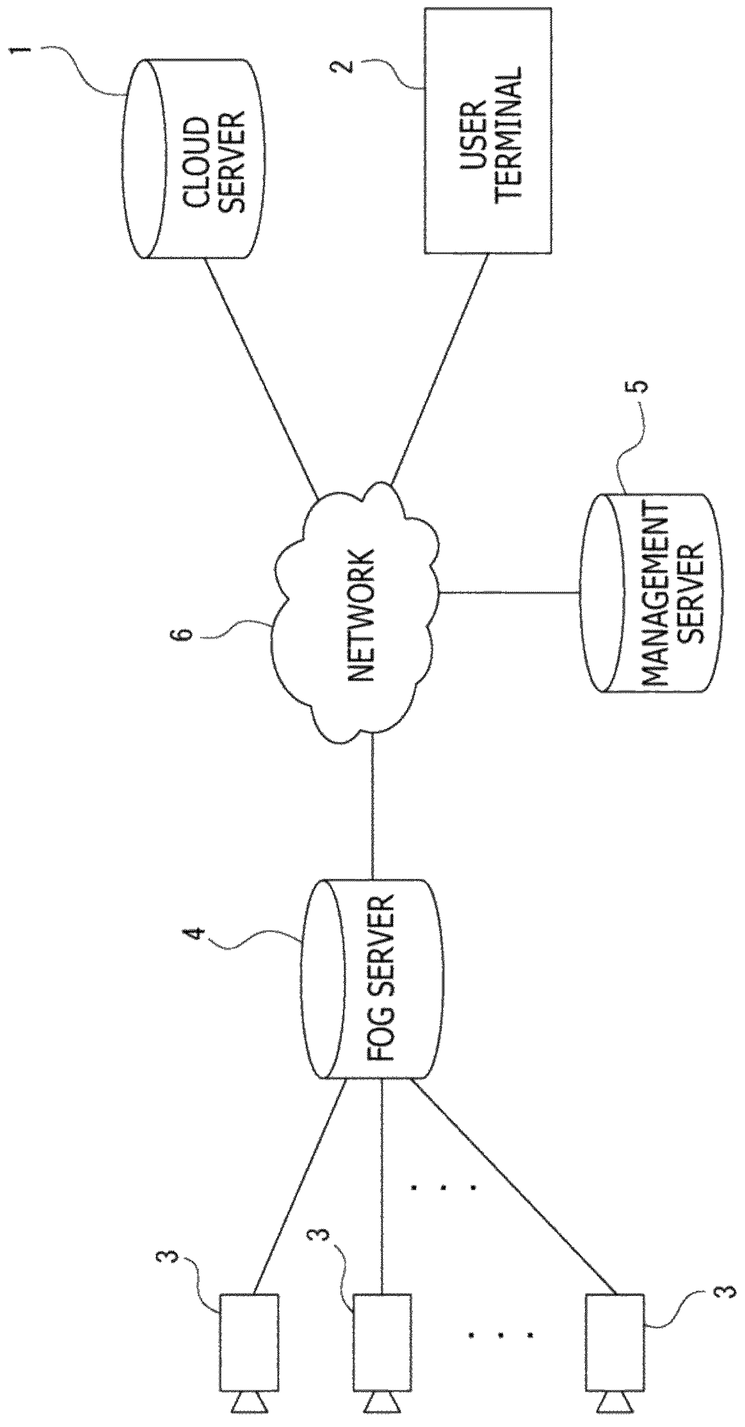
FIG. 1 is a diagram illustrating a configuration example of an information processing system.

FIG. 1 is a block diagram illustrating a schematic configuration example of an information processing system 100 according to an embodiment of the present technology.

As illustrated in the figure, the information processing system 100 includes a cloud server 1, a user terminal 2, multiple cameras 3, a fog server 4, and a management server 5. According to the present example, the cloud server 1, the user terminal 2, the fog server 4, and the management server 5 are capable of communicating with each other via a network 6 such as the Internet, for example.

The cloud server 1, the user terminal 2, the fog server 4, and the management server 5 are each configured as an information processing device which has a microcomputer including a CPU (Central Processing Unit), a ROM (Read Only Memory), and a RAM (Random Access Memory).

The user terminal 2 herein is an information processing device assumed to be used by a user who receives services using the information processing system 100. Moreover, the management server 5 is an information processing device assumed to be used by a service provider.

For example, each of the cameras 3 includes an image sensor such as a CCD (Charge Coupled Device) type image sensor and a CMOS (Complementary Metal Oxide Semiconductor) type image sensor and captures an image of a subject to obtain image data (captured image data) of the subject as digital data.

For example, the sensor included in each of the cameras 3 is an RGB sensor for capturing RGB images, a distance measuring sensor for outputting distance images, or the like.

Moreover, as will be described below, each of the cameras 3 also has a function of performing processing using AI (Artificial Intelligence) (e.g., image recognition processing and subject detection processing) for a captured image. In the following description, various types of processing performed for images, such as image recognition processing and subject detection processing, will simply be referred to as "image processing." For example, various types of processing performed for an image by using AI (or AI model) will be referred to as "AI image processing."

Each of the cameras 3 is configured to perform data communication with the fog server 4, and is capable of transmitting various types of data, such as processing result information indicating results of AI image processing or the like, to the fog server 4 and receiving various types of data from the fog server 4.

It is assumed herein that the information processing system 100 illustrated in FIG. 1 is used to enable a user to browse, via the user terminal 2, analysis information that is associated with the subject and that is generated by the fog server 4 or the cloud server 1 on the basis of processing result information obtained by image processing with use of the respective cameras 3, for example.

The respective cameras 3 are considered to be used as various monitoring cameras. For example, each of the cameras 3 may be used as a monitoring camera for monitoring interiors of stores, offices, houses, or the like, a monitoring camera for monitoring exteriors such as parking lots and streets (including traffic monitoring camera, etc.), a monitoring camera for manufacturing lines of FA (Factory Automation) and IA (Industrial Automation), a monitoring camera for monitoring interiors or exteriors of vehicles, or other cameras.

For example, for using the cameras 3 as monitoring cameras provided in a store, the multiple cameras 3 may be disposed at predetermined positions inside the store to enable the user to check segments (gender, age group, etc.) of customers visiting the store, behaviors (movement lines) inside the store, and the like. In this case, information indicating the segments of the customers visiting the store and information indicating the movement lines inside the store as described above, information indicating a crowded state at cash registers (e.g., length of waiting time at cash registers), and the like may be generated as the analysis information described above.

Alternatively, for using the cameras 3 as traffic monitoring cameras, the respective cameras 3 may be disposed at respective positions near a road to enable the user to recognize information associated with passing vehicles, such as numbers (vehicle numbers) and colors of the vehicles and vehicle types. In this case, information indicating these numbers, vehicle colors, vehicle types, and the like may be generated as the analysis information described above.

Moreover, in a case of using the cameras as traffic monitoring cameras disposed in a parking lot, the cameras may be so disposed as to monitor respective parked vehicles to check whether or not a suspicious person is present around the respective vehicles and is suspiciously acting. In a case where such a suspicious person is present, a notification of the presence of the suspicious person, attributes (gender and age group) of the suspicious person, and the like may be issued.

Further, the cameras may monitor a vacant space in streets or parking lots to notify the user of a place available for parking of a vehicle.

For example, it is assumed that the fog server 4 is disposed for each monitoring target, such as a case where the fog server 4 is provided inside a monitoring target store together with the respective cameras 3 for the purpose of monitoring the store as described above. The fog server 4 provided for each monitoring target such as a store as described above eliminates the necessity of direct reception of transmission data by the cloud server 1 from the multiple cameras 3 at the monitoring target and therefore reduces processing loads on the cloud server 1.

Note that, in a case where the fog server 4 is provided for multiple monitoring target stores all of which belong to an identical group, only one fog server 4 may be provided collectively for the multiple stores, rather than for each of the stores. Specifically, the one fog server 4 is not required to be provided for each of the monitoring targets and may be provided collectively for the multiple monitoring targets.

Note that, in a case where the cloud server 1 or each of the cameras 3 can have the function of the fog server 4 because the cloud server 1 or each of the cameras 3 has a processing ability, for example, the fog server 4 may be eliminated from the information processing system 100, and the respective cameras 3 may directly be connected to the network 6 such that the cloud server 1 can directly receive transmission data from the multiple cameras 3.

The respective types of devices described above can be roughly divided into cloud side information processing devices and edge side information processing devices in the following description.

The cloud server 1 and the management server 5 correspond to the cloud side information processing devices and constitute a device group for providing services assumed to be used by multiple users.

Moreover, the cameras 3 and the fog server 4 correspond to the edge side information processing devices and can be considered as a device group disposed in an environment prepared by a user using a cloud service.

Note that both the cloud side information processing devices and the edge side information processing devices may be provided in an environment prepared by the same user.

Note that the fog server 4 may be an on-premise server.

2. Registration of AI Model and AI Application

As described above, the information processing system 100 performs AI image processing by using the cameras 3 corresponding to the edge side information processing devices, and achieves an advanced application function by using the cloud server 1 corresponding to the cloud side information processing device on the basis of information indicating results of AI image processing performed by the edge side (e.g., information indicating results of image recognition processing using AI).

Note herein that various methods may be adopted to register an application function in the cloud server 1 (or including the fog server 4) corresponding to the cloud side information processing device.

An example of these methods will be described with reference to FIG. 2.

Figure 2:
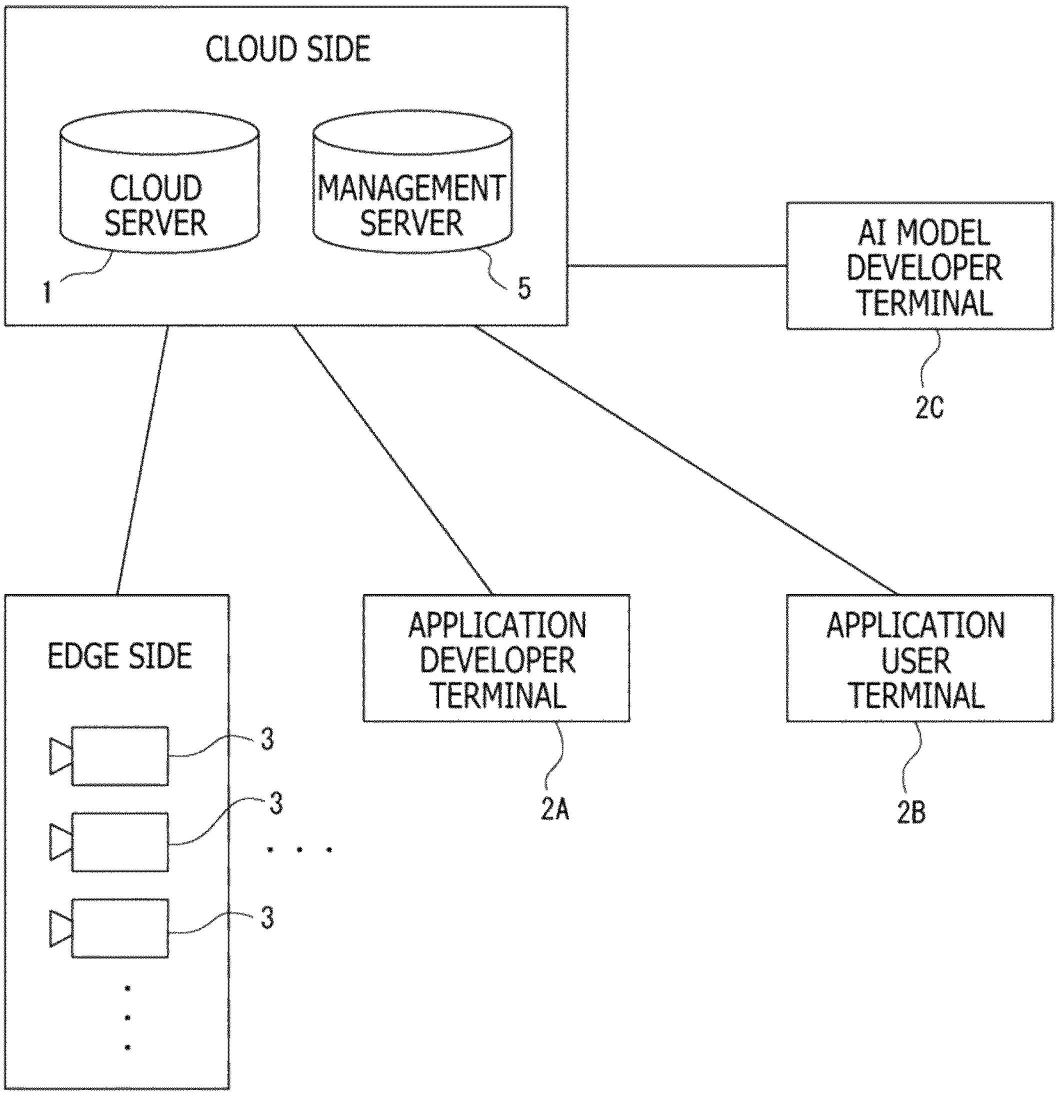
FIG. 2 is a diagram for explaining respective devices configured to register or download AI models and AI applications by using a marketplace function included in a cloud side information processing device.

Note that, while the fog server 4 is not depicted in FIG. 2, the fog server 4 may be included in the configuration. In this case, the fog server 4 may perform some of the edge side functions.

The cloud server 1 and the management server 5 described above are each an information processing device constituting a cloud side environment.

Meanwhile, each of the cameras 3 is an information processing device constituting an edge side environment.

Note that not only the cameras 3 but also image sensors IS may each be considered as an information processing device constituting the edge side environment. Specifically, an image sensor IS corresponding to a different edge side information processing device may be considered to be equipped inside each of the cameras 3 corresponding to the edge side information processing devices.

Moreover, examples of the user terminal 2 used by the user using the various services provided by the cloud side information processing device include an application developer terminal 2A used by a user developing an application to be used for AI image processing, an application user terminal 2B used by a user using the application, an AI model developer terminal 2C used by a user developing an AI model to be used for AI image processing, and the like.

Note that, needless to say, the application developer terminal 2A may be used by a user developing an application not using AI image processing.

A learning dataset for learning with AI, an AI model constituting a base of development, and the like are prepared for the cloud side information processing device. The user developing an AI model communicates with the cloud side information processing device by using the AI model developer terminal 2C to download these learning dataset and AI model. At this time, the learning dataset may be provided with charge. For example, the AI model developer may register personal information in a marketplace (electronic market) prepared as a cloud side function, to purchase the learning dataset in a purchasable state of various functions and materials registered in the marketplace.

The AI model developer develops the AI model by using the learning dataset and then registers the developed AI model in the marketplace by using the AI model developer terminal 2C. In this case, an incentive may be paid to the AI model developer when this AI model is downloaded.

Moreover, the user developing an application downloads an AI model from the marketplace by using the application developer terminal 2A to develop an application using this AI model (hereinafter referred to as an "AI application"). At this time, an incentive may be paid to the AI model developer as described above.

The application developer user registers the developed AI application in the marketplace by using the application developer terminal 2A. In this case, an incentive may be paid to the user having developed this AI application when this AI application is downloaded.

The user using the AI application performs operation by using the application user terminal 2B to deploy an AI application and an AI model from the marketplace into the cameras 3 corresponding to the edge side information processing devices managed by the user. At this time, an incentive may be paid to the AI model developer.

In this manner, AI image processing using the AI application and the AI model can be achieved by the cameras 3, and therefore, customers visiting the store and vehicles are detectable by AI image processing as well as image capturing.

Deployment of the AI application and the AI model herein refers to installation of the AI application and the AI model in a target (device) corresponding to a main execution part such that the target as the main execution part can use the AI application and the AI model, i.e., the target can execute at least a part of a program constituting the AI application.

Moreover, each of the cameras 3 may be capable of extracting attribute information associated with customers visiting the store by using AI image processing on the basis of images captured by the cameras 3.

These items of attribute information are transmitted from the cameras 3 to the cloud side information processing device via the network 6.

A cloud application is deployed in the cloud side information processing device. Each user is allowed to use the cloud application via the network 6. In addition, the cloud application includes an application prepared for analyzing movement lines of customers visiting the store, by using attribute information and captured images associated with the customers visiting the store, for example. Such a cloud application is uploaded by the application development user or the like.

The application user is capable of analyzing movement lines of the customers visiting the store of the user and browsing an analysis result by using the cloud application for movement line analysis operable by the application user terminal 2B. The browsing of the analysis result is achieved by graphical presentation of movement lines of the customers visiting the store on a map of the store, for example.

Alternatively, the browsing of the analysis result may be achieved by display of the result of movement line analysis in the form of a heat map and presentation of density of the customers visiting the store or the like.

In addition, the foregoing types of information may be presented with classification for each item of attribute information associated with the customers visiting the store.

AI models optimized for each user may be registered in the cloud side marketplace. For example, images captured by the cameras 3 disposed at a store managed by a certain user are uploaded to and accumulated in the cloud side information processing device as necessary.

The cloud side information processing device performs AI model relearning processing for each fixed number of the uploaded captured images, and executes a process for updating the AI models and reregistering the AI models in the marketplace.

Note that the AI model relearning processing may be selected by the user as an option in the marketplace, for example.

For example, an AI model relearned with use of dark images received from the cameras 3 disposed inside the store can be deployed in the cameras 3 to improve a recognition rate or the like of image processing for images captured at a dark place. Moreover, an AI model relearned using bright images received from the cameras 3 disposed outside the store can be deployed in the cameras 3 to improve a recognition rate or the like of image processing for images captured at a bright place.

Accordingly, the application user can obtain processing result information constantly optimized by redeploying the updated AI model in the cameras 3.

Note that the AI model relearning processing will again be described below.

In addition, AI models optimized for each camera may be registered in the cloud side marketplace. Examples of these AI models include an AI model applied to the cameras 3 capable of acquiring RGB images, an AI model applied to the cameras 3 including a distance measuring sensor for forming distance images, and other AI models.

Moreover, an AI model learned using a vehicle or captured images in a bright environment as an AI model to be used by the cameras 3 in a bright time zone and an AI model learned using captured images in a dark environment as an AI model to be used by the cameras 3 in a dark time zone may each be registered in the marketplace.

In addition, it is preferable that these AI models be updated as necessary to AI models each having a recognition rate raised by relearning processing.

Further, in a case where information (captured images, etc.) uploaded to the cloud side information processing device from the cameras 3 contains personal information, data from which information associated with privacy has been deleted in view of protection of privacy may be uploaded, or data from which information associated with privacy has been deleted may be made available for an AI model developing user or an application developing user.

Figure 3:
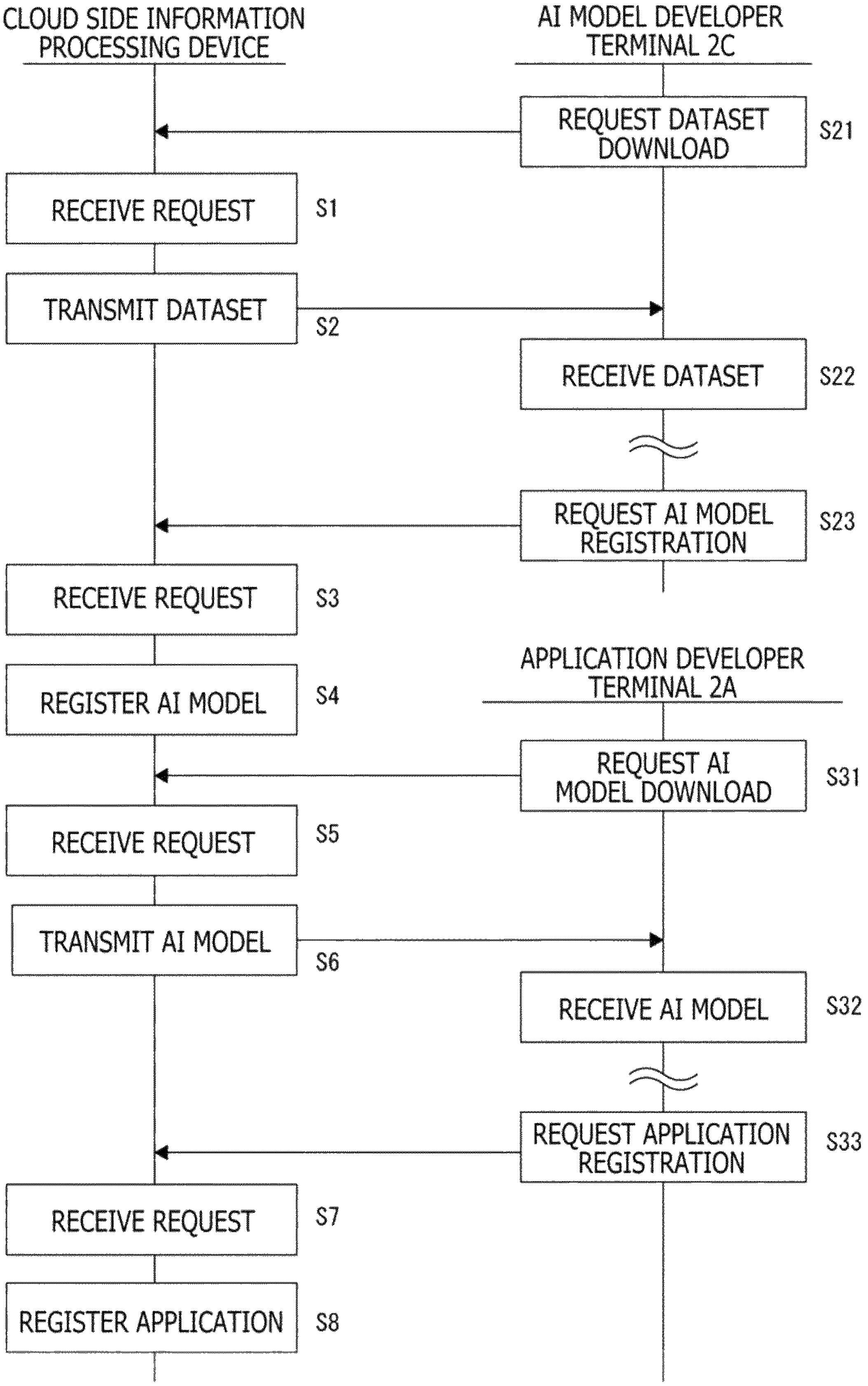
FIG. 3 is a diagram illustrating an example of a flow of processes executed by the respective devices at the time of registration or downloading of AI models and AI applications by using the marketplace function.
Figure 4:
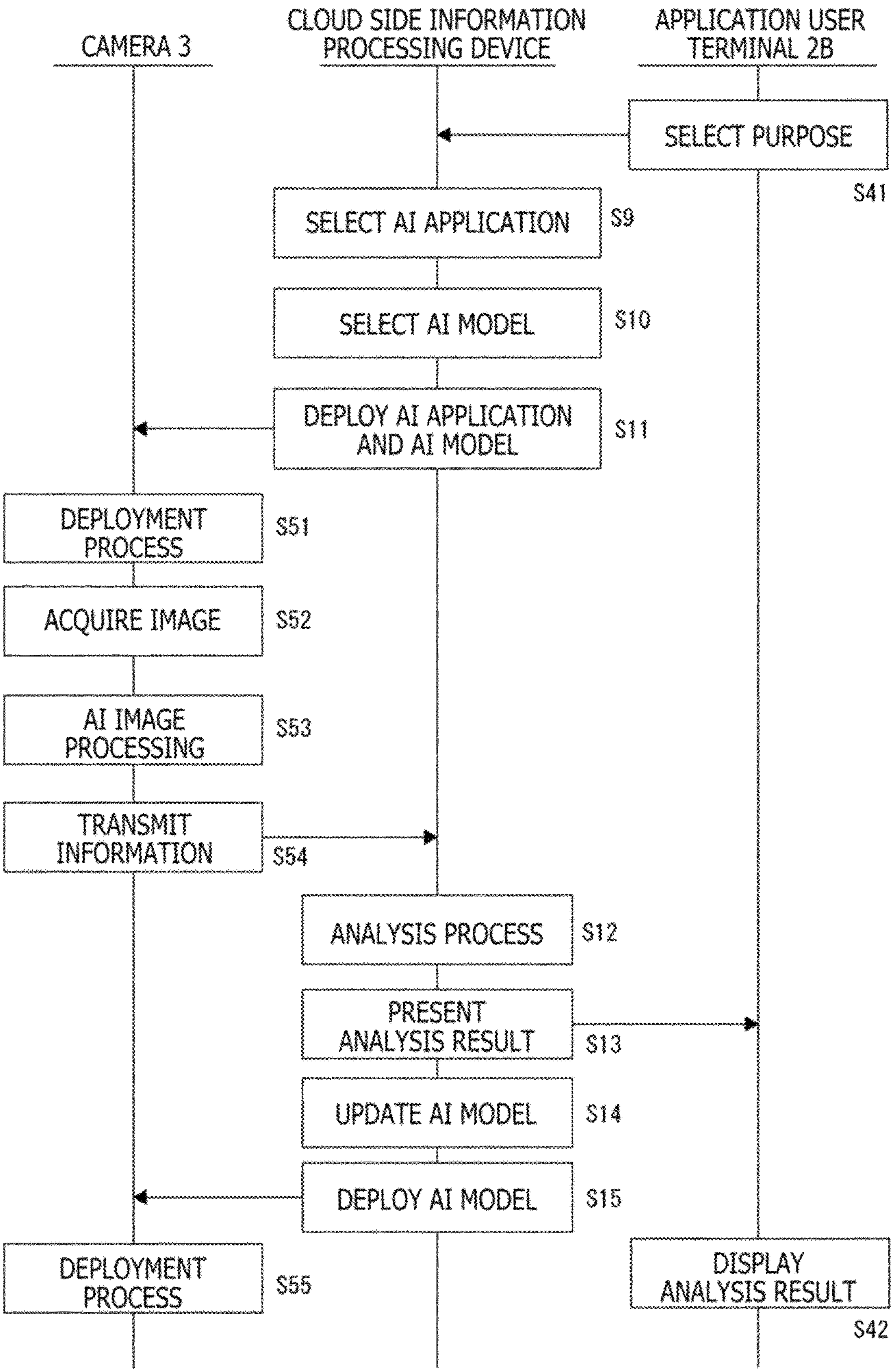
FIG. 4 is a diagram illustrating an example of a flow of processes executed by the respective devices at the time of deployment of AI applications and AI models.

FIGS. 3 and 4 are flowcharts each illustrating a flow of the processing described above.

Note that the cloud side information processing device corresponds to the cloud server 1, the management server 5, or the like in FIG. 1.

When the AI model developer browses a list of datasets registered in the marketplace by using the AI model developer terminal 2C including a display unit, such as an LCD (Liquid Crystal Display) and an organic EL (Electro Luminescence) panel, and selects a desired dataset, the AI model developer terminal 2C transmits a request for downloading the selected dataset to the cloud side information processing device in step S21.

In response to this transmission, the cloud side information processing device receives this request in step S1 and performs a process for transmitting the requested dataset to the AI model developer terminal 2C in step S2.

In step S22, the AI model developer terminal 2C performs a process for receiving the dataset. As a result, the AI model developer is enabled to develop an AI model using the dataset.

After completing development of the AI model, the AI model developer carries out operation for registering the developed AI model in the marketplace (e.g., the AI model developer designates a name of the AI model, an address where the AI model is located, and the like). Thereafter, the AI model developer terminal 2C transmits a request for registering the AI model in the marketplace to the cloud side information processing device in step S23.

In response to this transmission, the cloud side information processing device receives this registration request in step S3 and performs a registration process of the AI model in step S4. In this manner, the AI model is allowed to be displayed in the marketplace, for example. Accordingly, a user other than the AI model developer is allowed to download the AI model from the marketplace.

For example, the application developer intending to develop an AI application browses a list of AI models registered in the marketplace by using the application developer terminal 2A. In response to operation performed by the application developer (e.g., operation for selecting one AI model in the marketplace), the application developer terminal 2A transmits a request for downloading this selected AI model to the cloud side information processing device in step S31.

The cloud side information processing device receives this request in step S5 and performs a process for transmitting the AI model to the application developer terminal 2A in step S6.

In step S32, the application developer terminal 2A receives the AI model. As a result, the application developer is allowed to develop an AI application using the AI model developed by another person.

After completing development of the AI application, the application developer carries out operation for registering the developed AI application in the marketplace (e.g., operation for designating a name of the AI application, an address at which the AI model is located, and the like). Thereafter, the application developer terminal 2A transmits a request for registering the AI application to the cloud side information processing device in step S33.

The cloud side information processing device receives this registration request in step S7 and registers the AI application in step S8. In this manner, the AI application is allowed to be displayed in the marketplace, for example. Accordingly, a user other than the application developer is allowed to select the AI application in the marketplace and download the AI application.

FIG. 4 illustrates an example where a user other than the AI application developer selects an AI application in the marketplace and downloads the AI application. For example, the application user terminal 2B selects in step S41 a purpose according to operation by the user intending to use the AI application. In the purpose selection, a selected purpose is transmitted to the cloud side information processing device.

In response to this transmission, the cloud side information processing device selects an AI application corresponding to the purpose in step S9 and selects an AI model in step S10. For example, table data associating AI applications with AI models corresponding to purposes is stored in the cloud side information processing device to enable selection of an AI application and an AI model corresponding to a purpose.

In step S11, the cloud side information processing device performs a process for deploying the selected AI application and AI model. In this deploying process, the AI application and the AI model are transmitted to the cameras 3.

In response to this transmission, the cameras 3 perform a process for deploying the AI application and the AI model in step S51. In this manner, the cameras 3 are enabled to perform AI image processing for images captured by the cameras 3.

In step S52, the cameras 3 perform image capturing operation to acquire images. In subsequent step S53, the cameras 3 perform AI image processing for the acquired images and obtain an image recognition result, for example.

In step S54, the cameras 3 perform a process for transmitting the captured images and information indicating a result of the AI image processing. In the information transmission in step S54, both the captured images and the information indicating the result of the AI image processing may be transmitted or only either one of these may be transmitted.

The cloud side information processing device having received these items of information performs an analysis process in step S12. For example, analysis of movement lines of the customers visiting the store, a vehicle analysis process for traffic monitoring, and the like are carried out in this analysis process.

In step S13, the cloud side information processing device performs a process for presenting an analysis result. For example, this process is achieved by the cloud application described above being operated by the user.

On the basis of the analysis result presentation process, the application user terminal 2B performs a process for causing the analysis result to be displayed on a monitor or the like in step S42.

By the foregoing processes, the user as the person using the AI application is allowed to obtain an analysis result corresponding to the purpose selected in step S41.

Note that the AI model may be updated to a model optimized for images captured by the cameras 3 managed by the application user.

For example, by repeatedly executing each processing operation in steps S52, S53, and S54 with use of the cameras 3, the captured images received from the cameras 3 and information indicating the result of AI image processing are accumulated in the cloud side information processing device.

Subsequently, in a case where a certain volume of information has been accumulated, the cloud side information processing device performs a process for updating the AI model in step S14. This process is a process for adding new data to the AI model to achieve relearning of the AI model.

In step S15, the cloud side information processing device performs a process for deploying an updated new AI model.

In response to this deploying process, the cameras 3 execute a process for deploying the new AI model in step S55.

Note that, in a case where the AI application has also been updated, the updated AI application may further be deployed in the processing of step S55.

3. System Function Outline

According to the present embodiment, it is assumed that the service using the information processing system 100 is such a service which enables the user as a client to select a function type of AI image processing performed by the respective cameras 3. The selection of the function type is considered as setting of the purpose described above. Moreover, for example, functions such as an image recognition function and an image detection function may be selected, or a further detailed type may be selected so as to exert the image recognition function and the image detection function for a specific subject.

In an example of a business model, a service provider sells the cameras 3 and the fog server 4 having an image recognition function using AI to the user, and the user installs the cameras 3 and the fog server 4 at places corresponding to monitoring targets. Thereafter, a service for providing the analysis information described above to the user is deployed.

In this case, a use application (purpose) demanded for the system is different for each client, such as a use application of store monitoring and a use application of traffic monitoring. Accordingly, selective setting of the AI image processing function provided for the cameras 3 is enabled so as to allow analysis information corresponding to the use application demanded by the client to be obtained.

Moreover, when a disaster such as an earthquake occurs, information desired to be acquired using the cameras 3 may be changed. Specifically, an AI image processing function for detecting customers visiting a store or specifying attributes of the customers is exerted so as to achieve a function as monitoring cameras in the store in a normal state, and is switched to an AI image processing function for recognizing products remaining on a product shelf at the time of a disaster. For this switching, the AI model may be changed so as to obtain an appropriate recognition result.

According to the present example, the management server 5 has a function of selectively setting such an AI image processing function of the cameras 3.

Note that the function of the management server 5 may be incorporated in the cloud server 1 or the fog server 4.

Figure 5:
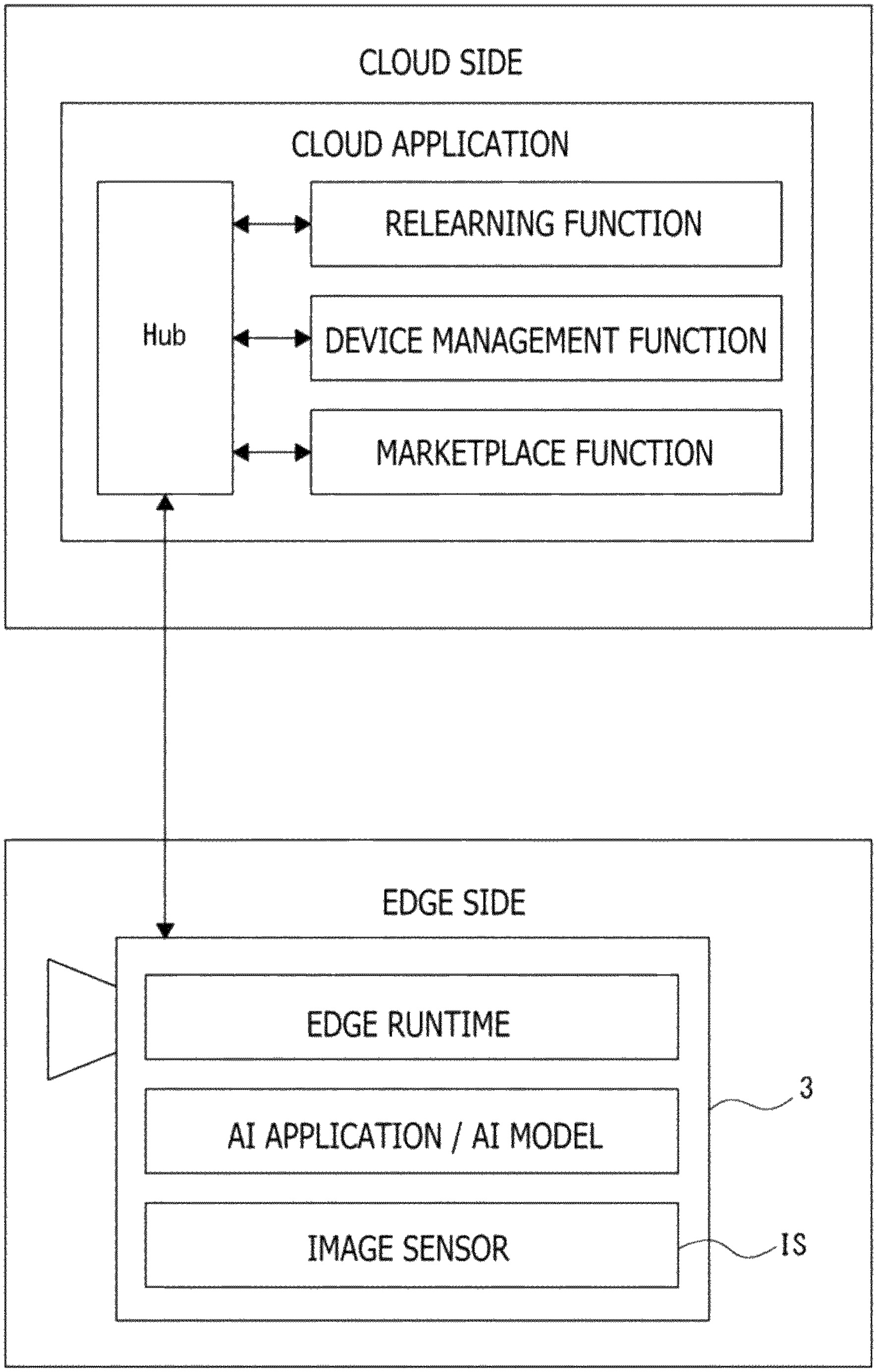
FIG. 5 is a diagram for explaining a connection mode between a cloud side information processing device and an edge side information processing device.

Connection between the cloud server 1 or the management server 5 as the cloud side information processing device and the cameras 3 as the edge side information processing devices will be touched upon herein with reference to FIG. 5.

A relearning function, a device management function, and a marketplace function which are available via a Hub are implemented in the cloud side information processing device.

The Hub communicates with the edge side information processing device in a highly reliable manner protected with security. Accordingly, various functions are providable for the edge side information processing device.

The relearning function is a function of performing relearning and providing a newly optimized AI model. This function provides an appropriate AI model based on new learning materials.

The device management function is a function of managing the cameras 3 and the like each constituting the edge side information processing device, and functions of management and monitoring of an AI model deployed in the cameras 3, problem detection, trouble-shooting, and the like can be provided, for example.

Moreover, the device management function is also a function of managing information associated with the cameras 3 and the fog server 4. Examples of the information associated with the cameras 3 and the fog server 4 include information associated with chips used as an arithmetic processing unit, information associated with a memory capacity and a storage capacity, usage rates of the CPU, the memory, and the like, and information associated with software such as OS (Operating System) installed in each of the devices.

Moreover, the device management function protects secure accesses from authenticated users.

The marketplace function provides a function of registering the AI model developed by the AI model developer and the AI application developed by the application developer described above, a function of deploying these developed items to the permitted edge side information processing device, and other functions. Moreover, the marketplace function also provides a function associated with payment of incentives according to deployments of the developed items.

Each of the cameras 3 constituting the edge side information processing device includes an edge runtime, an AI application, an AI model, and an image sensor IS.

The edge runtime functions as embedded software for managing applications deployed in the cameras 3 and communicating with the cloud side information processing device, for example.

As described above, the AI model is an AI model registered in the marketplace and deployed in the cloud side information processing device. The AI model enables each of the cameras 3 to obtain information indicating a result of AI image processing corresponding to a purpose on the basis of captured images.

Figure 6:
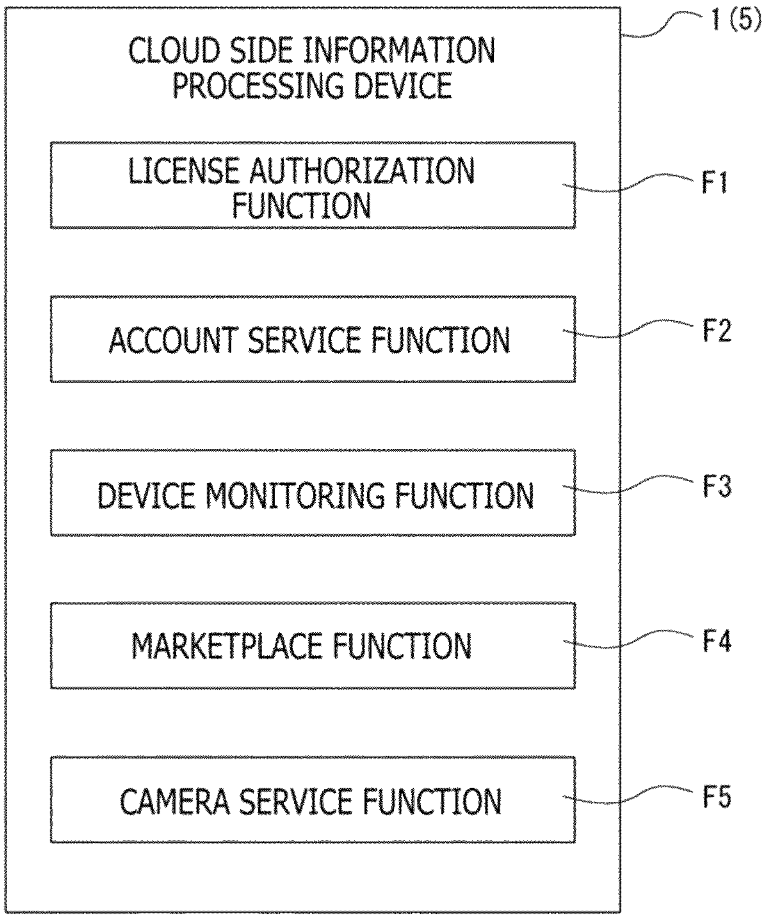
FIG. 6 is a function block diagram of the cloud side information processing device.

An outline of the functions included in the cloud side information processing device will be described with reference to FIG. 6. Note that the cloud side information processing device is a general name of the devices such as the cloud server 1 and the management server 5.

As illustrated in the figure, the cloud side information processing device has a license authorization function F1, an account service function F2, a device monitoring function F3, a marketplace function F4, and a camera service function F5.

The license authorization function F1 is a function of performing processing associated with various types of authentication. Specifically, the license authorization function F1 performs a process associated with device authentication of the respective cameras 3 and a process associated with each authentication of an AI model, software, and firmware used by the cameras 3.

The software noted herein refers to software necessary for appropriately achieving AI image processing with use of the cameras 3.

For appropriately achieving AI image processing based on captured images and transmitting a result of AI image processing to the fog server 4 and the cloud server 1 in an appropriate form, it is required to control input data to the AI model and appropriately process output data from the AI model. The software described above is software containing peripheral processing necessary for appropriately achieving AI image processing. Such software is software for achieving a desired function by using an AI model and corresponds to the AI application described above.

Note that the AI application is not limited to an application using only one AI model and may be an application using two or more AI models. For example, there may be such an AI application which has a process flow where image data as information indicating a recognition result obtained by an AI model executing AI image processing for captured images as input tensors (this information includes image data or the like and will hereinafter be expressed as "recognition result information") is further input to another AI model as input tensors to be processed by second AI image processing.

Alternatively, the AI application may be such an AI application which performs predetermined image processing as second AI image processing for input tensors for first AI image processing by using coordinate information as recognition result information associated with the first AI image processing. Note that the input tensors for the respective types of AI image processing may be RAW images, or RGB images obtained by applying a synchronization process to RAW images. This is also applicable to the following description.

For authentication of the cameras 3, the license authorization function F1 performs a process for issuing a device ID (Identification) for each of the cameras 3 in a case of connection with the cameras 3 via the network 6.

Moreover, for authentication of the AI model and the software, the license authorization function F1 performs a process for issuing a unique ID for each of the AI model and the AI application for which registration has been requested by the AI model developer terminal 2C and a software developer terminal 7 (AI model ID and software ID).

Further, the license authorization function F1 also performs a process for issuing, to a manufacturer of the cameras 3 (particularly a manufacturer of the image sensor IS described below), the AI model developer, and the software developer, various keys, certificates, and the like required for secure communication between the cameras 3, the AI model developer terminal 2C, the software developer terminal 7, and the cloud server 1, and also performs a process for updating and stopping certification effectiveness.

In addition, the license authorization function F1 also performs a process for associating the cameras 3 purchased by the user (device ID described above) with the user ID in a case where the account service function F2 described below carries out user registration (registration of account information along with an issue of the user ID).

The account service function F2 is a function of generating and managing account information associated with the user. The account service function F2 receives input of user information and generates account information on the basis of the input user information (generates at least account information containing the user ID and password information).

Moreover, the account service function F2 also performs a registration process (registration of account information) associated with the AI model developer and the AI application developer (hereinafter abbreviated as the "software developer" in some cases).

The device monitoring function F3 is a function of performing a process for monitoring a use state of the cameras 3. For example, the device monitoring function F3 monitors information associated with use rates of the CPU and the memory and others described above, such as use places of the cameras 3, an output frequency of output data by AI image processing, and an available capacity of the CPU or the memory to be used for AI image processing, as various factors associated with the use state of the cameras 3.

The marketplace function F4 is a function for selling AI models and AI applications. For example, the user is allowed to purchase an AI application and an AI model used by the AI application via a sales website (sales site) provided by the marketplace function F4. Moreover, the software developer is allowed to purchase an AI model for creating an AI application via the sales site described above.

The camera service function F5 is a function for providing a service associated with use of the cameras 3 for the user.

One of functions achieved by the camera service functions F5 is a function associated with generation of the analysis information described above, for example. Specifically, this function is a function of performing a process for generating analysis information associated with a subject on the basis of processing result information associated with image processing by the cameras 3 and enabling the user to browse the generated analysis information via the user terminal 2.

Moreover, the camera service function F5 includes an imaging setting search function. Specifically, this imaging setting search function is a function of acquiring recognition result information associated with AI image processing from the cameras 3 and searching for imaging setting information associated with the cameras 3 by using AI on the basis of the acquired recognition result information. The imaging setting information herein refers to a wide range of setting information associated with imaging operation for obtaining captured images. Specifically, the imaging setting information includes a wide range associated with optical settings such as focusing and an aperture, settings relating to operation for reading captured image signals such as a frame rate, an exposure time period, and a gain, settings relating to image signal processing for the read captured image signals, such as a gamma correction process, a noise reduction process, and a super-resolution process, and others.

By appropriate exertion of the imaging setting search function, imaging settings of the cameras 3 are optimized according to a purpose set by the user, and therefore, a preferable inference result is providable.

Moreover, the camera service function F5 includes an AI model search function. This AI model search function is a function of acquiring recognition result information associated with AI image processing from the cameras 3, and searching for an optimal AI model to be used for AI image processing by the cameras 3 with use of AI on the basis of the acquired recognition result information. For example, the search for the AI model herein refers to a process for optimizing various processing parameters such as weighting factors, setting information associated with a neural network structure (including information indicating a kernel size, for example), and others in a case where AI image processing is achieved by CNN (Convolutional Neural Network) or the like including convolution operation.

Note that the camera service function F5 may have a function of determining process sharing. The process sharing determination function performs a process for determining a device where the AI application is to be deployed for each SW component at the time of deployment of the AI application in the edge side information processing device. Note that some of the SW components may be determined to be executed by the cloud side device. In this case, the deployment process need not be carried out on the basis of the fact that the deployment has already been completed in the cloud side device.

The imaging setting search function and the AI model search function provided as described above achieve imaging settings offering preferable results of AI image processing and also enable execution of AI image processing using an appropriate AI model corresponding to an actual use environment.

Moreover, the process sharing determination function provided in addition to these functions further enables execution of AI image processing and an analysis process of this AI image processing by using an appropriate device.

Note that the camera service function F5 has an application setting function as a function performed prior to deployment of the respective SW components. The application setting function is a function of setting an appropriate AI application according to the purpose of the user.

For example, an appropriate AI application is selected according to a purpose selected by the user. As a result, SW components constituting the AI application are automatically determined. Note that, as will be described below, multiple combinations of the SW components may be provided to achieve the purpose of the user by using the AI application. In this case, one combination is selected according to information associated with the edge side information processing device and a request from the user.

For example, in a case where the purpose of the user is to monitor a store, a combination of the SW components selected for a privacy-respecting request from the user and a combination of the SW components selected for a speed-emphasizing request from the user may be different from each other.

The application setting function performs a process for receiving operation from the user for selecting a purpose (application) via the user terminal 2 (corresponding to the application user terminal 2B in FIG. 2), a process for selecting an appropriate AI application according to the selected application, and others.

While the license authorization function F1, the account service function F2, the device monitoring function F3, the marketplace function F4, and the camera service function F5 are achieved by the single unit of the cloud server 1 in the configuration presented above by way of example, these functions can be shared and achieved by multiple information processing devices. For example, each of the above functions may be performed by one dedicated information processing device. Alternatively, the single function included in the above functions may be shared by multiple information processing devices (e.g., cloud server 1 and management server 5).

In FIG. 1, the AI model developer terminal 2C is an information processing device used by the AI model developer.

In addition, the software developer terminal 7 is an information processing device used by the AI application developer.

4. Configuration of Imaging Device

Figure 7:
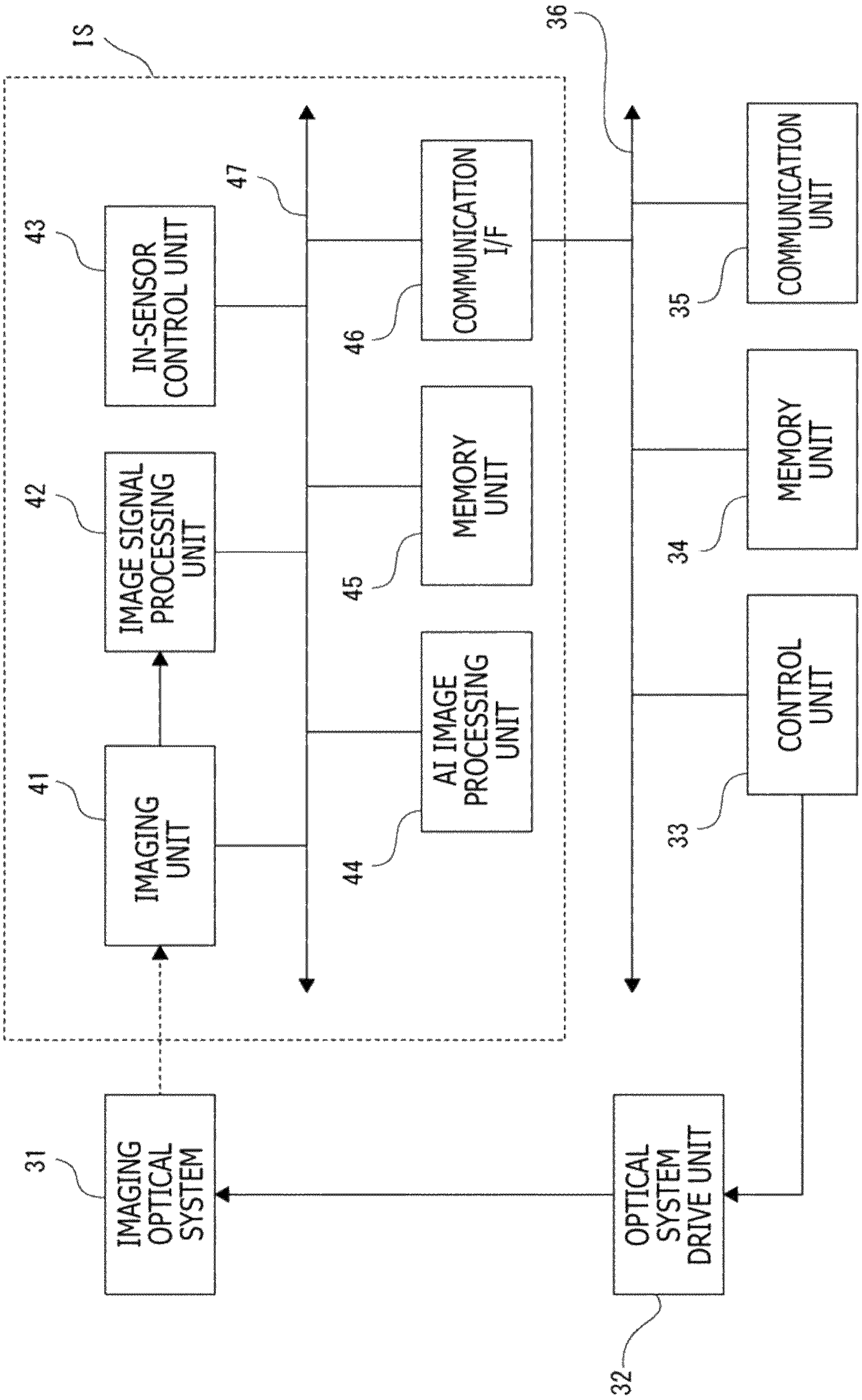
FIG. 7 is a block diagram illustrating an internal configuration example of a camera.

FIG. 7 is a block diagram illustrating an internal configuration example of each of the cameras 3.

As illustrated in the figure, each of the cameras 3 includes an imaging optical system 31, an optical system drive unit 32, the image sensor IS, a control unit 33, a memory unit 34, and a communication unit 35. The image sensor IS, the control unit 33, the memory unit 34, and the communication unit 35 are connected to each other via a bus 36 and are capable of performing data communication with each other.

The imaging optical system 31 includes lenses such as a cover lens, a zoom lens, and a focus lens and a diaphragm (iris) mechanism. Light emitted from a subject (incident light) is guided by the imaging optical system 31 thus configured, and collected on a light receiving surface of the image sensor IS.

The optical system drive unit 32 is an overall drive unit for the zoom lens, the focus lens, and the diaphragm mechanism included in the imaging optical system 31. Specifically, the optical system drive unit 32 has an actuator for driving each of the zoom lens, the focus lens, and the diaphragm mechanism noted above and a drive circuit for this actuator.

The control unit 33 has a microcomputer including a CPU, a ROM, and a RAM, for example. The CPU executes various types of processing in accordance with a program stored in the ROM or a program loaded into the RAM to control the entire camera 3.

Moreover, the control unit 33 instructs the optical system drive unit 32 to drive the zoom lens, the focus lens, the diaphragm mechanism, and the like. The optical system drive unit 32 executes movement of the focus lens and the zoom lens, opening or closing of a diaphragm blade of the diaphragm mechanism, and other actions in accordance with the foregoing drive instructions.

Further, the control unit 33 controls writing and reading of various types of data to and from the memory unit 34.

For example, the memory unit 34 is a non-volatile storage device, such as an HDD (Hard Disk Drive) and a flash memory device, and is used as an area where image data output from the image sensor IS is stored (recorded).

In addition, the control unit 33 performs various types of data communication with an external device via the communication unit 35. According to the present example, the communication unit 35 is capable of performing data communication with at least the fog server 4 (or cloud server 1) illustrated in FIG. 1.

For example, the image sensor IS constitutes an image sensor of the CCD type, the CMOS type, or the like.

The image sensor IS includes an imaging unit 41, an image signal processing unit 42, an in-sensor control unit 43, an AI image processing unit 44, a memory unit 45, and a communication I/F 46. These units are capable of performing data communication with each other via a bus 47.

The imaging unit 41 includes a pixel array unit where pixels each having a photoelectric conversion element, such as a photodiode, are two-dimensionally arrayed, and a readout circuit which reads out an electric signal obtained by photoelectric conversion from each of the pixels included in the pixel array unit. The imaging unit 41 is capable of outputting the electric signal as a captured image signal.

For example, the readout circuit executes a CDS (Correlated Double Sampling) process, an AGC (Automatic Gain Control) process, and other processes for the electric signal obtained by photoelectric conversion and further performs an A/D (Analog/Digital) conversion process.

The image signal processing unit 42 performs such processes as preprocessing, a synchronization process, a YC generation process, a resolution conversion process, and a codec process for the captured image signals as digital data obtained after the A/D conversion process.

The preprocessing performs a clamp process for clamping black levels of R, G, and B at a predetermined level, a correction process between color channels of R, G, and B, and other processes for the captured image signals. The synchronization process performs a color separation process such that image data of the respective pixels has all color components of R, G, and B. For example, in a case of imaging elements using color filters of Bayer array, demosaic processing is performed as the color separation process. The YC generation process generates (separates) a luminance (Y) signal and a color (C) signal from image data of R, G, and B. The resolution conversion process executes resolution conversion processing for image data to which various types of signal processing have been applied.

For example, the codec process performs a coding process for recording and communication and file generation for the foregoing image data to which the various types of processing described above have been applied. For example, the codec process achieves file generation in a format such as MPEG-2 (MPEG: Moving Picture Experts Group) and H. 264 as a file format for video images. Moreover, the codec process may achieve file generation in a format such as JPEG (Joint Photographic Experts Group), TIFF (Tagged Image File Format), and GIF (Graphics Interchange Format) as a still image file. Note that, in a case where the image sensor IS constitutes a distance measuring sensor, the image signal processing unit 42 calculates distance information associated with a subject on the basis of two signals output from the image sensor IS as iToF (indirect Time of Flight) and outputs a distance image, for example.

The in-sensor control unit 43 controls execution of imaging actions by issuing an instruction to the imaging unit 41. Similarly, the in-sensor control unit 43 also controls execution of processing performed by the image signal processing unit 42.

The AI image processing unit 44 performs an image recognition process for captured images as AI image processing.

According to the present embodiment, the AI image processing unit 44 is implemented by a DSP (Digital Signal Processor).

An image recognition function achievable by the AI image processing unit 44 is switchable by an algorithm change of AI image processing. In other words, the function type of AI image processing is switchable by switching an AI model to be used for AI image processing. Various types are adoptable as the function type of AI image processing. For example, the following types presented by way of example are adoptable.

Class identification
Semantic segmentation
Person detection
Vehicle detection
Target tracking
OCR (Optical Character Recognition)

The class identification included in the above function types is a function of identifying a class of a target. The "class" herein refers to information indicating a category of an object and identifies a "human," a "car," an "airplane," a "ship," a "truck," a "bird," a "cat," a "dog," a "deer," a "frog," a "horse," or the like, for example.

The target tracking is a function of tracking a subject designated as a target, in other words, a function of obtaining history information associated with the position of the subject.

Switching of the AI model may be carried out in response to an instruction from the cloud side information processing device or on the basis of a determination process performed by the control unit 33 or the in-sensor control unit 43 of the camera 3. Moreover, the AI model may be switched to any one of multiple AI models stored in the memory unit 45 or an AI model received from the cloud side information processing device and deployed. Reception of the AI model from the cloud side information processing device for every switching contributes to reduction of the capacity of the memory unit 45. As a result, size reduction, power saving, and cost reduction are achievable.

The memory unit 45 is available as what is generally called a frame memory where captured image data (RAW image data) obtained by the image signal processing unit 42 and image data obtained after synchronization processing are stored. Moreover, the memory unit 45 is also available for temporary storage of data used by the AI image processing unit 44 in the process of AI image processing.

Moreover, the memory unit 45 stores information associated with AI applications and AI models used by the AI image processing unit 44.

Note that the information associated with AI applications and AI models may be deployed in the memory unit 45 as containers or the like by using a container technique described below, or by using a microservice technique. In the configuration where AI models to be used for AI image processing are deployed in the memory unit 45, switching of the function type of AI image processing or switching to an AI model improved in performance by relearning is achievable.

Note that, while the present embodiment has been described above on the basis of the example of the AI model and the AI application to be used for image recognition, this example is not presented by way of limitation. A program or the like executed using an AI technology may be targeted.

Moreover, in a case where the memory unit 45 has a small capacity, the information associated with AI applications and AI models may be deployed in a memory out of the image sensor IS, such as the memory unit 34, in the form of a container or the like by using the container technique, and subsequently, only the AI models may be stored in the memory unit 45 within the image sensor IS via the communication I/F 46 described below.

The communication I/F 46 is an interface for performing communication with the control unit 33, the memory unit 34, and the like located outside the image sensor IS. The communication I/F 46 communicates with the outside to acquire a program executed by the image signal processing unit 42, an AI application and an AI model used by the AI image processing unit 44, and the like from the outside, and stores these in the memory unit 45 included in the image sensor IS.

In this manner, the AI model is stored in a part of the memory unit 45 included in the image sensor IS and becomes available for the AI image processing unit 44.

The AI image processing unit 44 performs a predetermined image recognition process by using the AI application and the AI model obtained as above, to recognize a subject corresponding to a purpose.

Information indicating a recognition result of AI image processing is output to the outside of the image sensor IS via the communication I/F 46.

Specifically, not only image data output from the image signal processing unit 42, but also the information indicating the recognition result of AI image processing is output from the communication I/F 46 of the image sensor IS.

Note that only either the image data or the information indicating the recognition result may be output from the communication I/F 46 of the image sensor IS.

For example, in a case of use of the relearning function of the AI model described above, captured image data to be used for the relearning function is uploaded from the image sensor IS to the cloud side information processing device via the communication I/F 46 and the communication unit 35.

Moreover, in a case of performing an inference using the AI model, the information indicating the recognition result of AI image processing is output from the image sensor IS to another information processing device outside the camera 3 via the communication I/F 46 and the communication unit 35.

5. Configuration of Image Sensor

Various configurations are adoptable for the image sensor IS described above. According to the present embodiment, the image sensor IS has a structure having three laminated layers.

Figure 8:
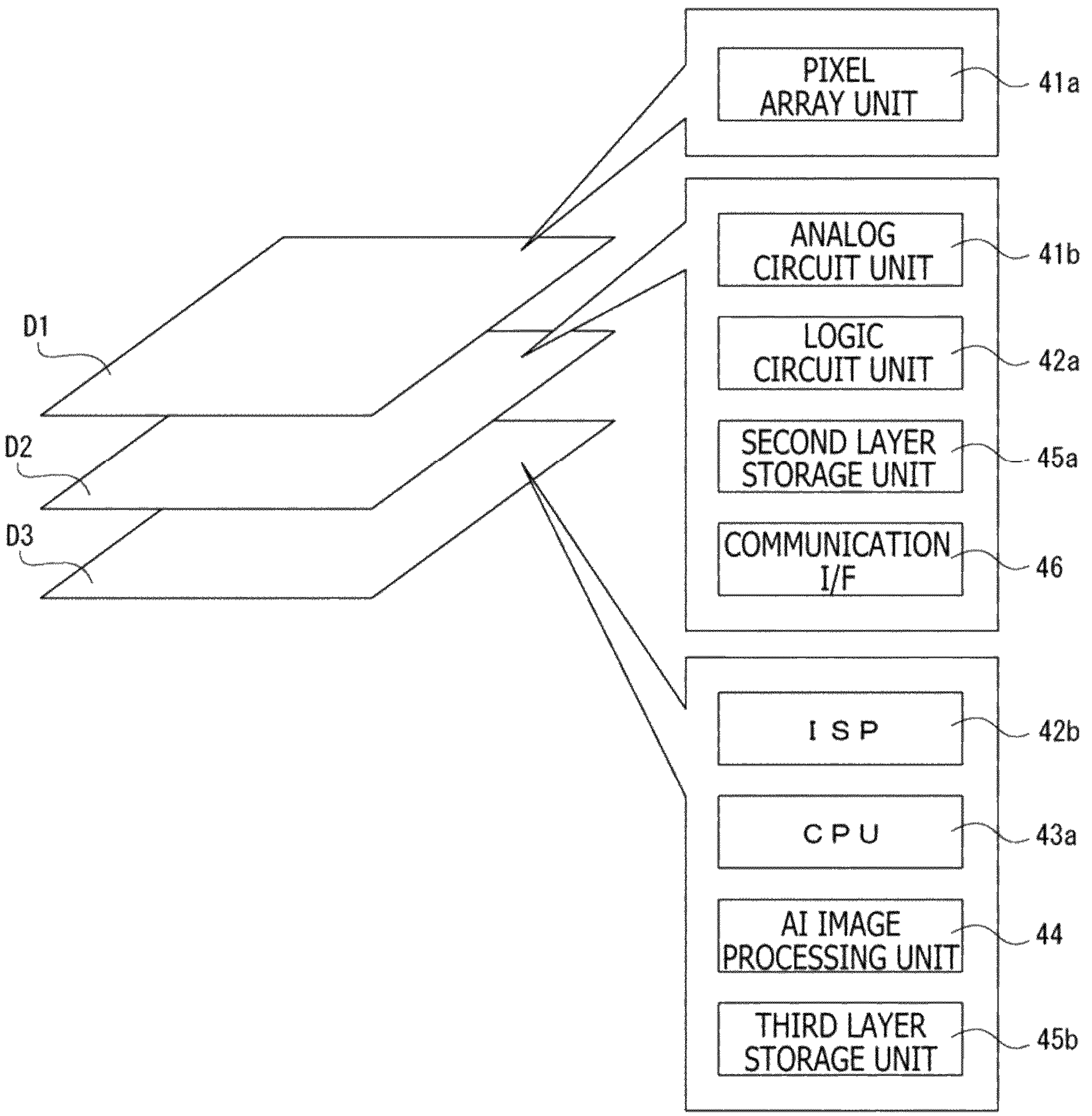
FIG. 8 is a diagram illustrating a configuration example of an image sensor.

As illustrated in FIG. 8, the image sensor IS has a configuration of a one-chip semiconductor device which has dies each constituting a semiconductor substrate and laminated in three layers. Specifically, the image sensor IS has a die D1 forming a first layer, a die D2 forming a second layer, and a die D3 forming a third layer of the semiconductor substrate.

The layers are electrically connected to each other by Cu—Cu bonding, for example.

As illustrated in FIG. 7, the image sensor IS includes the imaging unit 41, the image signal processing unit 42, the in-sensor control unit 43, the AI image processing unit 44, the memory unit 45, and the communication I/F 46 classified for each function. Each of the functions is completed in one layer by electronic parts mounted in one layer, or has electronic parts formed in multiple layers.

Specifically, the imaging unit 41 contains a pixel array unit 41*a* provided on the die D1 and an analog circuit unit 41*b* provided on the die D2 (see FIG. 8).

The analog circuit unit 41*b* includes a transistor, a vertical driving circuit, and a comparator constituting a readout circuit, or includes a circuit executing such processes as a CDS process and an AGC process, an A/D conversion unit, and the like.

Meanwhile, the image signal processing unit 42 contains a logic circuit unit 42*a* provided on the die D2, and an ISP (Image Signal Processor) 42*b* provided on the die D3.

The logic circuit unit 42*a* includes a circuit that performs a process for detecting and correcting a defective pixel included in a captured image signal as digital data generated by the A/D conversion unit, and others.

The ISP 42*b* performs a synchronization process, a YC generation process, a resolution conversion process, a codec process, a noise removal process, and others. Note that some of these processes may be executed by the in-sensor control unit 43.

Figure 9:
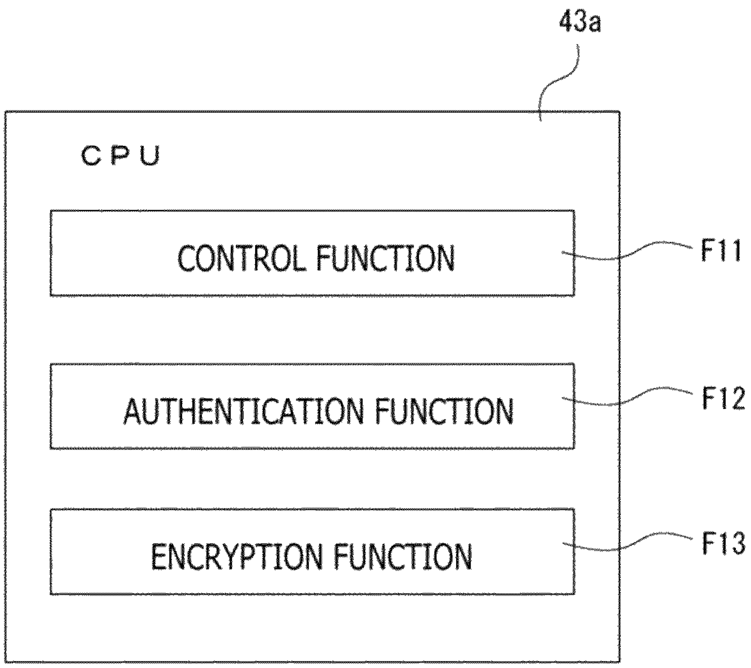
FIG. 9 is a function block diagram of a CPU included in the image sensor.

The in-sensor control unit 43 includes a CPU 43*a* and the like provided on the die D3 and executes a predetermined program to function as a control function F11, an authentication function F12, and an encryption function F13 illustrated in FIG. 9. The respective functions will be described below.

The AI image processing unit 44 is provided on the die D3 to function as an inference processing unit.

Note that, in the configuration where the third layer contains a processor such as the CPU 43*a* that is different from the processor functioning as the AI image processing unit 44 and that has a high processing ability, a CV (Computer Vision) process, such as an edge emphasis process, a scaling process, and an affine transformation process, can be performed using the CPU 43*a* or the like. This configuration can reduce a processing time more than a configuration performing the CV process by using the ISP 42*b*.

Note that these types of the CV process are processes for forming input images to the AI model, for example. Specifically, these types of the CV process are processes for generating image data having a predetermined size specified as input tensors for the AI model, the image data being suited for AI image processing.

Moreover, the CV process may be a process other than the process for generating the input images to the AI model as long as processing using multiple lines is executed for each processing.

For example, such a process may be carried out which draws a bounding box (with emphasis) for a region where a person has been detected by AI image processing. The memory unit 45 includes a second layer storage unit 45*a* provided on the die D2 and a third layer storage unit 45*b* provided on the die D3.

The second layer storage unit 45*a* functions as a frame memory for storing image data and RAW image data to which a synchronization process has been applied by the ISP 42*b*. Note that, even if the frame memory is provided in the third layer or outside the image sensor IS instead of the second layer, the advantageous effects described above or below can be produced.

The third layer storage unit 45*b* functions as a working memory for storing processes, results, and the like of AI image processing performed by the AI image processing unit 44. Moreover, the third layer storage unit 45*b* functions as a storage unit where weighting factors, parameters, and the like of the AI model are stored, and as a storage unit where the AI model is deployed.

In the configuration where the third layer storage unit 45*b* and the AI image processing unit 44 are provided in the same layer, transfer speed and readout speed of various types of intermediate data and the like generated in a process of the inference process using the AI model are allowed to increase. Accordingly, a length of time required for the inference process can be reduced.

In the configuration where the second layer storage unit 45*a* is provided in the second layer, a part of data stored in the third layer storage unit 45*b* can be stored in the second layer storage unit 45*a*, and the capacity of the third layer storage unit 45*b* is allowed to decrease. Accordingly, size reduction of the third layer storage unit 45*b* is achieved, and therefore, reduction of the chip size of the semiconductor substrate constituting the third layer and improvement of the function of the image sensor IS along with addition of additional functions to the third layer are achievable.

Moreover, the second layer storage unit 45*a* provided as a frame memory in the second layer is suited for a case where multiple different processes are desired to be performed for frame images.

Further, in the configuration where the second layer storage unit 45*a* is provided in the second layer as a frame memory, such processes as a mask process and addition of a bounding box are achievable by rewriting some of pixel values of frame images stored in the frame memory.

These processes are implementable by using the CPU 43*a* or a memory controller, or by cooperation of these.

Note that the second layer storage unit 45*a* and the third layer storage unit 45*b* may include a ROM as well as a RAM.

The communication I/F 46 is provided on the die D2.

In the configuration where the die D1 designated as the first layer containing the pixel array unit 41*a* is disposed in an outermost layer, light easily enters the pixel array unit 41*a*, and therefore, conversion efficiency of the photoelectric conversion process improves.

Moreover, in the configuration where the second layer containing the analog circuit unit 41*b*, which functions as a conversion processing unit that performs A/D conversion for pixel signals read from the respective pixels included in the pixel array unit 41*a*, is disposed adjacently to the first layer containing the pixel array unit 41*a* in a lamination direction, speedup of processes ranging from the photoelectric conversion process to generation of captured image signals as digital data is achievable.

Further, in the configuration where no other layer is disposed between the first layer and the second layer, wiring between the layers is facilitated, and therefore, the number of wiring members can be reduced.

In addition, the first layer containing the pixel array unit 41*a* and the third layer containing the AI image processing unit 44 which executes AI image processing are positioned away from each other in the lamination direction. Accordingly, effects of electromagnetic noise generated during execution of processing by the AI image processing unit 44 on charge accumulated on the pixel array unit 41*a* can be reduced.

Further, the analog circuit unit 41*b* driving at high voltage is not provided in the third layer. Accordingly, an advanced process of semiconductor manufacturing is adoptable for manufacturing the die D3 as the semiconductor substrate forming the third layer, and therefore, miniaturization of respective elements is achievable.

Moreover, the image sensor IS conventionally known has a double layer structure including a first layer where the pixel array unit 41*a* is implemented and a second layer where all of components other than the pixel array unit 41*a* are implemented. However, when the number of electronic parts mounted to improve performance of the image sensor IS increases, the area of the second layer enlarges. As a result, such a problem arises that the size of the first layer increases according to the size of the second layer. In this case, a surplus region containing no part to be mounted on the first layer is produced. This situation is not considered to be appropriate in view of use efficiency of the substrate.

Figure 10:
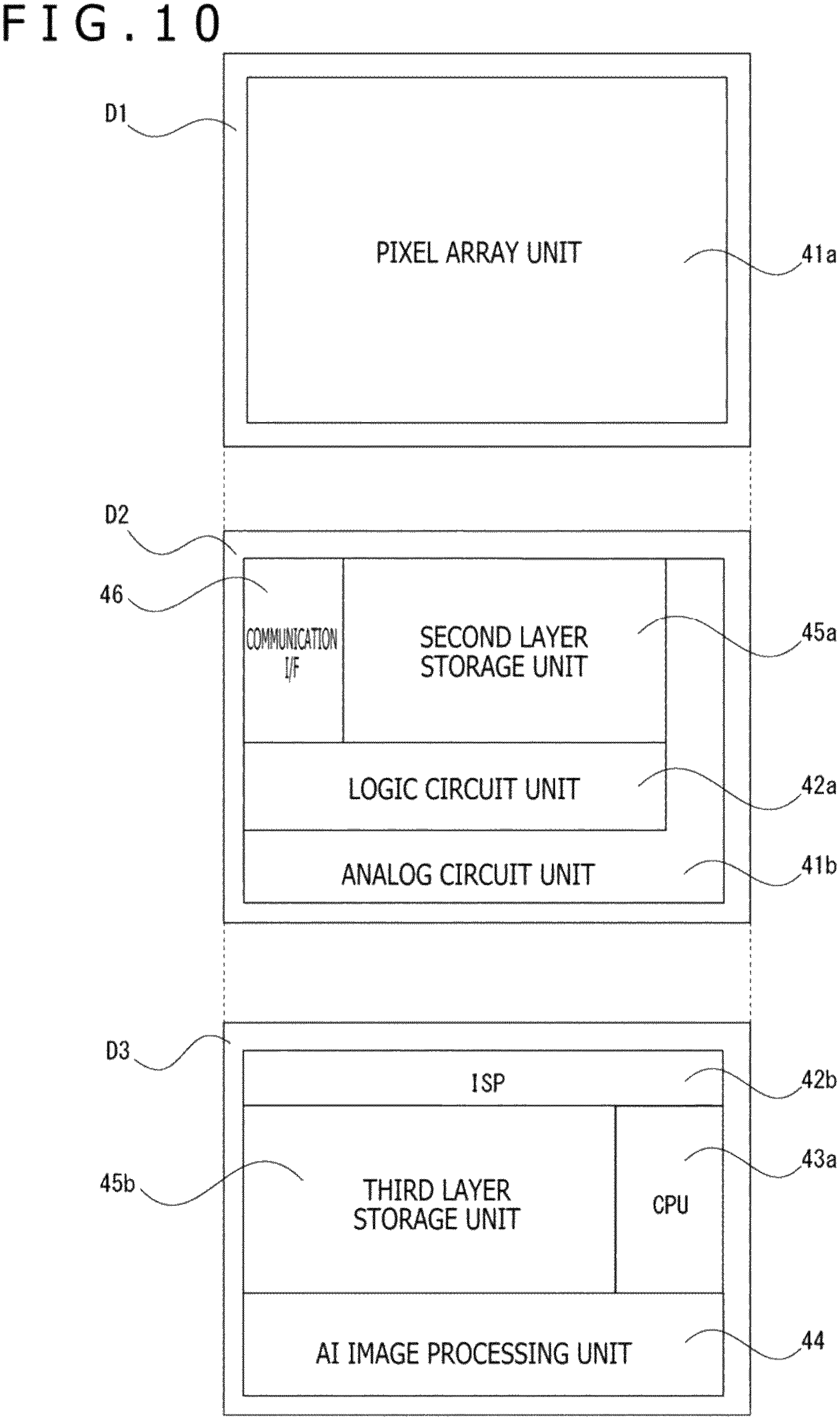
FIG. 10 is a floor map illustrating a configuration example of respective layers of the image sensor.

However, as illustrated in FIG. 8 and FIG. 10 referred to below, the chip sizes of the second layer and the third layer can be reduced by separating components other than the pixel array unit 41*a* into two groups and separately mounting these groups in two layers. In this manner, the entire size of the image sensor IS can be adjusted to the size of the pixel array unit 41*a*, and therefore, entire size reduction of the image sensor IS is achievable.

The control function F11 illustrated in FIG. 9 issues instructions to the imaging unit 41 and the image signal processing unit 42 as described above to control an imaging action in such a manner as to obtain desired captured image data.

Moreover, the control function F11 issues an instruction to the AI image processing unit 44 to achieve AI image processing using an AI model.

The authentication function F12 transmits an authentication request to the cloud side information processing device for such authentication that the image sensor IS has been registered on the basis of a certificate retained in the image sensor IS, and establishes communication with the cloud side information processing device.

The encryption function F13 decodes an AI model deployed by using a decoding key in a case where the AI model is deployed from the outside of the image sensor IS.

Moreover, the encryption function F13 performs a process for encrypting image data output from the image sensor IS, by using an encryption key.

The certificate handled by the authentication function F12 and the decoding key and the encryption key handled by the encryption function F13 are stored in the ROM or the RAM of the second layer storage unit 45*a* or the third layer storage unit 45*b*.

FIG. 10 illustrates an arrangement example of the respective components disposed on the dies D1, D2, and D3 forming the respective layers of the image sensor IS.

The pixel array unit 41*a* is formed on an approximately entire surface of the die D1 forming the first layer.

The analog circuit unit 41*b*, the logic circuit 42*a*, the second layer storage unit 45*a*, and the communication I/F 46 are provided on the die D2 forming the second layer.

In the configuration where the second layer storage unit 45*a* is provided adjacently to the analog circuit unit 41*b* and the logic circuit unit 42*a*, speedup of accesses from the respective components to the second layer storage unit 45*a* is achievable.

The ISP 42*b*, the CPU 43*a*, the AI image processing unit 44, and the third layer storage unit 45*b* are provided on the die D3 forming the third layer.

In the configuration where the third layer storage unit 45*b* is provided adjacently to the ISP 42*b*, the CPU 43*a*, and the AI image processing unit 44, speedup of processes performed by the respective components is achievable. Particularly, AI image processing executed by the AI image processing unit 44 handles a large volume of intermediate data and the like. Accordingly, a large advantageous effect can be produced from the configuration where the third layer storage unit 45*b* is located adjacently.

Moreover, according to the present example illustrated in FIG. 10, the chip sizes of the respective layers are equalized. The image sensor IS having the equalized chip size of the respective layers can be manufactured by what is generally called the WOW (Wafer on Wafer) method which carries out dicing after overlapping the respective layers in a state of disk-shaped silicon wafer. Accordingly, the dicing step can be completed by only one step. Moreover, the respective layers overlapped in the state of silicon wafer as a large material facilitate positioning of the respective chips. Accordingly, the degree of difficulty of the manufacturing steps can be lowered, and therefore, these steps can smoothly be completed.

Note that, in a case where the respective layers are laminated in the state of wafer and cut out by one dicing, the chip sizes of the respective layers can be considered to have a uniform size.

6. Different Examples of Configuration of Image Sensor

Various configurations are adoptable for the image sensor IS. Described herein, as different examples, will be examples of the configuration of the image sensor IS other than the configuration example described above.

Figure 11:
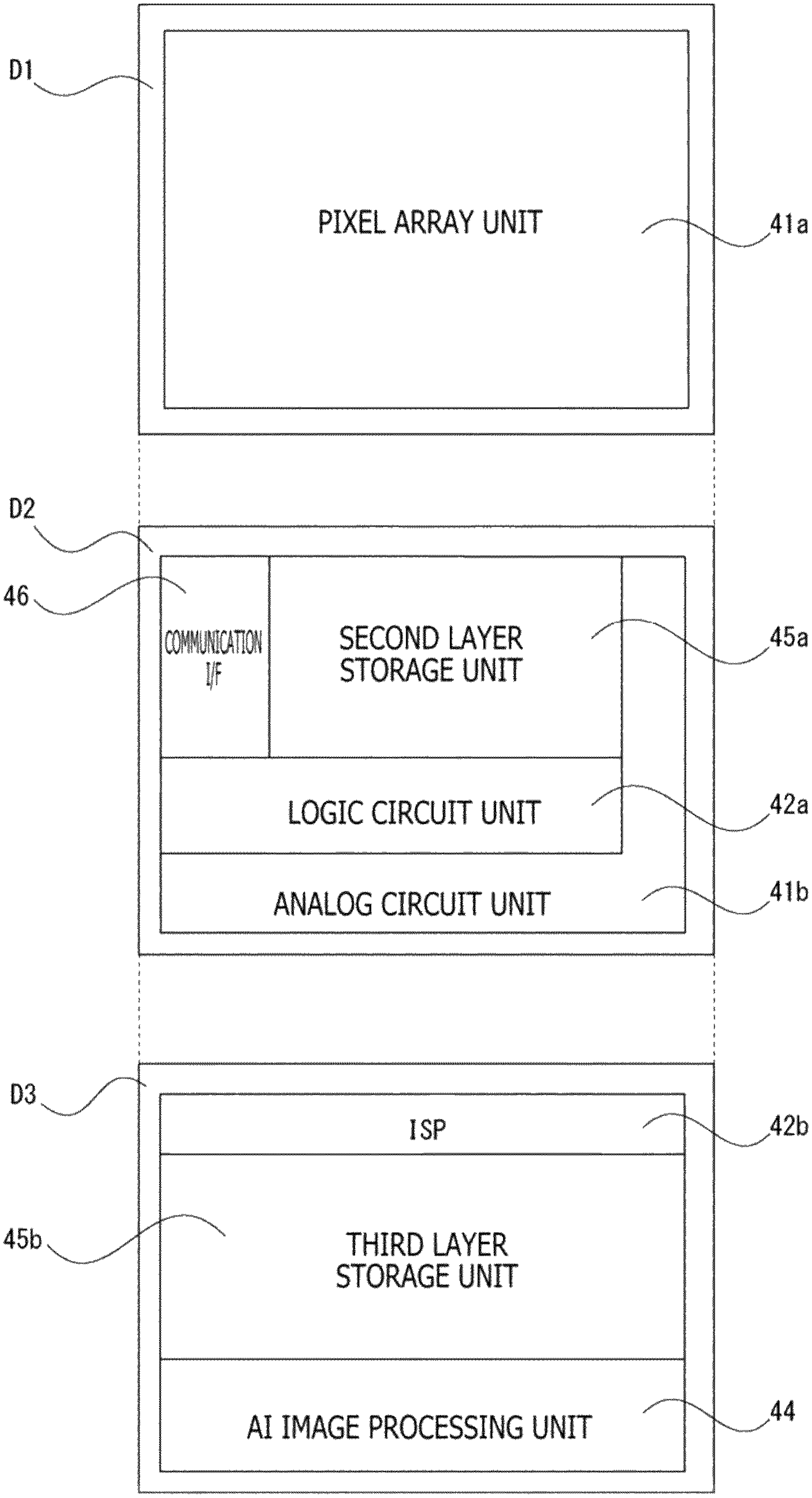
FIG. 11 is a floor map illustrating a first different configuration example of the respective layers of the image sensor.

FIG. 11 illustrates a first different configuration example. The first configuration example is a configuration where the in-sensor control unit 43 (CPU 43*a*) is not provided in the third layer. For example, as described above, a mask process for painting out a person contained in an image for privacy protection, a process for adding a bounding box for presenting a type of a subject detected by AI image processing, and other processes are achievable by directly operating pixel values of frame images stored in the second layer storage unit 45*a* as a frame memory. Because these processes are achievable by a memory controller or the like, the CPU 43*a* need not be provided.

Figure 12:
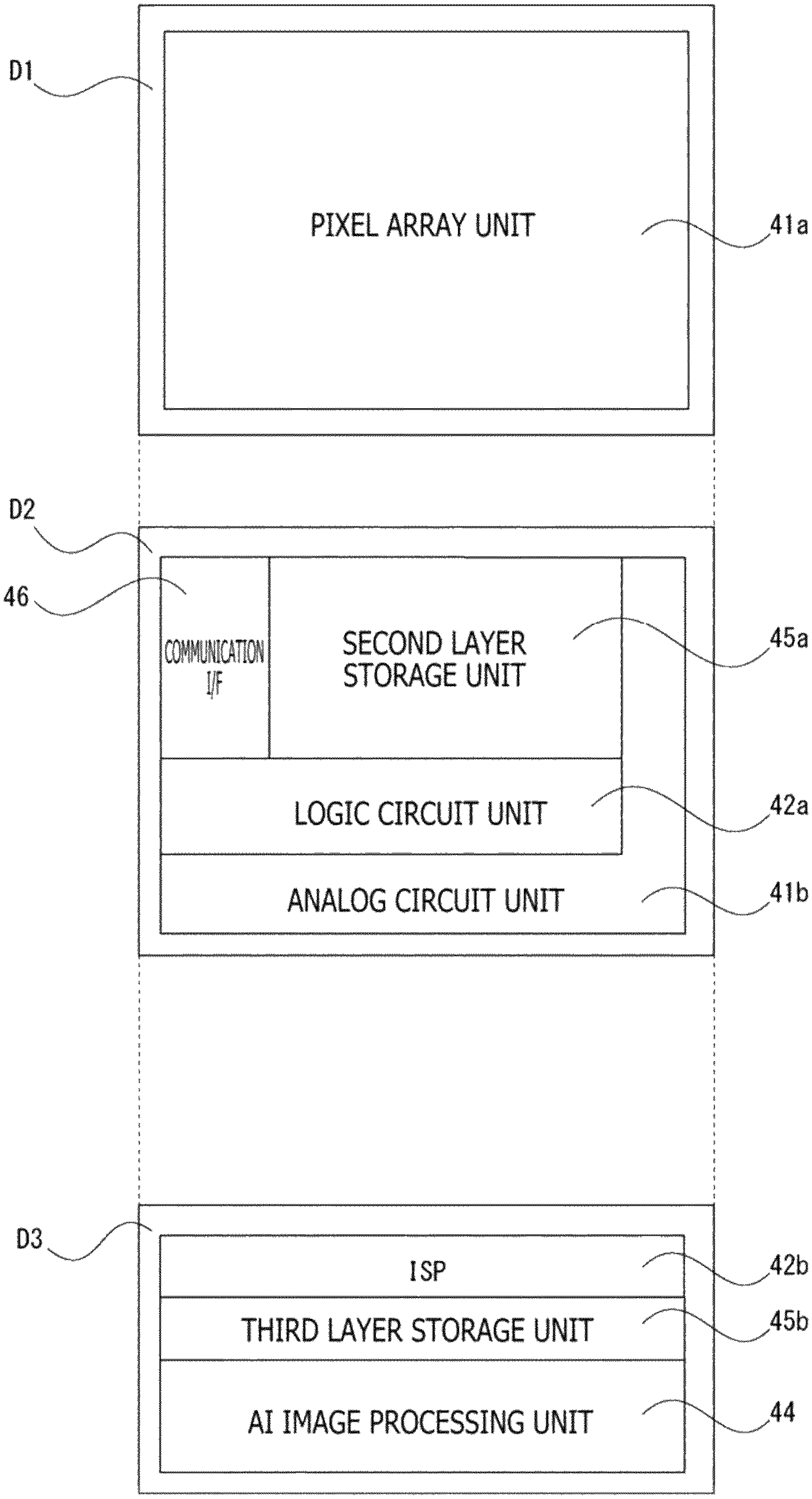
FIG. 12 is a floor map illustrating a second different configuration example of the respective layers of the image sensor.

FIG. 12 illustrates a second different configuration example. The second configuration example is a configuration where the chip size of the die D3 constituting the third layer is made smaller than each chip size of the dies D1 and D2 constituting the first layer and the second layer. Specifically, the short side of the rectangular chip shape has a smaller length.

In this case, the number of the dies D3 formed in one wafer is allowed to increase, and therefore, chip cost reduction is achievable. Moreover, the chip in the third layer is laminated on the die D2 constituting the second layer after dicing. In this case, only the die D3 determined as a good product by inspection is allowed to be laminated. Accordingly, a yield of the image sensor IS improves.

Figure 13:
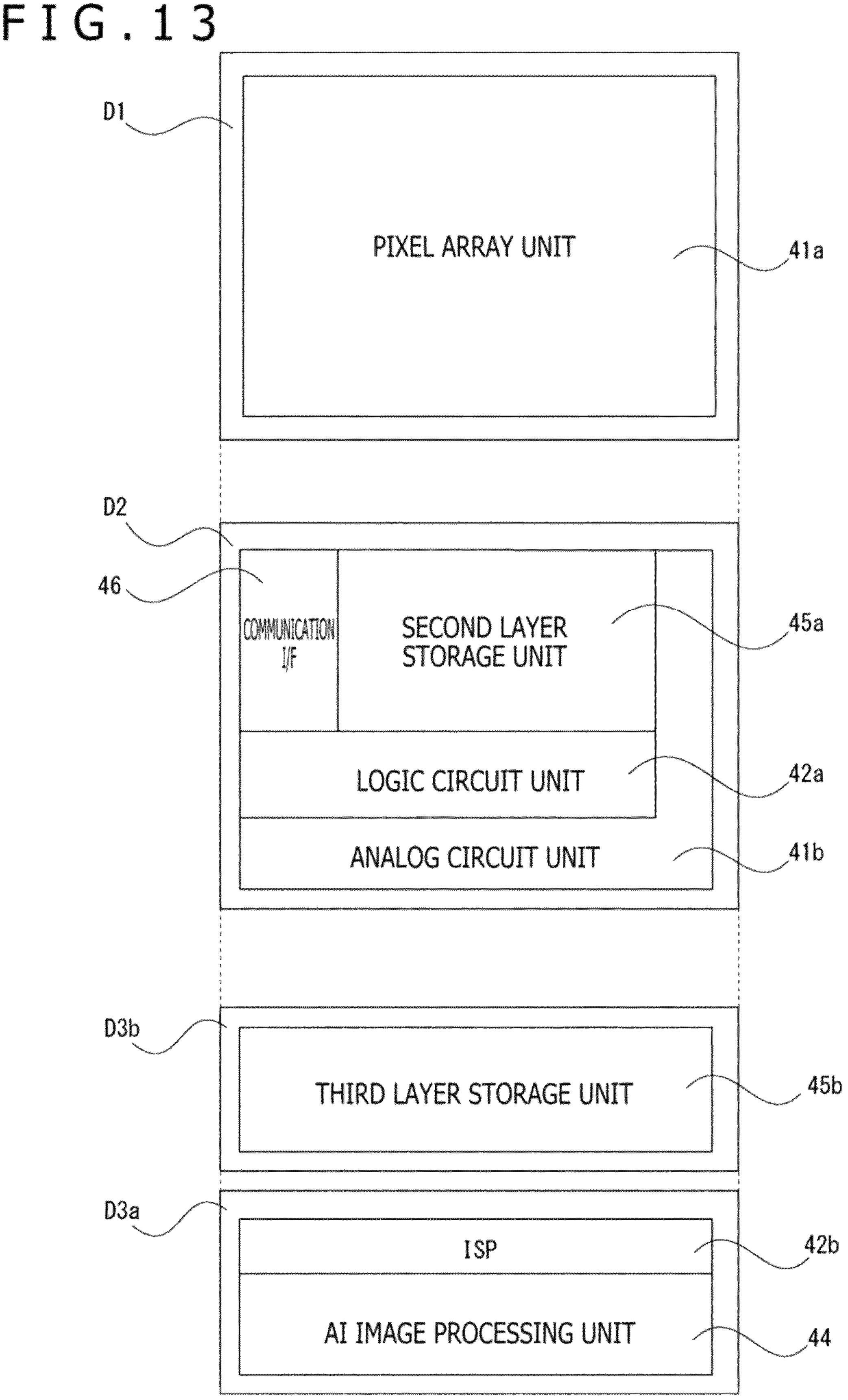
FIG. 13 is a floor map illustrating a third different configuration example of the respective layers of the image sensor.

FIG. 13 illustrates a third different configuration example. The third configuration example is a configuration where two dies D3*a* and D3*b* are contained in the third layer.

For example, the ISP 42*b* and the AI image processing unit 44 are provided on the die D3*a*, while the third layer storage unit 45*b* is provided on the die D3*b*.

In this case, the die D3*a* and the die D3*b* can be manufactured by different processes.

For example, each of DSPs functioning as the ISP 42*b* and the AI image processing unit 44 provided on the die D3*b* can be manufactured by an advanced process for several nanometers, while the third layer storage unit 45*b* provided on the die D3*b* can be manufactured by a different manufacturing process to form a DRAM (Dynamic Random Access Memory) for high integration.

In the configuration where the third layer storage unit 45*b* constituting a DRAM is a high integration type, an increase in the storage capacity of the third layer storage unit 45*b* or size reduction of the third layer storage unit 45*b* is achievable. Moreover, size reduction of the third layer storage unit 45*b* allows a chip for achieving other functions to be disposed in a space produced by reduction, and therefore, improvement of the function of the image sensor IS is achievable.

Further, as illustrated in FIG. 13, the two dies D3*a* and D3*b* disposed in the third layer are located away from each other in an extension direction of the short sides of the laminated surfaces.

In this case, the number of wires formed between the die D3*a* and the die D3*b* increases. Accordingly, data transfer speed between the two chips increases, and therefore, speedup of processing is achievable.

Note that, in a case where the data volume to be transferred between the two chips is fixed, the data transfer speed necessary for completing transfer within a predetermined period of time is lowered by the increase in the number of the wires. Accordingly, electromagnetic noise generated by data transfer can be reduced.

Figure 14:
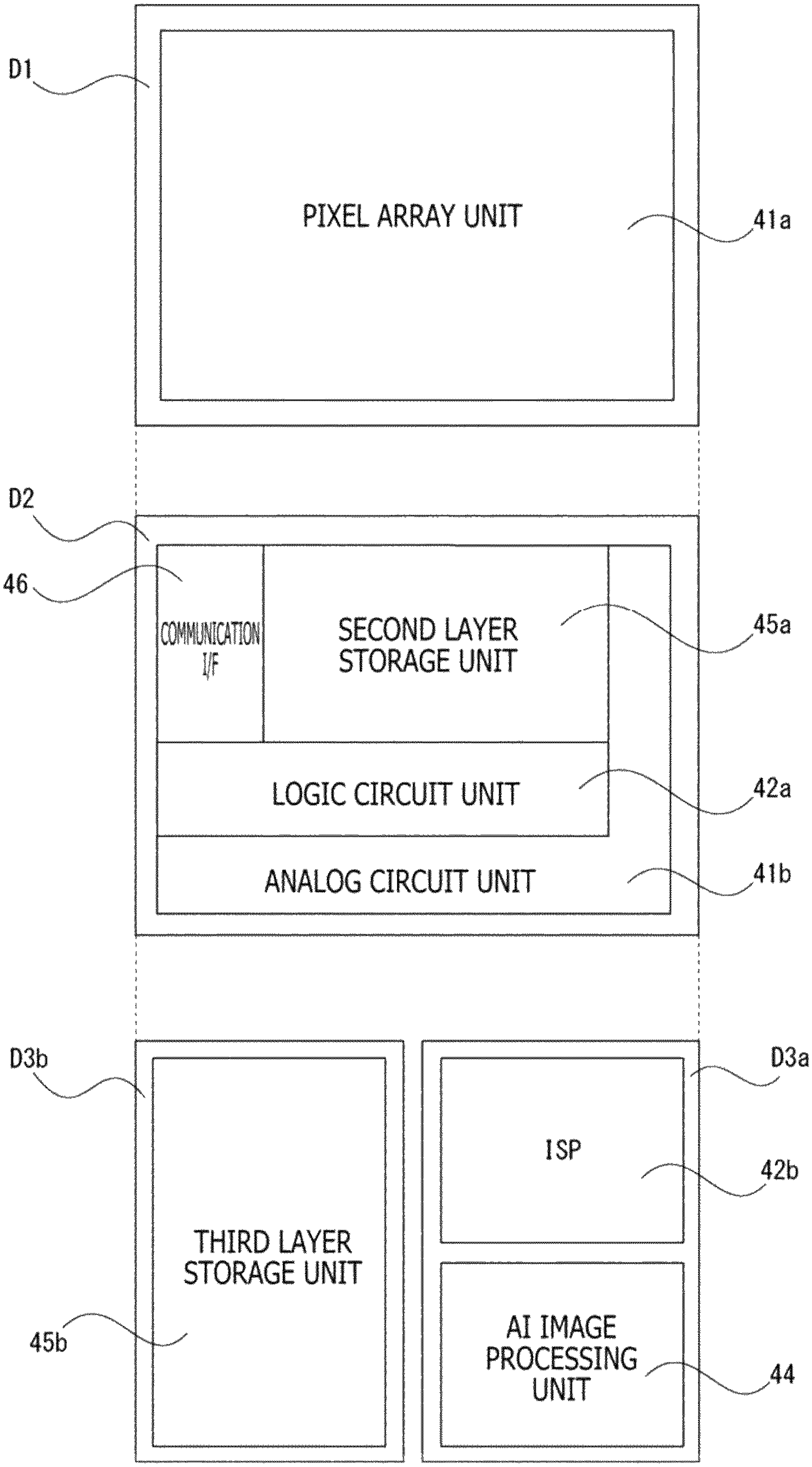
FIG. 14 is a floor map illustrating a modification of the third different configuration example of the respective layers of the image sensor.

Meanwhile, as illustrated in FIG. 14, the dies D3*a* and D3*b* may be disposed away from each other in an extension direction of the long sides of the laminated surfaces.

The effect of the electromagnetic noise generated by data transfer via wires between the chips on the pixel signals from the pixels increases in the lamination direction of the chips as the pixels are located closer to an area where the wires between the chips and the readout circuit overlap each other in the lamination direction.

In this case, the pixels affected by electromagnetic noise are easily identified. Accordingly, complication of a method for noise reduction is avoidable.

Note that a wire having a large area (what is generally called a "copper foil solid painting wire") and provided between the second layer and the third layer is available as a magnetic field shield. In this manner, the effect of electromagnetic noise generated in the third layer on the second layer and the first layer can be reduced.

Figure 15:
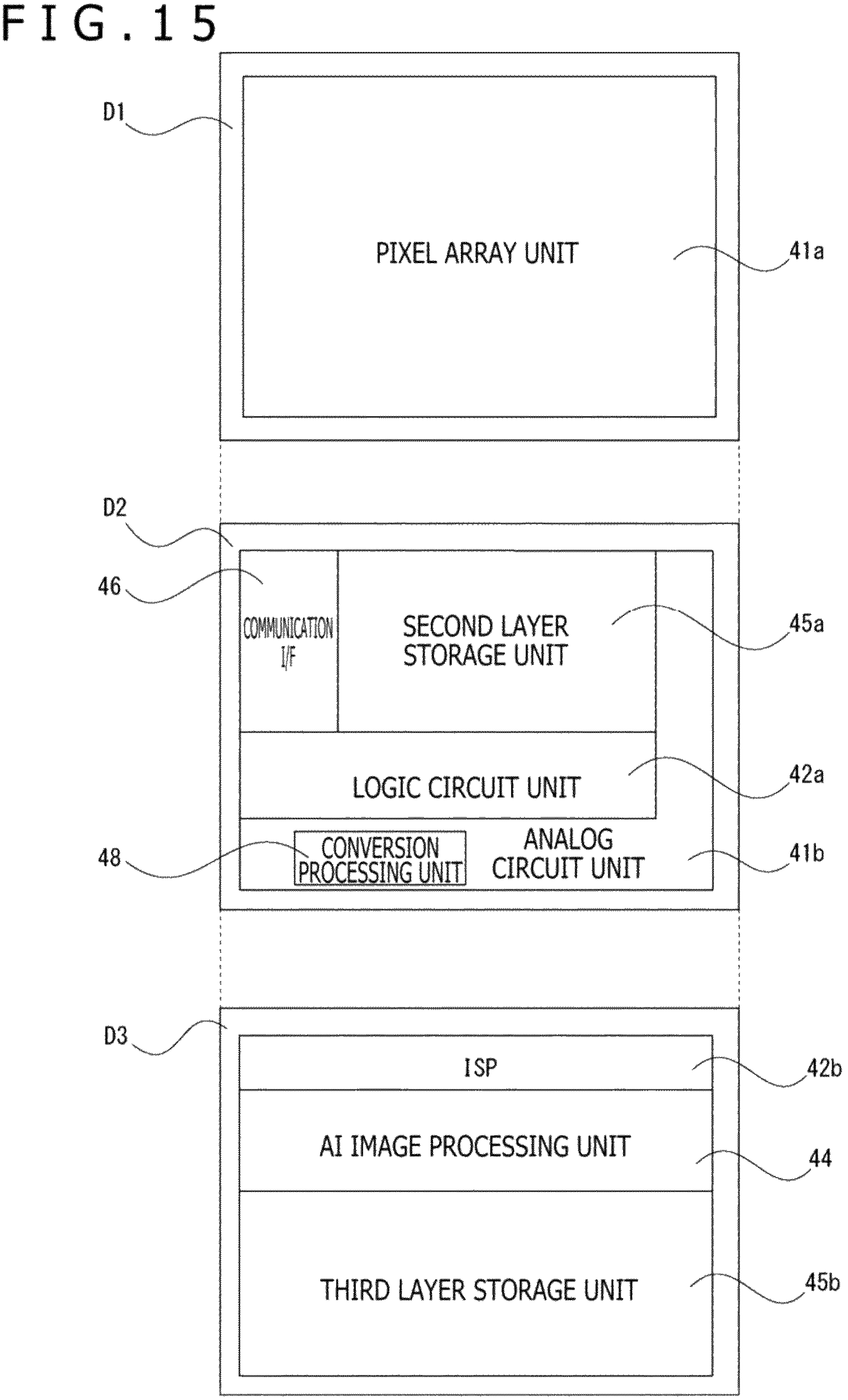
FIG. 15 is a floor map illustrating a fourth different configuration example of the respective layers of the image sensor.

FIG. 15 illustrates a fourth different configuration example. The fourth configuration example is a configuration where the respective components in the third layer are disposed at positions different from the positions in the above examples. Specifically, the area of the region where the analog circuit unit 41*b* provided on the die D2 and the AI image processing unit 44 provided on the die D3 overlap each other as viewed in the lamination direction is reduced in the fourth configuration example.

In addition, a conversion processing unit 48 provided as a part of the analog circuit unit 41*b* and performing A/D conversion is disposed at a position not overlapping the AI image processing unit 44 disposed in the third layer as viewed in the lamination direction.

This configuration can reduce the possibility that electromagnetic noise generated during execution of AI image processing by the AI image processing unit 44 affects a result of A/D conversion. Accordingly, captured image data (RAW image data) containing less noise can be generated as digital data after A/D conversion.

Moreover, this configuration allows synchronous execution of A/D conversion and the inference process. Accordingly, AI image processing which is complicated and requires a long processing time is allowed to be executed.

Figure 16:
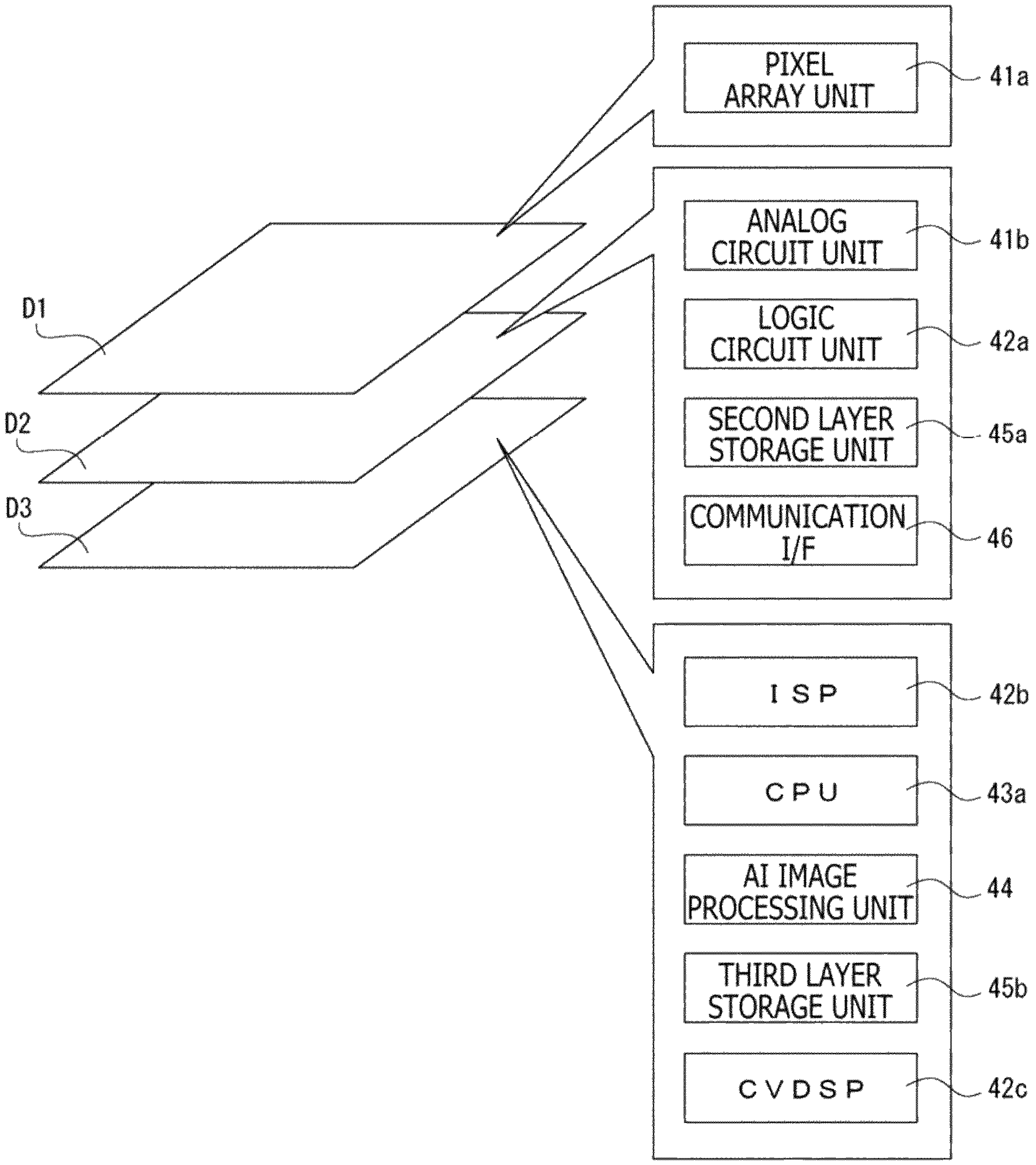
FIG. 16 is a diagram illustrating a fifth different configuration example of the respective layers of the image sensor.
Figure 17:
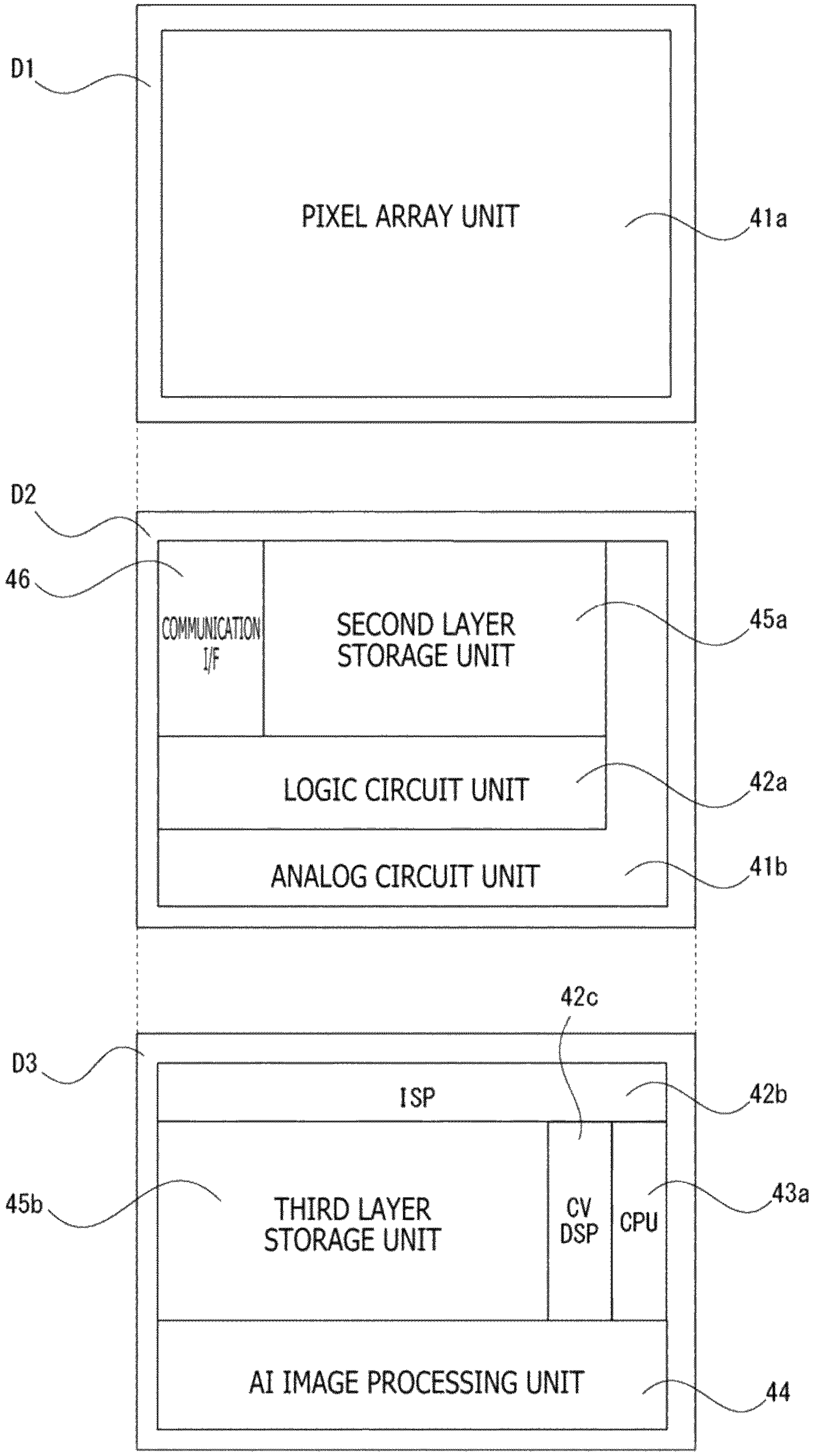
FIG. 17 is a floor map illustrating the fifth different configuration example of the respective layers of the image sensor.

FIGS. 16 and 17 illustrate a fifth different configuration example. According to the fifth configuration example, the image signal processing unit 42 includes a CVDSP 42*c* in addition to the logic circuit unit 42*a* and the ISP 42*b*. In this case, the CVDSP 42*c* includes a DSP that performs a CV process, and is provided on the die D3 constituting the third layer as illustrated in FIG. 16.

While the ISP 42*b* performs image processing for line data output from each line of the pixel array unit 41*a*, the CVDSP 42*c* performs image processing for frame images stored in the second layer storage unit 45*a* as a frame memory.

Accordingly, the CVDSP 42*c* is suited for processing requiring calculation using pixel data of pixels in lines different from pixels designated as targets of image processing, such as an edge emphasis process, a scaling process, and an affine transformation process.

Accordingly, the CVDSP 42*c* is capable of executing these processes without a necessity of reconversion of frame images into line data and therefore contributes to improvement of processing speed. Moreover, the CVDSP 42*c* enables calculation requiring parallel processing using multiple lines for each processing, such as image processing based on a histogram of an entire surface of an image.

As illustrated in FIG. 17, the CVDSP 42*c* is provided on the die D3 constituting the third layer. In addition, particularly, the CVDSP 42*c* and the AI image processing unit 44 are disposed adjacently to the third layer storage unit 45*b*.

This configuration allows the CVDSP 42*c* and the AI image processing unit 44 to easily access the third layer storage unit 45*b*. Accordingly, speedup of processing is achievable.

7. Examples of AI Image Processing

An example of AI image processing executed by the AI image processing unit 44 will be described.

Note that, while several configuration examples of the image sensor IS have been presented in the above description, described hereinafter will be a case where AI image processing is executed by the fifth configuration example of the image sensor IS explained with reference to FIGS. 16 and 17.

7-1. First Example

A first example of AI image processing is an example which applies a mask process to an image.

Figure 18:
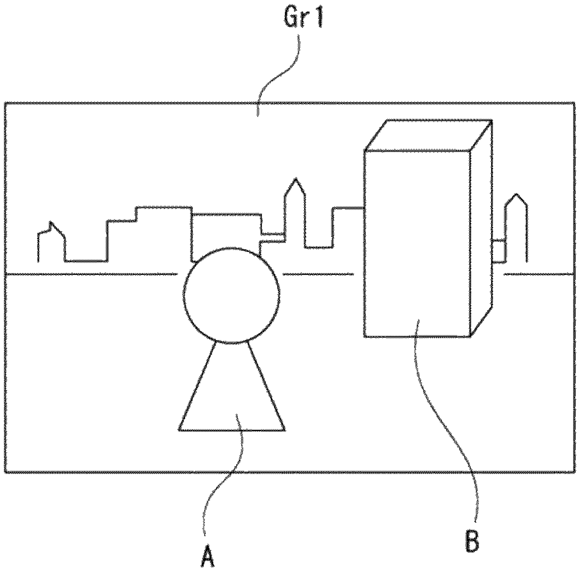
FIG. 18 illustrates an example of an image obtained before a mask process.

FIG. 18 illustrates an example of an image Gr1 obtained prior to the mask process.

The image Gr1 prior to the mask process contains a person A and an object B having a box shape as subjects.

The image Gr1 is input to the AI image processing unit 44 as an input tensor. The AI image processing unit 44 executes AI image processing for inferring a region of the person A captured in the image Gr1 as the input tensor.

Figure 19:
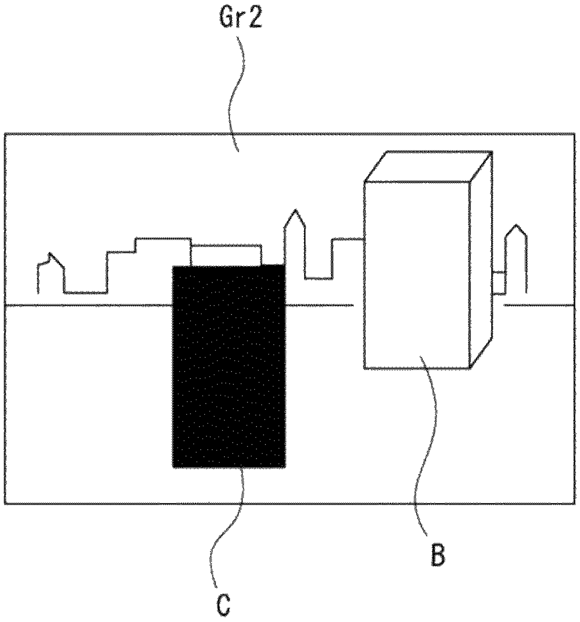
FIG. 19 illustrates an example of an image obtained after the mask process.

As a result, the image sensor IS obtains an image Gr2 which includes a black image region C that corresponds to the image region of the captured person A and that is painted out in black (see FIG. 19).

Note that several methods are adoptable for forming the image Gr2 as a result of the mask process.

One of the methods is a method which designates a frame image as an input tensor for the AI image processing unit 44 and designates an image containing an image region that corresponds to a captured person and that is painted out in a predetermined color as an output tensor from the AI image processing unit 44 as illustrated in FIG. 19. That is, the AI image processing unit 44 performs processing up to masking of the predetermined region.

Another one of the methods is a method which designates a frame image as an input tensor for the AI image processing unit 44 and designates coordinate information for identifying an image region of a captured person as an output tensor from the AI image processing unit 44. In this case, the CPU 43*a* and the memory controller of the second layer storage unit 45*a* perform a process for overwriting an image region identified on the basis of the coordinate information in the frame image stored in the second layer storage unit 45*a* with a predetermined pixel value (0, 255, etc.).

7-2. Second Example

A second example of AI image processing is an example which superimposes a bounding box on an image.

The image Gr1 prior to superimposition is identical to the foregoing image illustrated in FIG. 18. The image Gr1 contains the person A and the object B.

The image Gr1 is input to the AI image processing unit 44 as an input tensor. The AI image processing unit 44 detects the person A and the object B in the image Gr1 and attaches labels indicating classification results of the detected person A and object B. As a result, an image Gr3 is obtained as an image which contains frame images D superimposed on the frame image as bounding boxes (see FIG. 20).

Note that two methods are adoptable for forming the image Gr3, as with the above case. Specifically, the first method is a method which outputs the image Gr3 containing the superimposed frame images D as an output tensor from the AI image processing unit 44.

The other method is a method which outputs coordinate information and label information associated with the person A and the object B as an output tensor from the AI image processing unit 44. In this case, the CPU 43*a* and the memory controller of the second layer storage unit 45*a* overwrite a rectangular shape surrounding an image region identified on the basis of the coordinate information in the frame image stored in the second layer storage unit 45*a* with a predetermined pixel value to achieve superimposition of each of the frame images D as a bounding box.

Figure 20:
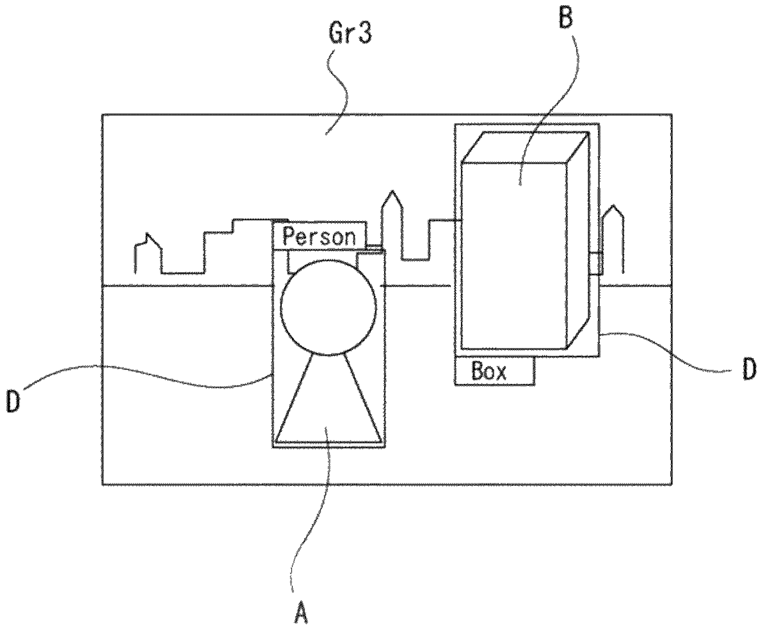
FIG. 20 is an example of an image on which bounding boxes are superimposed.

Note that various frame images D are adoptable as a bounding box. For example, as illustrated in FIG. 20, the frame image D may be an image containing a frame-shaped image and character information indicating the label information or may be only a frame-shaped image. In addition, in a case where the frame image D is only a frame-shaped image, this frame-shaped image may have a color corresponding to a classification result of a subject.

7-3. Third Example

Each of a third example and a fourth example described below of AI image processing is an example where the AI image processing unit 44 executes AI image processing while switching multiple types of AI image processing.

In the third example, the AI image processing unit 44 performs first AI image processing using a first AI model, subsequently switches the AI model to a second AI model, and then performs second AI image processing using the second AI model.

For example, the first AI image processing designates a frame image as an input tensor, infers age information associated with a person captured in the image, and outputs the age information as an output tensor.

Moreover, the second AI image processing performed using the switched AI model designates a frame image as an input tensor, infers gender information associated with a person captured in the image, and outputs the gender information as an output tensor.

At this time, a CV process by the CVDSP 42*c* is not performed between the first AI image processing and the second AI image processing.

7-4. Fourth Example

The fourth example of AI image processing is an example which executes AI image processing while switching multiple types of AI image processing as with the third example. In addition, the fourth example is different from the third example in that a CV process is performed by the CVDSP 42*c* between the two types of AI image processing.

For example, the first AI image processing may extract a person from an image, and a CV process by the CVDSP 42*c* may carry out a cutout process for cutting out the corresponding region from the image. Subsequently, the second AI image processing may carry out a process for detecting a feature value on the basis of the image (partial image) cut out by the CVDSP 42*c* in the CV process as an input tensor.

Note that the image corresponding to a processing target for the CVDSP 42*c* at this time is a frame image stored in the second layer storage unit 45*a*.

In a case where the AI image processing unit 44 performs multiple types of AI image processing by using multiple AI models as described above, the first AI model dedicated to the first AI image processing and the second AI model dedicated to the second AI image processing can be used. Accordingly, a highly reliable inference result can be obtained as a whole.

Note that switching of the AI model is achieved by switching the weighting factor of the AI model. In this manner, switching of the AI model is achievable by an easy process.

Moreover, a recognition rate of the AI image processing is allowed to improve, by appropriate image processing applied by the CVDSP 42*c* to the input tensor input to the second AI model.

Further, the image processing by the CVDSP 42*c* is processing performed according to a recognition result of the first AI image processing. This input tensor is data of a frame image stored in the second layer storage unit 45*a* as a frame memory.

Accordingly, such processing is achievable by the configuration of the image sensor IS including the second layer storage unit 45*a* as a frame memory.

As described above, several cases are considered as the example which performs the first AI image processing for detecting a specific target such as a person, the process for cutting out a predetermined image region by using the CVDSP 42*c* according to a result of this detection, and the second AI image processing performed on the basis of the cutout partial image as an input tensor.

For example, the first AI image processing performs face detection, the CVDSP 42*c* performs a process for cutting out a detected image region, and the second AI image processing performs a process for detecting a feature value of the face. In this manner, such a function which searches for a specific person from images of a monitoring camera is achievable.

Moreover, the first AI image processing performs detection of a human body, the CVDSP 42*c* performs a process for cutting out a detected image region, and the second AI image processing performs skeleton estimation or posture estimation. In this manner, for example, a function of estimating a behavior of a person captured in an image of a monitoring camera is achievable.

Further, the first AI image processing performs detection of a license plate of a vehicle, the CVDSP 42*c* performs a process for cutting out a detected image region, and the second AI image processing performs a process for estimating characters written on the license plate. In this manner, a function of identifying a vehicle passing through the front of a traffic monitoring camera is achievable.

As described above, the second AI image processing can suitably perform a process for estimating attribute information associated with a person, posture information and skeleton information associated with a person, and a character string on a license plate, and the like on the basis of a predetermined region cut out by the CVDSP 42*c* from an image.

7-5. Fifth Example

A fifth example of AI image processing is an example where the AI image processing unit 44 executes AI image processing while switching multiple types of AI image processing. In addition, the fifth example is different from the fourth example in that an image corresponding to a processing target of a CV process performed by the CVDSP 42*c* is not a frame image stored in the second layer storage unit 45*a* as a frame memory but an image output from the first AI image processing as an output tensor.

That is, the CVDSP 42*c* makes a further change of the image changed by the first AI image processing.

Specifically, the AI image processing unit 44 performs a denoising process for removing noise from a frame image in the first AI image processing using the first AI model.

The CVDSP 42*c* performs an edge emphasis process as a CV process for the image obtained after noise removal as an output tensor from the first AI model.

The AI image processing unit 44 inputs the image obtained after edge emphasis as an input tensor for the second AI model, and performs a detection process such as person detection as the second AI image processing.

The CVDSP 42*c* performs a CV process for an output tensor from the first AI image processing performed by the AI image processing unit 44. In this manner, the image as the input tensor input to the second AI image processing is converted into a more appropriate image. Accordingly, a subject can more accurately be inferred by the second AI image processing.

Note that various deterioration correction processes for correcting deterioration of images are applicable as the first AI image processing. Moreover, various clarification processes for clarifying images are applicable as the CV process performed by the CVDSP 42*c*.

For example, a dynamic range correction process and the like may be carried out as the deterioration correction process in addition to the denoising process.

Meanwhile, a chroma correction process and a contrast correction process may be carried out as the clarification process in addition to the edge emphasis process.

As described above, the second AI image processing is performed on the basis of an input tensor which is an image to which the deterioration correction process as the first AI image processing and also the clarification process by the CVDSP 42*c* have been applied. In this manner, a highly accurate inference process is achievable in the second AI image processing.

Needless to say, as the manner opposite to the above manner, the process for inferring the image available after clarification may be performed in the first AI image processing, and the CV process as the deterioration correction process may be executed by the CVDSP 42*c*.

8. Flow of Processing

A flow of processing performed by the respective components will be described for each of the first example to the fifth example of AI image processing described above.

8-1. First Example and Second Example

Figure 21:
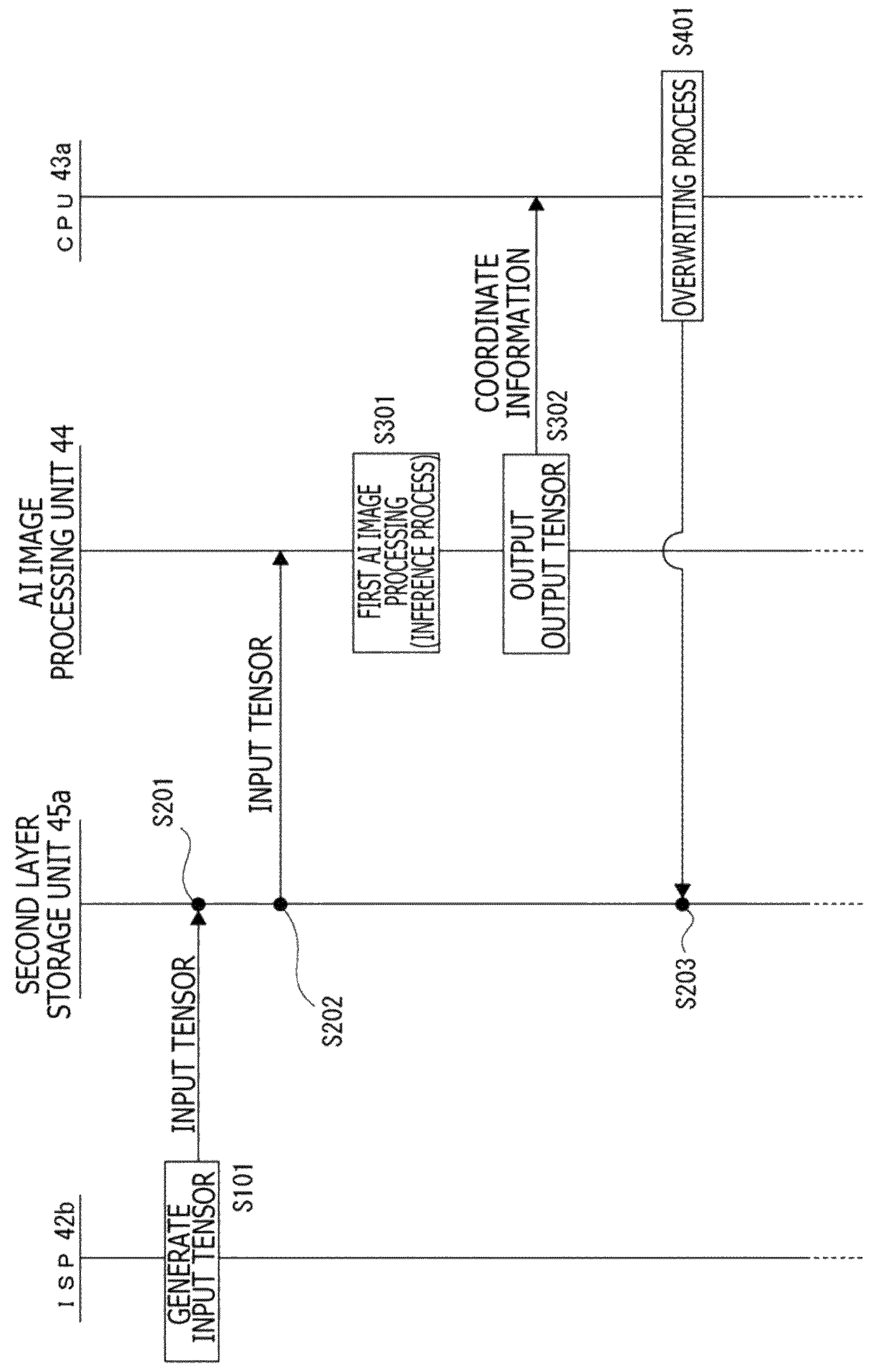
FIG. 21 is a diagram illustrating a flow of processing in a first example and a second example of AI image processing.

A first example of AI image processing is an example which applies a mask process to a partial region of an image (see FIGS. 18 and 19). Meanwhile, a second example of AI image processing is an example which superimposes a bounding box on a partial region in an image (see FIGS. 18 and 20). FIG. 21 illustrates a flow of processing executed by the respective components in the first and second examples of AI image processing.

In step S101, the ISP 42*b* initially generates an input tensor on the basis of a frame image obtained by applying processing, with use of the analog circuit unit 41*b* and the logic circuit unit 42*a*, to a pixel signal output from the pixel array unit 41*a*. For example, this process may designate the frame image as the input tensor without change or may convert the frame image to an image in a format same as that of an input tensor for an AI model in a following stage.

In step S201, the generated input tensor is stored in the second layer storage unit 45*a*.

In step S202, the AI image processing unit 44 acquires the input tensor from the second layer storage unit 45*a*. In step S301, this input tensor is supplied to a first AI model to perform an inference process corresponding to first AI image processing.

In step S302, the AI image processing unit 44 outputs coordinate information to the CPU 43*a* as an output tensor from the first AI model. Note that this coordinate information may be temporarily stored in the memory unit 45 and output to the CPU 43*a* via the memory unit 45.

In step S401, the CPU 43*a* performs an overwriting process according to the coordinate information. This overwriting process causes the second layer storage unit 45*a* to overwrite a pixel value in step S203. As a result, a process for replacing a captured image region containing a person with a black image or a process for superimposing a bounding box is achieved, for example.

8-2. Third Example

Figure 22:
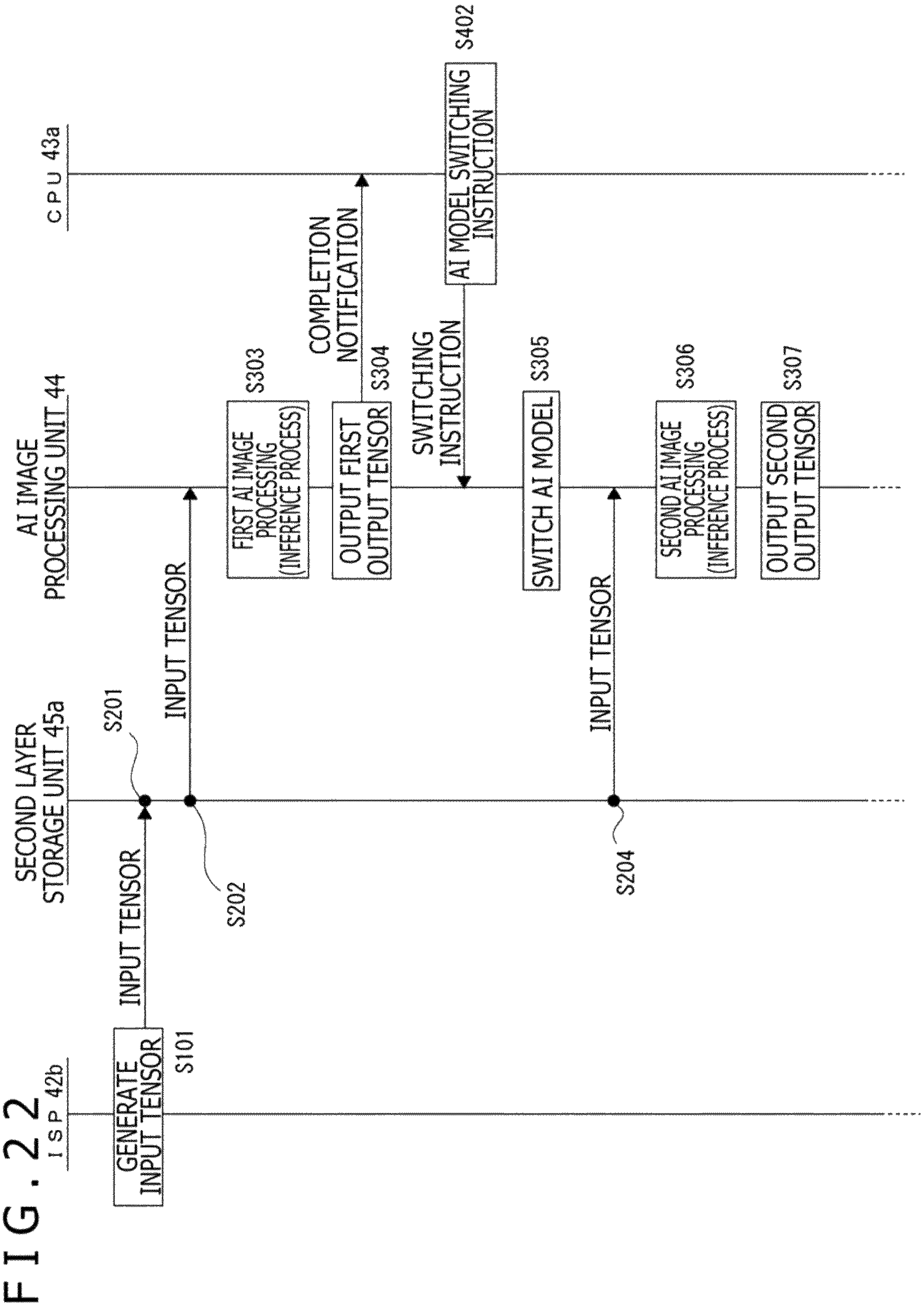
FIG. 22 is a diagram illustrating a flow of processing in a third example of AI image processing.

A third example is an example which executes AI image processing while switching multiple types of AI image processing. FIG. 22 illustrates a flow of processing executed by the respective components in the third example of AI image processing.

In step S101, the ISP 42*b* initially generates an input tensor on the basis of a frame image obtained by applying processing, with use of the analog circuit unit 41*b* and the logic circuit unit 42*a*, to a pixel signal output from the pixel array unit 41*a*. For example, this process may designate the frame image as the input tensor without change or may convert the frame image to an image in a format same as that of an input tensor for an AI model in a following stage.

In step S201, the generated input tensor is stored in the second layer storage unit 45*a*.

In step S202, the AI image processing unit 44 acquires the input tensor from the second layer storage unit 45*a*. In step S303, this input tensor is supplied to a first AI model to perform an inference process corresponding to first AI image processing. For example, the first AI image processing is a process for inferring the age of a person corresponding to a subject.

In step S304, the AI image processing unit 44 outputs an inference result (e.g., estimated age information) to the outside of the image sensor IS as a first output tensor from the first AI model. Moreover, a completion notification of the inference process is transmitted to the CPU 43*a* at this time.

The CPU 43*a* having received the completion notification transmits an AI model switching instruction in step S402.

In response to this instruction, the AI image processing unit 44 switches the AI model in step S305. As a result, the first AI model is switched to a second AI model.

In step S204, the AI image processing unit 44 again acquires an input tensor from the second layer storage unit 45*a*. This input tensor may be identical to the input tensor input to the first AI model.

In step S306, the AI image processing unit 44 executes second AI image processing using the second AI model. For example, the second AI image processing is a process for inferring the gender of the person corresponding to the subject.

In subsequent step S307, the AI image processing unit 44 outputs an inference result (e.g., estimated gender information) to the outside of the image sensor IS as a second output tensor from the second AI model. At this time, a notification of completion may be transmitted to the CPU 43*a*.

8-3. Fourth Example

Figure 23:
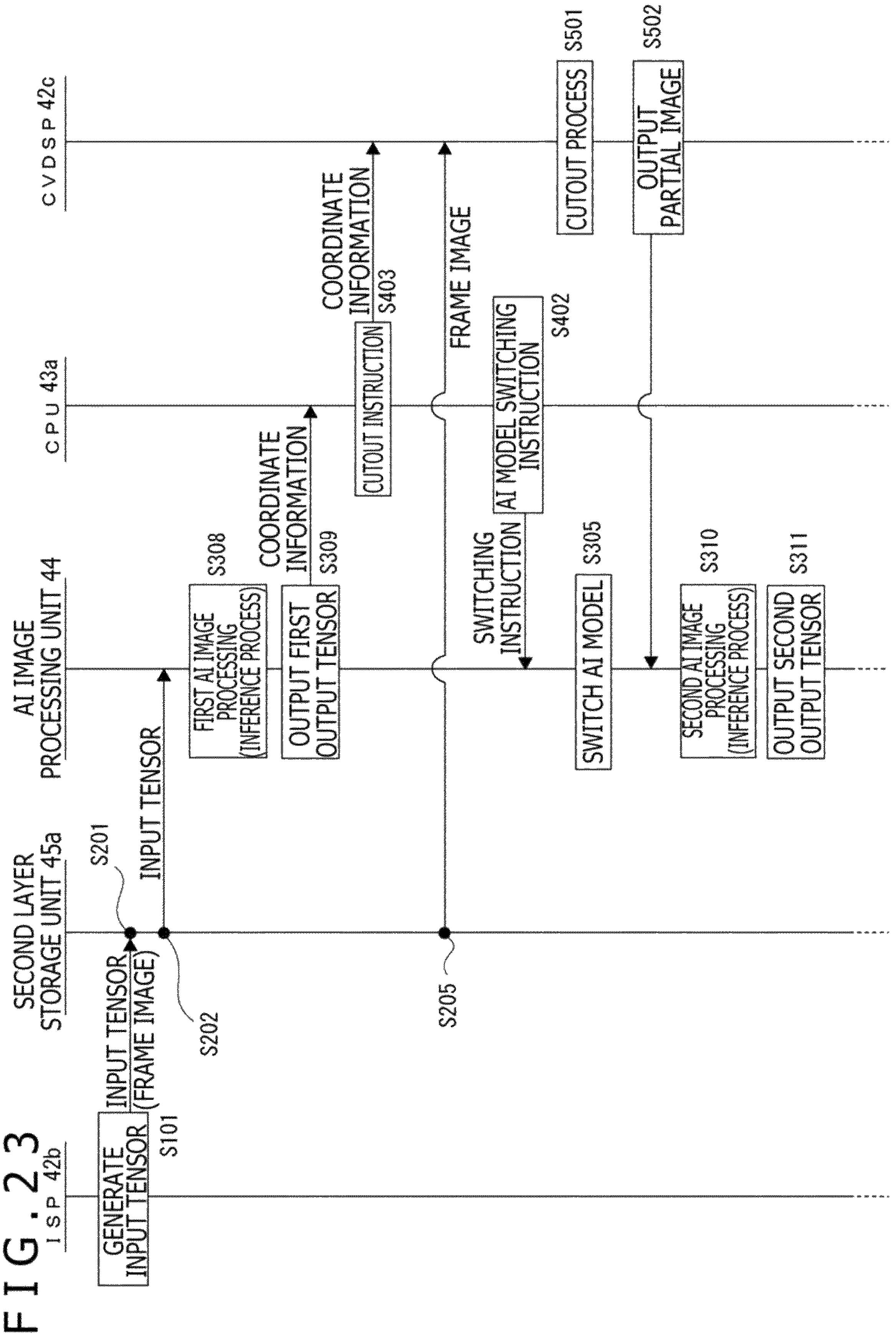
FIG. 23 is a diagram illustrating a flow of processing in a fourth example of AI image processing.

A fourth example is an example which executes AI image processing while switching multiple types of AI image processing. In addition, a CV process is performed by the CVDSP 42*c* between the two types of AI image processing. FIG. 23 illustrates a flow of processing executed by the respective components in the fourth example of AI image processing.

In step S101, the ISP 42*b* initially generates an input tensor on the basis of a frame image obtained by applying processing, with use of the analog circuit unit 41*b* and the logic circuit unit 42*a*, to a pixel signal output from the pixel array unit 41*a*. For example, this process may designate the frame image as the input tensor without change or may convert the frame image to an image in a format same as that of an input tensor for an AI model in a following stage.

In step S201, the generated input tensor is stored in the second layer storage unit 45*a*.

In step S202, the AI image processing unit 44 acquires the input tensor from the second layer storage unit 45*a*. In step S308, this input tensor is supplied to a first AI model to perform an inference process corresponding to first AI image processing. For example, the first AI image processing is a process for identifying an image region containing a face of a person corresponding to a subject.

In step S309, the AI image processing unit 44 outputs coordinate information to the CPU 43*a* as a first output tensor from the first AI model.

In step S403, the CPU 43*a* having received the coordinate information issues a cutout instruction to the CVDSP 42*c*. At this time, the CPU 43*a* transmits the received coordinate information to the CVDSP 42*c*.

In step S205, the CVDSP 42*c* having received the coordinate information acquires a frame image from the second layer storage unit 45*a*.

In step S501, the CVDSP 42*c* performs a process for cutting out an image region identified on the basis of the coordinate information from the acquired frame image. In this manner, the CVDSP 42*c* obtains a partial image containing the face of the person.

In step S502, the CVDSP 42*c* outputs this partial image to the AI image processing unit 44.

Meanwhile, after or substantially simultaneous with the issue of the cutout instruction, the CPU 43*a* issues an AI model switching instruction to the AI image processing unit 44 in step S402.

In response to this instruction, the AI image processing unit 44 switches the AI model in step S305.

After the AI model switching process, the AI image processing unit 44 performs second AI image processing in step S310 on the basis of the partial image received from the CVDSP 42*c* in step S502 as an input tensor. This process is a process for detecting a feature value of the face of the person contained in the partial image.

In step S311, the AI image processing unit 44 outputs the detected feature value to the outside of the image sensor IS as a second output tensor.

8-4. Fifth Example

Figure 24:
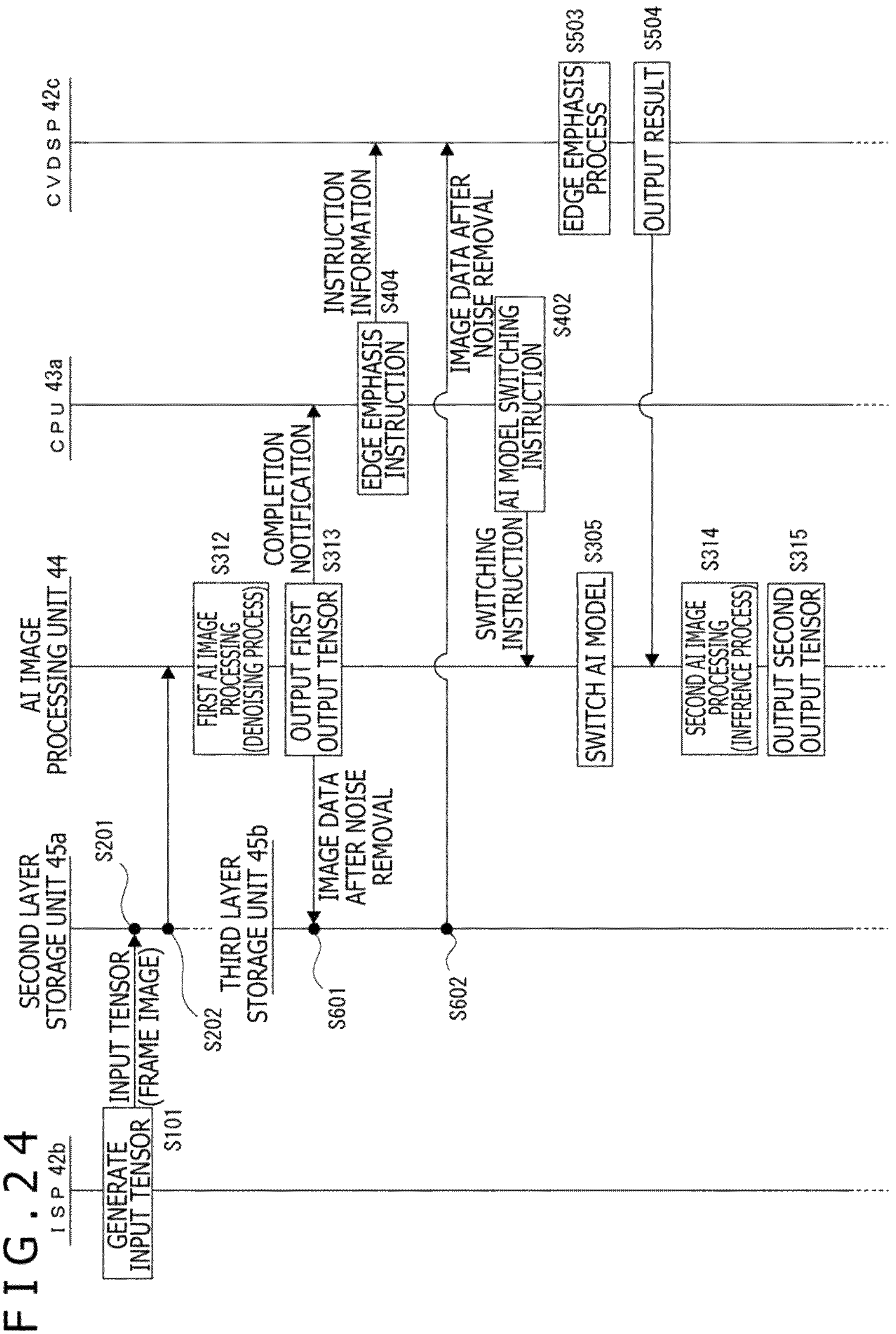
FIG. 24 is a diagram illustrating a flow of processing in a fifth example of AI image processing.

A fifth example of AI image processing is an example where the AI image processing unit 44 executes AI image processing while switching multiple types of AI image processing. In addition, an image corresponding to a processing target of a CV process performed by the CVDSP 42*c* is not a frame image stored in the second layer storage unit 45*a* as a frame memory but an image output from first AI image processing as an output tensor. FIG. 24 illustrates a flow of processing executed by the respective components in the fifth example of AI image processing.

In step S101, the ISP 42b initially generates an input tensor on the basis of a frame image obtained by applying processing, with use of the analog circuit unit 41b and the logic circuit unit 42a, to a pixel signal output from the pixel array unit 41a. For example, this process may designate the frame image as the input tensor without change or may convert the frame image to an image in a format same as that of an input tensor for an AI model in a following stage.

In step S201, the generated input tensor is stored in the second layer storage unit 45a.

In step S202, the AI image processing unit 44 acquires the input tensor from the second layer storage unit 45a. In step S312, this input tensor is supplied to a first AI model to perform an inference process corresponding to first AI image processing. For example, the first AI image processing is a denoising process for removing noise from an image.

In step S313, the AI image processing unit 44 outputs image data obtained after noise removal to the third layer storage unit 45b as a first output tensor from the first AI model. In response to this output, in step S601, the third layer storage unit 45b stores the image data obtained after noise removal.

Moreover, the AI image processing unit 44 transmits a completion notification of the denoising process to the CPU 43a at the time of output of the first output tensor.

In step S404, the CPU 43a having received the completion notification issues to the CVDSP 42c an instruction for execution of edge emphasis which is an example of a process for clarifying the image. In response to this instruction, the CPU 43a transmits instruction information to the CVDSP 42c.

In step S602, the CVDSP 42c having received the instruction information associated with edge emphasis acquires the image data obtained after noise removal from the third layer storage unit 45b.

In step S503, the CVDSP 42c applies image processing for emphasizing edges to the acquired image data obtained after noise removal. In this manner, the CVDSP 42c obtains image data obtained after edge emphasis.

In step S504, the CVDSP 42c transmits the image data obtained after edge emphasis to the AI image processing unit 44. Note that this image data may temporarily be stored in the third layer storage unit 45b at the time of transmission of the image data obtained after edge emphasis from the CVDSP 42c to the AI image processing unit 44.

Meanwhile, after or substantially simultaneous with the issue of the edge emphasis instruction, the CPU 43a issues an AI model switching instruction to the AI image processing unit 44 in step S402.

In response to this instruction, the AI image processing unit 44 switches the AI model in step S305.

After the AI model switching process, the CPU 43a performs second AI image processing in step S314 on the basis of the image data obtained after edge emphasis received from the CVDSP 42c in step S504 as an input tensor. This process is a process for detecting a person contained in the image.

In step S315, the AI image processing unit 44 outputs information associated with the detected person to the outside of the image sensor IS as a second output tensor.

9. Timing Chart

Described will be execution timing of each of the processes performed by the respective components for achieving the respective examples described above.

Figure 25:
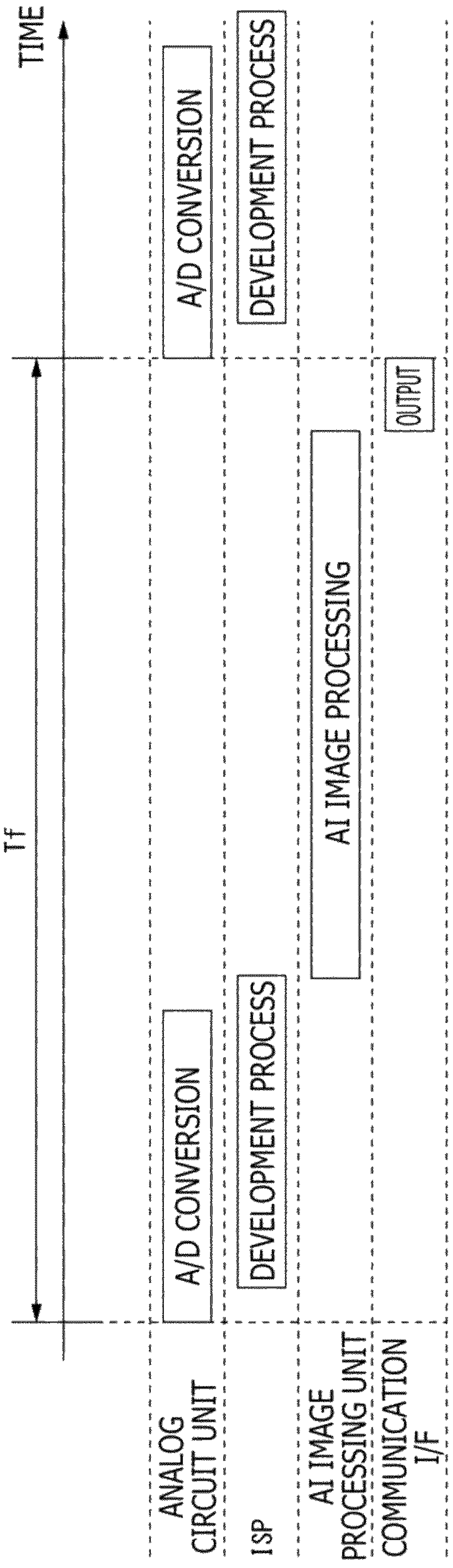
FIG. 25 is a diagram illustrating a first example of execution timing of respective processes.

FIG. 25 illustrates a first example of the execution timing. The first example of the execution timing is an example which produces no overlap between execution periods of AI image processing performed by the AI image processing unit 44 and an A/D conversion process performed by the analog circuit unit 41b. That is, the A/D conversion process and the AI image processing are executed in a time-division manner and completed in a frame period Tf for forming one frame image.

Specifically, such processes as development by the ISP 42b are performed in a period substantially simultaneous with A/D conversion. In this manner, an input tensor for an AI model is generated.

After completion of the development process, AI image processing is executed by the AI image processing unit 44. After completion of the AI image processing, an inference result is output from the AI model as an output tensor. The development process is completed after completion of the A/D conversion process. Accordingly, AI image processing is obviously executed after completion of the A/D conversion process.

Each of the first and second examples of the AI image processing described above is an example which performs one type of AI image processing by using one AI model. Accordingly, AI image processing is relatively easily achieved in the intervals between the respective processes of the A/D conversion.

The configuration producing no overlap in execution timing between the A/D conversion process and the inference process based on the AI model can eliminate the possibility that electromagnetic noise generated during execution of the inference process by the AI image processing unit 44 affects a result of the A/D conversion.

Figure 26:
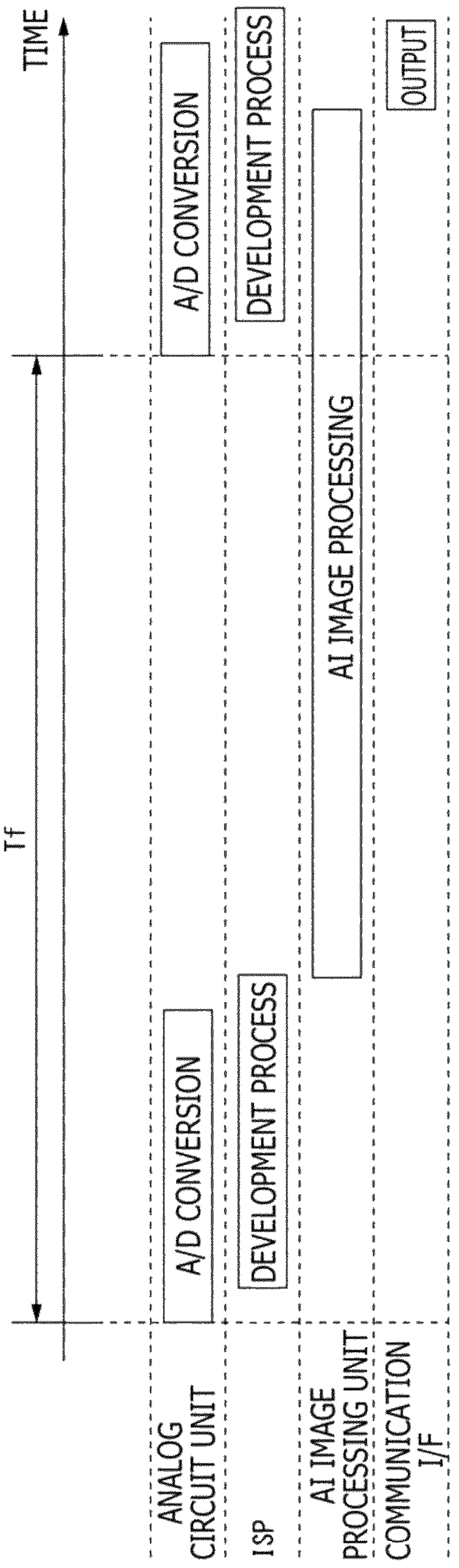
FIG. 26 is a diagram illustrating a second example of execution timing of respective processes.

Subsequently, FIG. 26 illustrates a second example of the execution timing. Each of the timing of the A/D conversion processing performed by the analog circuit unit 41b and the timing of the development process performed by the ISP 42b is similar to the corresponding execution timing in the first example. However, the processing timing of the AI image processing unit 44 is different from the corresponding execution timing in the first example.

Specifically, the total execution period of the A/D conversion process performed by the analog circuit unit 41b and the AI image processing performed by the AI image processing unit 44 has a length exceeding the length of the frame period Tf. In other words, the execution period of the AI image processing performed by the AI image processing unit 44 partially overlaps the execution period of the A/D conversion process.

For example, because multiple types of AI image processing are executed in the third example, the fourth example, and fifth example, a long processing period of time is often required for completing AI image processing. Accordingly, in a case where the calculation volume is large, the execution periods of the A/D conversion process and the AI image processing partially overlap each other in inevitable cases.

Note that the A/D conversion process is performed concurrently with execution of the AI image processing. Accordingly, electromagnetic noise generated during execution of the inference process performed by the AI image processing unit 44 is considered to affect a processing result of the A/D conversion process.

Accordingly, a noise reduction function may be executed by the processing unit, such as the ISP 42b and the CVDSP 42c, for digital data obtained after execution of the A/D conversion process performed during execution of AI image processing by the AI image processing unit 44, to reduce image quality deterioration caused by electromagnetic noise.

Figure 27:
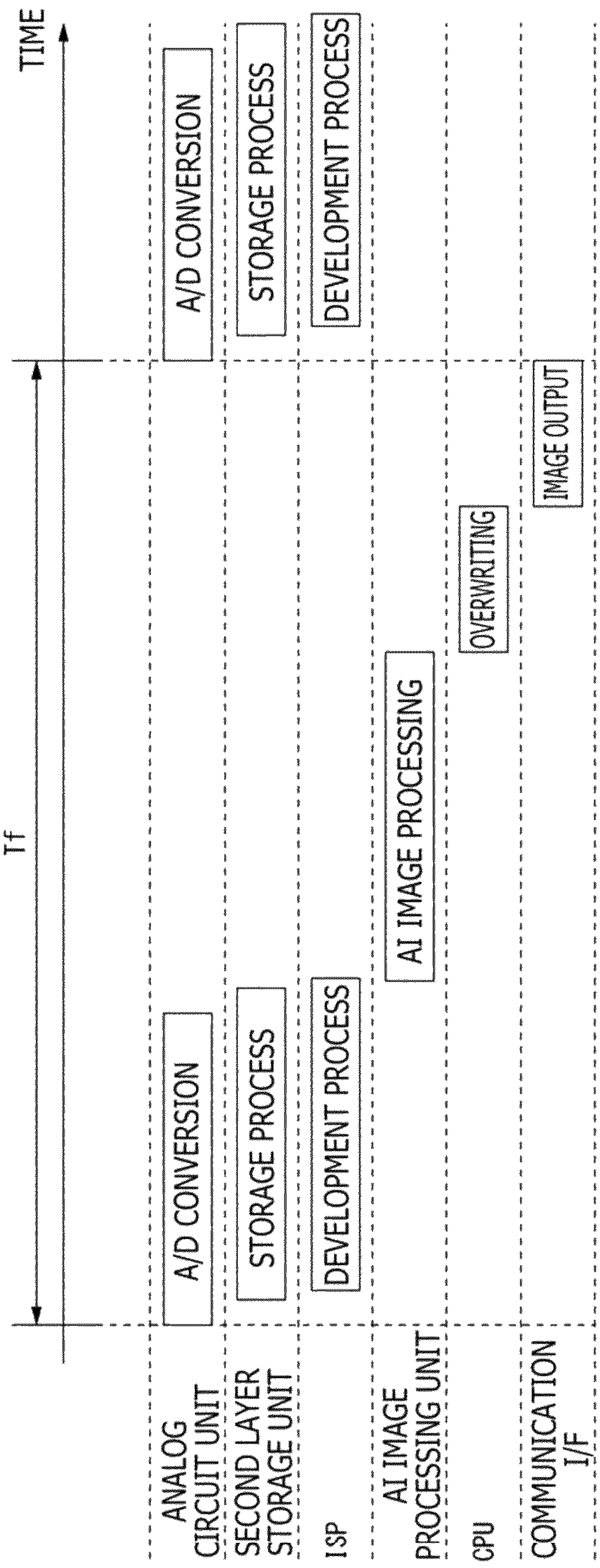
FIG. 27 is a diagram illustrating a third example of execution timing of respective processes.

Finally, FIG. 27 illustrates a third example of the execution timing. As with the first example of the execution timing, no overlap is produced between the execution period of the A/D conversion process by the analog circuit unit 41*b* and the execution period of the AI image processing by the AI image processing unit 44. Moreover, no overlap is produced between the execution period of the A/D conversion process and the execution periods of the memory overwriting process performed by the CPU 43*a* after the AI image processing and the image output process performed by the communication I/F 46.

In this case, the number of processes performed concurrently with the A/D conversion processing decreases. Accordingly, effects of electromagnetic noise on the processing result of A/D conversion are avoidable.

10. Configuration for Privacy Protection

Described in the above examples has been the case which applies a mask process to an image region containing a captured image of a person for privacy protection (hereinafter referred to as a "privacy mask process").

Described herein will be an example of a configuration of the image sensor IS for prohibiting output of an image for which privacy protection is not guaranteed to the outside of the image sensor IS.

Figure 28:
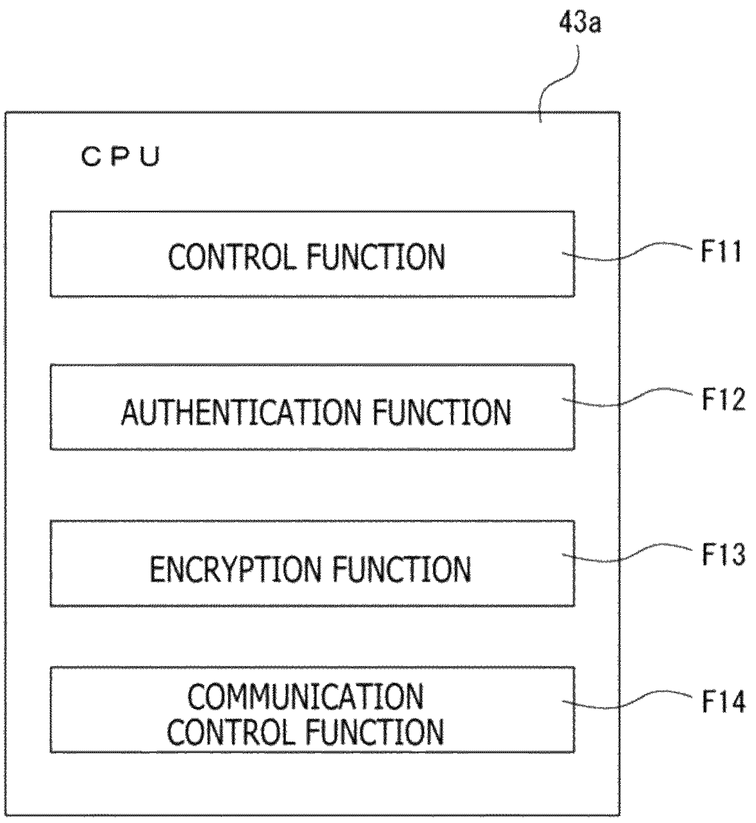
FIG. 28 is another example of the function block diagram of the CPU included in the image sensor.

As illustrated in FIG. 28, the CPU 43*a* that corresponds to the in-sensor control unit 43 and that is provided on the die D3 forming the third layer in the image sensor IS includes a communication control function F14 in addition to the control function F11, the authentication function F12, and the encryption function F13.

The same description is not repeated for the control function F11, the authentication function F12, and the encryption function F13 described above.

For example, the communication control function F14 controls an antenna provided outside the image sensor IS, to perform communication control during transmission of captured image data, meta data as inference results, and the like from the cameras 3 to another device.

For example, communication with another device achieved by the communication control function F14 is communication by LPWA (Low Power Wide Area) such as SIGFOX and LTE-M (Long Term Evolution Machine).

For example, only image data considering privacy is allowed to be output as a result of the privacy mask process for masking a part of image data transmitted from the image sensor IS. Specifically, a leak of personal information is avoidable by applying the privacy mask process to an image region containing a person in an image.

Note that not only image data that is obtained by the image sensor IS as an inference result and that corresponds to an output tensor, but also image data input to the AI model as an input tensor is transmitted to the outside of the image sensor IS or the outside of the cameras 3 in some cases. This transmission is carried out so as to check operation of the image sensor IS, for example. Accordingly, the image sensor IS is considered to transmit various types of image data to the outside. However, the AI image processing unit 44 provided within the image sensor IS for applying the privacy mask process can achieve firm privacy protection.

Moreover, in the configuration including the communication control unit within the image sensor IS for controlling transmission of data to the outside of the cameras 3, protection of transmission programs from falsification and prevention of data transmission under a malicious program are achievable. Accordingly, improvement in security is realizable.

10-1. Configuration Example 1 of Image Sensor

Figure 29:
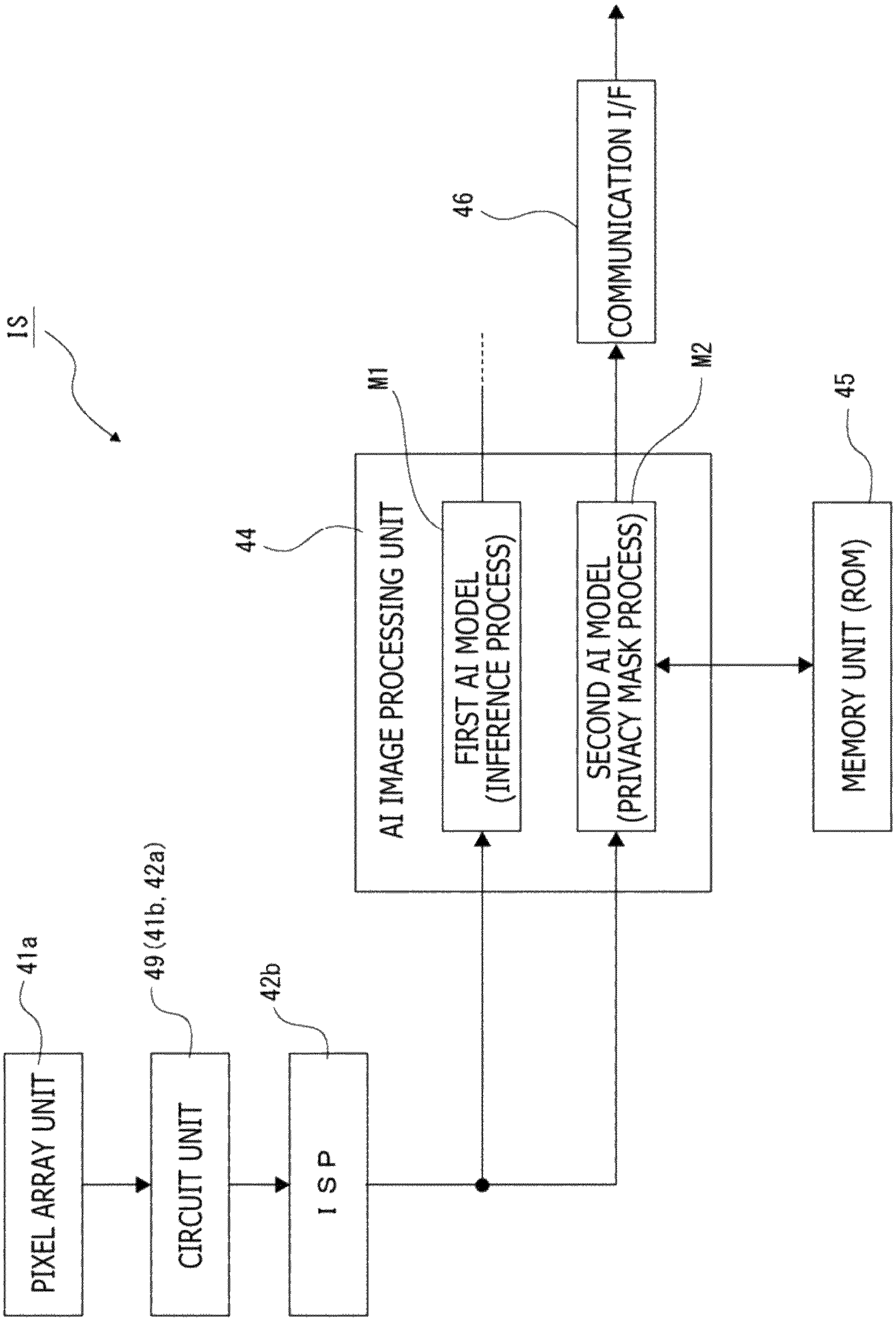
FIG. 29 is a diagram illustrating configuration example 1 of a functional configuration of the image sensor performing a privacy mask process.

FIG. 29 illustrates configuration example 1 of the image sensor IS. Note that FIG. 29 illustrates only a part associated with the privacy mask process in the respective components included in the image sensor IS.

The image sensor IS includes the pixel array unit 41*a*, a circuit unit 49, the ISP 42*b*, the AI image processing unit 44, the memory unit 45, and the communication I/F 46 as the part associated with the privacy mask process.

The same explanation is not repeated for the configuration of the pixel array unit 41*a* similar to the corresponding component in the respective examples described above.

The circuit unit 49 includes the analog circuit unit 41*b* and the logic circuit unit 42*a* described above. However, the circuit unit 49 may include only the analog circuit unit 41*b* or may include both the analog circuit unit 41*b* and the logic circuit unit 42*a*.

The ISP 42*b* performs a process for generating image data as an input tensor for an AI model constructed in the AI image processing unit 44.

The AI image processing unit 44 is capable of executing first AI image processing based on a first AI model M1 and second AI image processing based on a second AI model M2.

The first AI image processing and the second AI image processing may be executable simultaneously or executable in a time-division manner by switching the AI models.

According to the present example, the AI image processing unit 44 is capable of executing the first AI image processing as the inference process by using the first AI model M1 and the second AI image processing as the privacy mask process by using the second AI model M2. Note that the first AI image processing may be a process for detecting a person, a process for detecting a subject other than a person, a process for detecting a feature value of a specific subject, a process for achieving character recognition, or a deterioration correction process and a clarification process for images.

Various destinations, such as a third AI model M3 and the CVDSP 42*c* described above, are adoptable as output destinations of the output tensor from the first AI model M1. Accordingly, these destinations are not illustrated in the figure.

The input tensor for the first AI model M1 is designated as an input tensor for the second AI model M2 achieving the privacy mask process. Moreover, an output tensor from the second AI model M2 is image data to which the privacy mask process has been applied.

That is, for the second AI model M2, both a process for identifying an image region containing a person in an image and a process for masking the identified region are performed as the privacy mask process.

The memory unit 45 includes a ROM and a RAM. According to the present example, the ROM of the memory unit 45 is selectively described. Weighting factors, parameters, and the like for achieving the function as the second AI model M2 are stored in the ROM as the memory unit 45. In other words, various numerical values stored in the memory unit 45 for enabling the function of the second AI model M2 are not rewritable.

Accordingly, such a dishonest act which causes an inappropriate privacy mask process different from the normal process as a result of falsification of a program or which prevents execution of the privacy mask process itself can be made difficult to conduct.

Note that it is preferable that the ROM that is included in the memory unit 45 and that stores various parameters of the second AI model M2 be provided on the die D3 forming the third layer where the AI image processing unit 44 functioning as the second AI model M2 is provided.

This configuration swiftly achieves switching to the second AI image processing using the second AI model M2.

The communication I/F 46 is capable of outputting only privacy-protected image data to the outside of the image sensor IS, on receipt of input of an output tensor to which the privacy mask process has been applied on the basis of the second AI model M2.

The flow of the process performed by the AI image processing unit 44 on the basis of the second AI model M2 so as to achieve the privacy mask process has been described above. Accordingly, the same explanation is not repeated.

Note that, as can be understood from FIG. 29, the image sensor IS includes a configuration for outputting an image from the communication I/F 46 as an input tensor for the first AI model M1.

Such a configuration is provided to allow evaluation of the first AI model M1 and operation checking by the image sensor IS. The user is therefore allowed to determine whether or not the inference process is normally functioning, by checking both the input tensor and the output tensor for the first AI model M1.

In addition, such a configuration prevents transmission of image data other than privacy-protected data to the outside by performing the privacy mask process using the second AI model M2 before outputting the corresponding input tensor to the outside of the image sensor IS. Accordingly, the configuration of the image sensor IS illustrated in FIG. 29 is considered to be an appropriate configuration for achieving debugging of AI models.

Further, the inference process and the like can be appropriately performed by designating image data to which the privacy mask process is not applied as the input tensor for the first AI model M1.

10-2. Configuration Example 2 of Image Sensor

Figure 30:
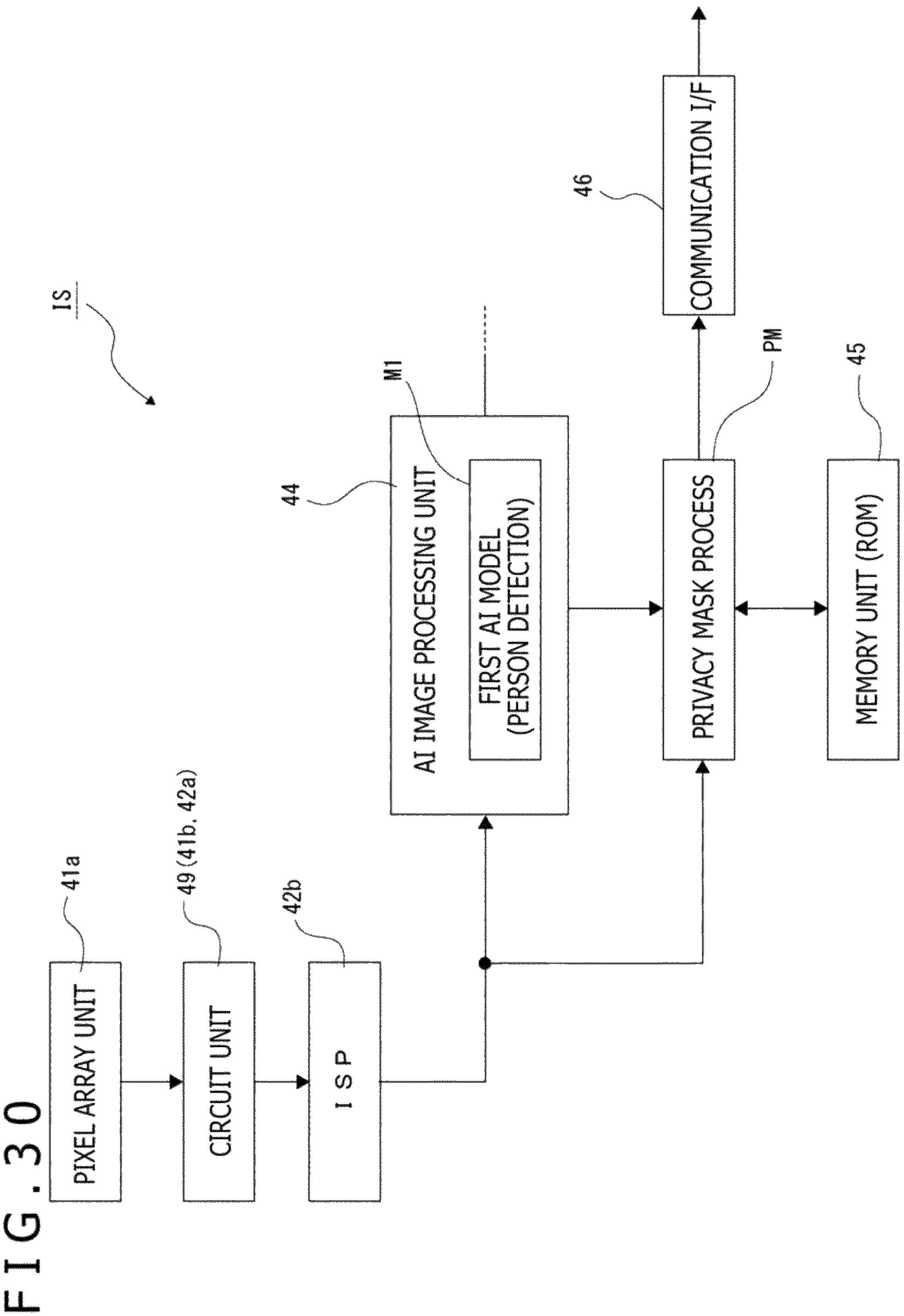
FIG. 30 is a diagram illustrating configuration example 2 of the functional configuration of the image sensor performing a privacy mask process.

FIG. 30 illustrates configuration example 2 of the image sensor IS. Note that FIG. 30 illustrates only a part associated with the privacy mask process in the respective components included in the image sensor IS.

The image sensor IS includes the pixel array unit 41*a*, the circuit unit 49, the ISP 42*b*, the AI image processing unit 44, a privacy mask processing unit PM, the memory unit 45, and the communication I/F 46 as the part associated with the privacy mask process.

The same explanation is not repeated for the configurations of the pixel array unit 41*a* and the circuit unit 49 similar to the corresponding components in configuration example 1 described above.

The ISP 42*b* performs a process for generating image data as an input tensor for the first AI model M1 constructed in the AI image processing unit 44. Moreover, image data corresponding to this input tensor is also input to the privacy mask processing unit PM.

The AI image processing unit 44 performs an inference process for detection of a person or the like by using the first AI model M1 and outputs a result of this inference to the privacy mask processing unit PM as an output tensor.

The privacy mask processing unit PM receives the image data as the input tensor for the first AI model M1 and the detection result as the output tensor from the first AI model M1 from the ISP 42*b* and performs a privacy mask process for masking an image region containing a detected person.

The privacy mask processing unit PM in the present example achieves the privacy mask process not by AI image processing using an AI model but by processing using the CPU 43*a* or a memory controller, for example. Specifically, for example, the privacy mask processing unit PM performs a process for overwriting a pixel value in a predetermined image region of the input tensor stored in the second layer storage unit 45*a* with a predetermined value.

As described above, the ROM is selectively indicated in the memory unit 45 illustrated in FIG. 30 in the components of the RAM and the ROM. This ROM stores a program executed by the privacy mask processing unit PM. Accordingly, the predetermined privacy mask process can reliably be executed.

Figure 31:
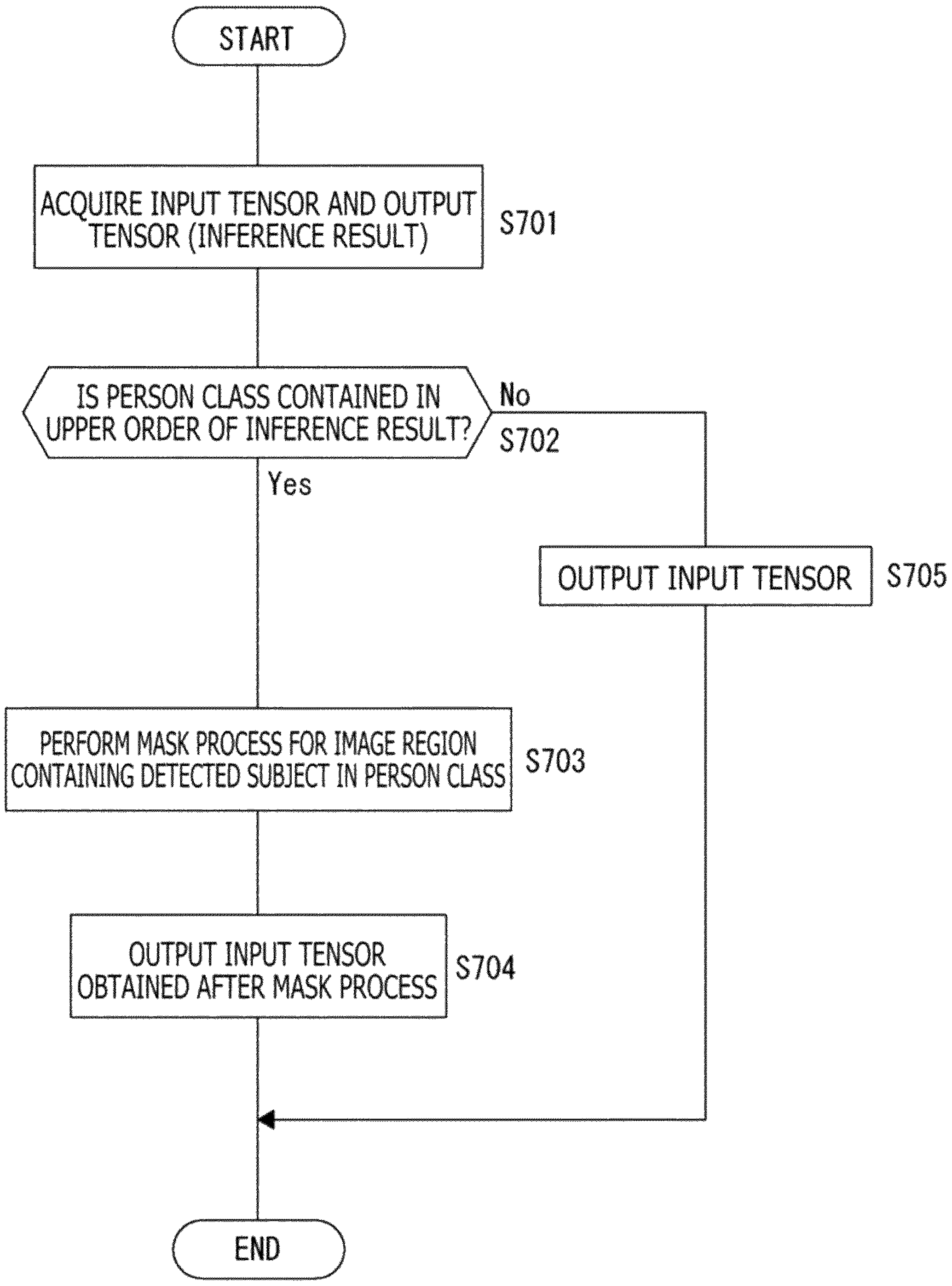
FIG. 31 is a flowchart illustrating a process executed by the image sensor for the privacy mask process.

FIG. 31 illustrates an example of a flow of processing executed by the privacy mask processing unit PM according to the present example.

In step S701, the privacy mask processing unit PM acquires an input tensor and an output tensor for the first AI model M1.

In subsequent step S702, the privacy mask processing unit PM determines whether or not a person class is contained in an upper order of an inference result. Thereafter, in a case of determination that the person class is contained, the privacy mask processing unit PM performs in step S703 the privacy mask process for an image region where a subject classified into the person class has been detected.

For example, in a case where the privacy mask process is to be performed in a situation that the person class is contained in an uppermost order in the inference result, only a subject highly likely to be a person is designated as a target for the privacy mask process.

Moreover, in a case where the privacy mask process is to be performed in a situation that the person class is contained up to an upper fifth order in the inference result, a subject less likely to be a person is also designated as a target for the privacy mask process. In this case, privacy is firmly protected.

After completion of the privacy mask process, the privacy mask processing unit PM outputs in step S704 the input tensor obtained after the mask process to the communication I/F 46.

Meanwhile, in a case of determination that no person class is contained in the upper order of the inference result in step S702, the privacy mask processing unit PM outputs the image data corresponding to the acquired input tensor to the communication I/F 46 without change in step S705.

10-3. Configuration Example 3 of Image Sensor

Figure 32:
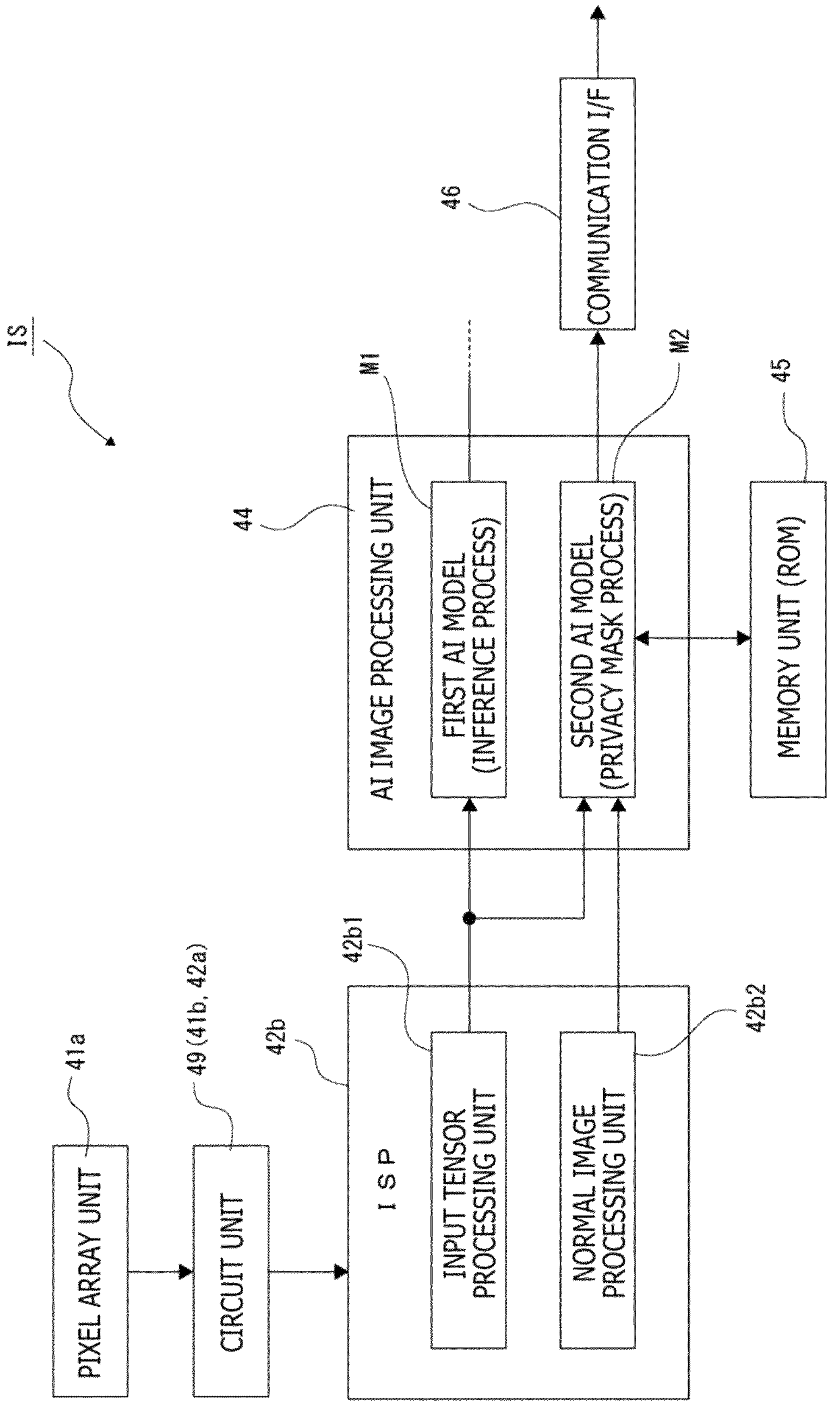
FIG. 32 is a diagram illustrating configuration example 2 of the functional configuration of the image sensor performing a privacy mask process.

FIG. 32 illustrates configuration example 3 of the image sensor IS. Note that FIG. 32 illustrates only a part associated with the privacy mask process in the respective components included in the image sensor IS.

The image sensor IS includes the pixel array unit 41*a*, the circuit unit 49, the ISP 42*b*, the AI image processing unit 44, the memory unit 45, and the communication I/F 46 as the part associated with the privacy mask process.

The same explanation is not repeated for the configurations of the pixel array unit 41*a* and the circuit unit 49 similar to the corresponding components in configuration example 1 described above.

The ISP 42*b* includes an input tensor processing unit 41*b*1 that performs such processing as a development process and a CV process for input tensors and a normal image processing unit 41*b*2 that performs such processing as a CV process for normal images (e.g., high resolution images). The normal images are such images as through images displayed on display units of the cameras 3 and images recorded in the memory unit 45 for appreciation.

The input tensor processing unit 41*b*1 performs a process for generating image data corresponding to an input tensor for an AI model constructed by the AI image processing unit 44.

The normal image processing unit 41*b*2 performs a process for generating image data for recording, by performing such processing as the synchronization process, the YC generation process, the resolution conversion process, the codec process, and the noise removal process described above.

The AI image processing unit 44 is capable of executing first AI image processing (inference process) based on the first AI model M1 and second AI image processing (privacy mask process) based on the second AI model M2.

The input tensor generated by the input tensor processing unit 41*b*1 is input to the first AI model M1. An output tensor from the first AI model M1 can be output to the respective components and therefore is not illustrated in the figure.

The input tensor for the first AI model M1 and the image data generated by the normal image processing unit 41*b*2 can be input to the second AI model M2 as input tensors. The second AI model M2 performs a privacy mask process for identifying an image region containing a person in each of the input tensors and masking the identified image region. An output tensor from the second AI model M2 is supplied to the communication I/F 46 as privacy-protected image data and output to the outside of the image sensor IS.

As described above, the ROM is selectively indicated in the memory unit 45 illustrated in FIG. 32 in the components of the RAM and the ROM. This ROM stores various parameters such as weighting factors required by the AI image processing unit 44 to function as the second AI model M2.

The flow of the process performed by the AI image processing unit 44 on the basis of the second AI model M2 so as to achieve the privacy mask process has been described with reference to FIG. 31. Accordingly, the same explanation is not repeated.

11. Modifications

Figure 33:
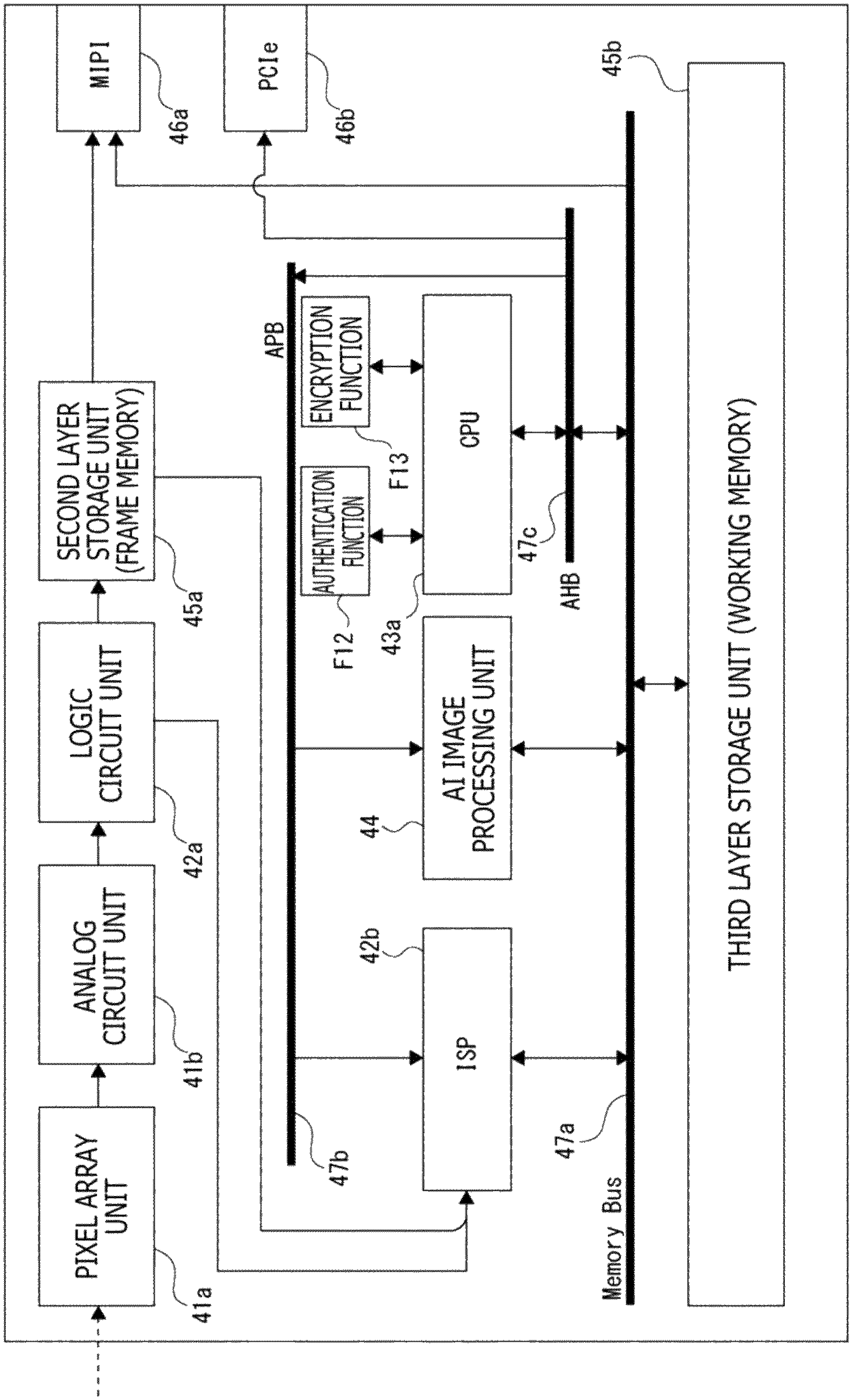
FIG. 33 is a function block diagram illustrating a modification of the configuration of the image sensor.

FIG. 33 illustrates modifications of the configuration of the image sensor IS illustrated in FIG. 7.

The image sensor IS includes the pixel array unit 41*a*, the analog circuit unit 41*b*, the logic circuit unit 42*a*, the second layer storage unit 45*a* functioning as a frame memory, the ISP 42*b*, the AI image processing unit 44, the CPU 43*a*, the third layer storage unit 45*b* functioning as a working memory, a communication I/F 46*a* for MIPI ("MIPI" in the figure), and a communication I/F 46*b* for PCIe (Peripheral Component Interconnect Express) ("PCIe" in the figure).

In the example illustrated in FIG. 9, the authentication function F12 and the encryption function F13 are provided as functions of the CPU 43*a*. According to the present modification, however, the authentication function F12 and the encryption function F13 are provided separately from the CPU 43*a*. In addition, the authentication function F12 and the encryption function F13 execute the authentication process, the encryption process, and the decoding process described above as necessary in accordance with an instruction from the CPU 43*a*.

Note that a certificate to be used for the authentication process, an encryption key to be used for the encryption process, and a decoding key to be used for the decoding process may be stored in the third layer storage unit 45*b*. Alternatively, the authentication function F12 and the encryption function F13 may be stored in an accessible dedicated storage unit.

According to the present modification, multiple buses 47 are provided unlike in the example illustrated in FIG. 7. Specifically, a first bus is a memory bus 47*a* to which the ISP 42*b*, the AI image processing unit 44, the CPU 43*a*, the third layer storage unit 45*b*, and the MIPI communication I/F 46*a* are connected. The memory bus 47*a* is chiefly used to allow the ISP 42*b*, the AI image processing unit 44, and the CPU 43*a* to access the third layer storage unit 45*b* functioning as a working memory.

Moreover, the memory bus 47*a* is used for outputting MIPI-standard image data to the outside of the image sensor IS.

A second bus is an APB (Advanced Peripheral Bus) 47*b* corresponding to a low-speed bus to which the ISP 42*b*, the AI image processing unit 44, and the CPU 43*a* are connected. The APB 47*b* is chiefly used for transmitting a command from the CPU 43*a* to the ISP 42*b* and the AI image processing unit 44.

A third bus is a high-speed AHB (Advanced High-Performance Bus) 47*c* to which the PCIe communication I/F 46*b* and the CPU 43*a* are connected. The AHB 47*c* is used at the time of output of label information corresponding to a recognition result.

The MIPI communication I/F 46*a* is an I/F chiefly used for transmitting image data. Specifically, the MIPI communication I/F 46*a* is an I/F for outputting frame images stored in the second layer storage unit 45*a* functioning as a frame memory and images to which various types of processing have been applied by the ISP 42*b* and the AI image processing unit 44.

The PCIe communication I/F 46*b* is an I/F chiefly used for transmitting and receiving information other than image data. Specifically, the PCIe communication I/F 46*b* is used at the time of output of label information and the like as a recognition result of an inference process.

Note that the communication I/F 46*b* is also available as an I/F to which a test image is input at the time of use of this test image as an input tensor. In this case, AI image processing is achievable by using not only images obtained according to a light receiving action by the pixel array unit 41*a* but also images input from the outside of the image sensor IS as test images. Accordingly, verification and the like of AI models are achievable.

Moreover, power consumption can be reduced by using the PCIe communication I/F 46*b* instead of the MIPI communication I/F 46*a*.

The PCIe communication I/F 46*b* is available at the time of deployment of an AI model (weighting factors and various parameters) within the image sensor IS. In addition, at the time of this deployment, setting information associated with the ISP 42*b* may be deployed in the image sensor IS together with the AI model so as to input appropriate input tensors for the AI model.

Note that the image sensor IS may include the CVDSP 42*c* in addition to the respective components illustrated in FIG. 33. Moreover, in the case where the CVDSP 42*c* is provided, setting information associated with the CVDSP 42*c* may be deployed in the image sensor IS along with deployment of the AI model.

When setting information associated with the ISP 42*b* and the CVDSP 42*c* is deployed in the image sensor IS along with deployment of the AI model, such processes as an image size change, a color coding change, and optimization of a process associated with luminance values of images according to a learning tendency of the AI model are achievable.

While the example of the image sensor IS having a three-layer structure has been described in each of the above examples, the image sensor IS may have a structure having four layers or more. For example, a layer for cutting off electromagnetic noise may be provided between the second layer and the third layer.

Note that each of the examples described above (particularly, the examples illustrated in FIGS. 23 and 24) has been such an example which performs a CV process after AI image processing and then performs further AI image processing after the CV process. Alternatively, the image sensor IS may execute a CV process after AI image processing or execute AI image processing after a CV process.

According to the configuration of the image sensor IS described above, the image sensor IS is capable of executing multiple types of AI image processing requiring a CV process, such as an example which executes first AI image processing, a CV process for a result of the first AI image processing, and then second AI image processing for a result of the CV process as an input tensor.

In the flow of processing in the example described with reference to FIGS. 21 to 24, the ISP 42*b* performs image processing for inputting images to the AI model (input tensor generation process). Alternatively, RAW data may be input to the AI model without change to execute AI image processing (inference process).

12. Deployment of AI Model and AI Application

An AI model, an AI application, and the like may be deployed in the cameras 3 by various methods. Described herein will be an example which uses a container technique as one of these methods.

Figure 34:
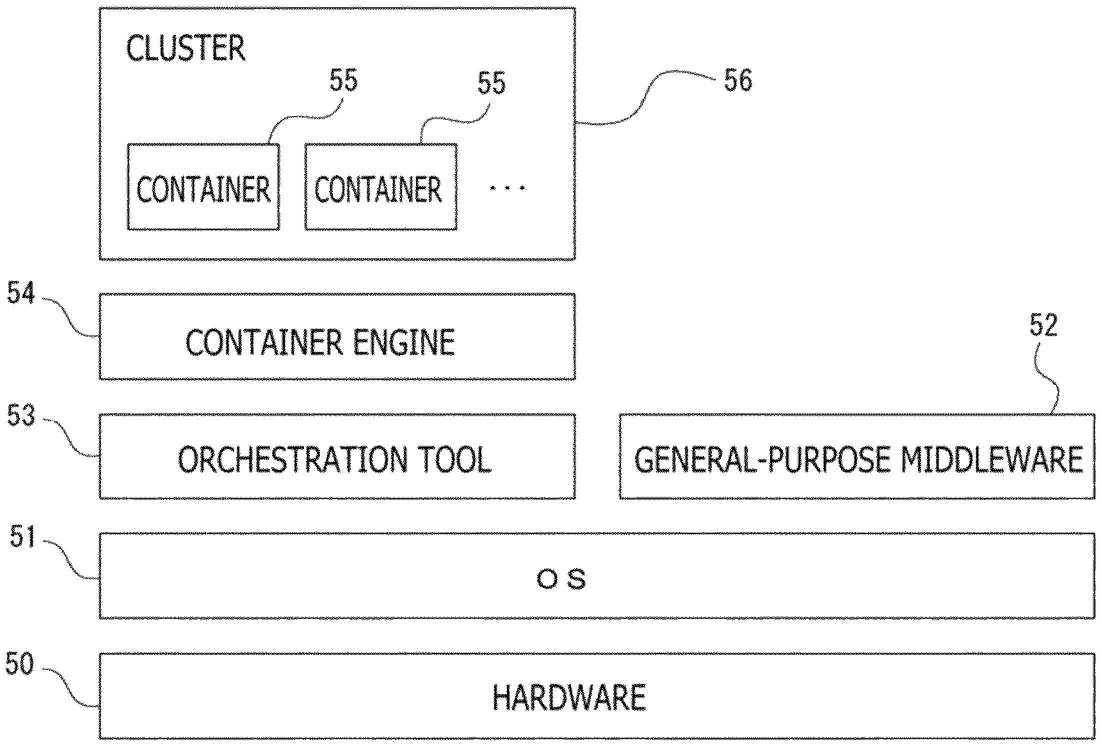
FIG. 34 is a block diagram illustrating a software configuration of the camera.

An operation system 51 is installed on various types of hardware 50 in each of the cameras 3, the hardware 50 including a CPU and a GPU (Graphics Processing Unit) functioning as the control unit 33 illustrated in FIG. 7, a ROM, a RAM, and the like (see FIG. 34).

The operation system 51 constitutes basic software which performs overall control of each of the cameras 3 to achieve various functions of the camera 3.

General-purpose middleware 52 is installed on the operation system 51.

For example, the general-purpose middleware 52 constitutes software for achieving basic operation such as a communication function which uses the communication unit 35 constituting the hardware 50 and a display function which uses a display unit (e.g., monitor) constituting the hardware 50.

An orchestration tool 53 and a container engine 54 are installed on the operation system 51 as well as the general-purpose middleware 52.

Each of the orchestration tool 53 and the container engine 54 constructs a cluster 56 corresponding to an operation environment of containers 55, to deploy and execute the containers 55.

Note that the edge runtime illustrated in FIG. 5 corresponds to the orchestration tool 53 and the container engine 54 illustrated in FIG. 34.

The orchestration tool 53 has a function of causing the container engine 54 to appropriately allocate resources of the hardware 50 and the operation system 51 described above. The respective containers 55 are grouped into predetermined units (pods described below) by the orchestration tool 53. The respective pods are deployed in worker nodes (described below) which are logically different areas.

The container engine 54 is one of the components of the middleware installed in the operation system 51 and constitutes an engine for operating the containers 55. Specifically, the container engine 54 has a function of allocating resources (memory, calculation ability, etc.) of the hardware 50 and the operation system 51 to the containers 55 on the basis of a setting file or the like included in the middleware within each of the containers 55.

Moreover, the resources allocated in the present embodiment include not only resources equipped in the camera 3, such as the control unit 33, but also resources equipped in the image sensor IS, such as the in-sensor control unit 43, the memory unit 45, and the communication I/F 46.

Each of the containers 55 includes an application for achieving predetermined functions and middleware such as a library.

Each of the containers 55 operates to achieve predetermined functions by using resources of the hardware 50 and the operation system 51 allocated by the container engine 54.

According to the present embodiment, each of the AI application and the AI model illustrated in FIG. 5 corresponds to one of the containers 55. Specifically, one of the various containers 55 deployed in the camera 3 achieves a predetermined AI image processing function using the AI application and the AI model.

A specific configuration example of the cluster 56 constructed using the container engine 54 and the orchestration tool 53 will be described with reference to FIG. 35. Note that the cluster 56 may be constructed not only by the hardware 50 included in one camera 3 but also by multiple devices such that a function is achieved by using resources of other hardware included in other devices.

The orchestration tool 53 manages an execution environment of the containers 55 for each worker node 57. Moreover, the orchestration tool 53 constitutes a master node 58 for managing the whole of the worker nodes 57.

The multiple pods 59 are deployed in each of the worker nodes 57. Each of the pods 59 contains one or multiple containers 55 and achieves a predetermined function. Each of the pods 59 is a management unit for managing the containers 55 by using the orchestration tool 53.

Operation of the pods 59 in each of the worker nodes 57 is controlled by a pod management library 60.

The pod management library 60 includes an agent controlled by a container runtime and the master node 58 for allowing the pods 59 to use resources of the hardware 50 logically allocated, a network proxy for communicating with different pods 59 and the master node 58, and other components.

That is, each of the pods 59 is capable of achieving predetermined functions using respective resources under the pod management library 60.

The master node 58 includes an application server 61 for deploying the pods 59, a manager 62 for managing a deployment situation of the containers 55 achieved by the application server 61, a scheduler 63 for determining the worker node 57 in which the containers 55 are arranged, and a data sharing unit 64 for sharing data.

Figure 35:
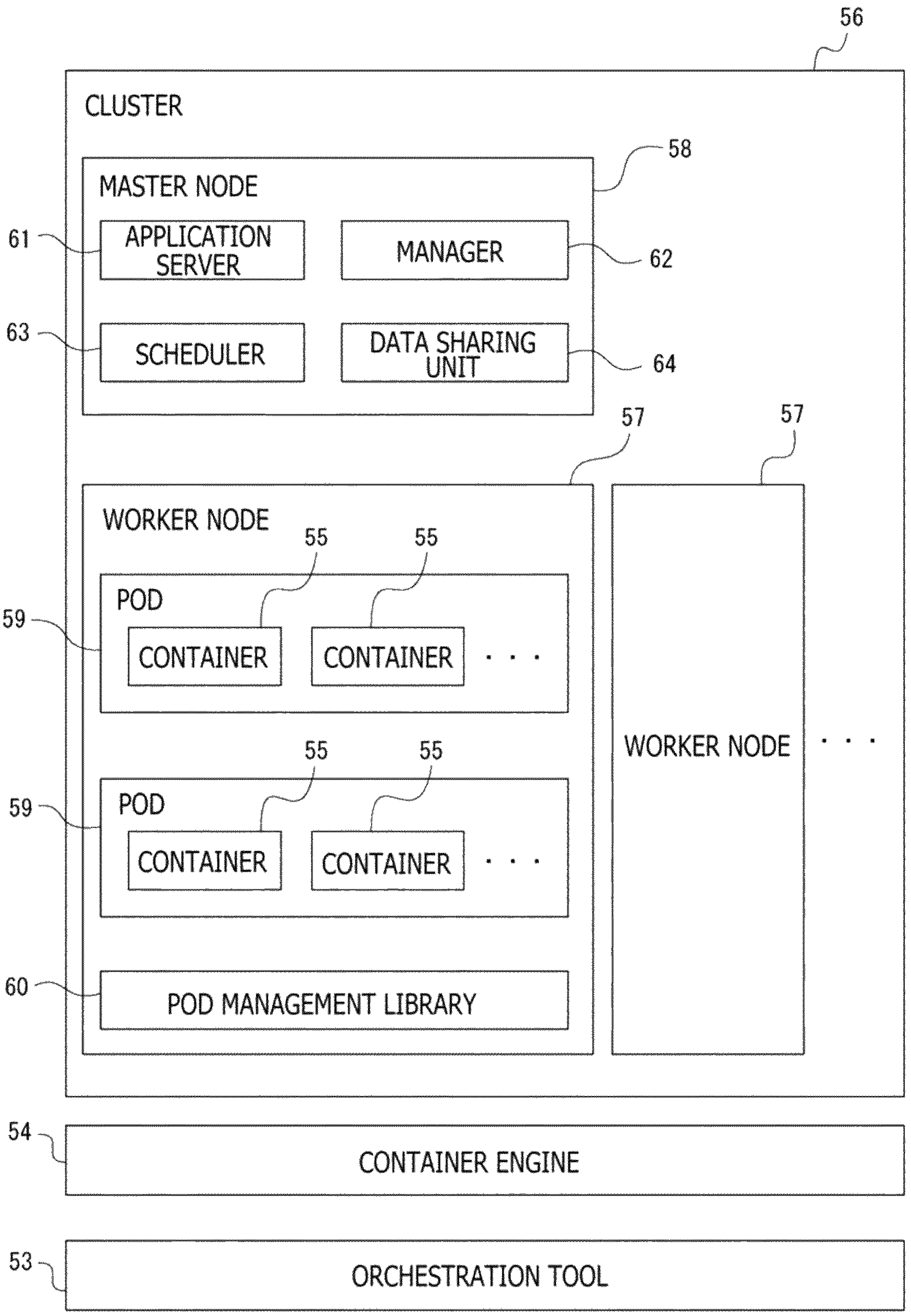
FIG. 35 is a block diagram illustrating an operation environment of containers in a case of using a container technique.

The AI application and the AI model described above can be deployed in the image sensor IS of the camera 3 on the basis of the container technique by using the configurations illustrated in FIGS. 34 and 35.

Note that, as described above, the AI model may be stored in the memory unit 45 within the image sensor IS via the communication I/F 46 illustrated in FIG. 7 to execute AI image processing within the image sensor IS, or the configurations illustrated in FIGS. 34 and 35 may be deployed in the memory unit 45 and the in-sensor control unit 43 within the image sensor IS to execute the AI application and the AI model described above within the image sensor IS on the basis of the container technique.

Moreover, as will be described below, the container technique can also be employed to deploy the AI application and/or the AI model in the fog server 4 or the cloud side information processing device.

In this case, information associated with the AI application and the AI model is deployed and executed as a container or the like in a memory, such as a non-volatile memory unit 74, a storage unit 79, or a RAM 73 described below and illustrated in FIG. 36.

13. Hardware Configuration of Information Processing Device

A hardware configuration of each of the information processing devices included in the information processing system 100, such as the cloud server 1, the user terminal 2, the fog server 4, and the management server 5, will be described with reference to FIG. 36.

The information processing device includes a CPU 71. The CPU 71 functions as an arithmetic processing unit that performs the various types of processing described above, and executes the various types of processing in accordance with a program stored in a ROM 72 or the non-volatile memory unit 74 such as an EEP-ROM (Electrically Erasable Programmable Read-Only Memory) or a program loaded from the storage unit 79 into the RAM 73. The RAM 73 also stores data necessary for the CPU 71 to execute the various types of processing, and others as necessary.

Note that the CPU 71 included in the information processing device functioning as the cloud server 1 functions as a license authorization unit, an account service providing unit, a device monitoring unit, a marketplace function providing unit, and a camera service providing unit to achieve the respective functions described above.

The CPU 71, the ROM 72, the RAM 73, and the non-volatile memory unit 74 are connected to each other via a bus 83. An input/output interface (I/F) 75 is also connected to the bus 83.

An input unit 76 including an operating element or an operation device is connected to the input/output interface 75.

For example, the input unit 76 is assumed to be any one of various operating elements or operating devices, such as a keyboard, a mouse, a key, a dial, a touch panel, a touch pad, and a remote controller.

Operation performed by the user is detected by the input unit 76, and a signal corresponding to the input operation is interpreted by the CPU 71.

Moreover, a display unit 77 including an LCD, an organic EL panel, or the like and an audio output unit 78 including a speaker or the like are connected to the input/output interface 75 as integrated bodies or separate components.

The display unit 77 is a display unit that presents various types of display, and includes a display device provided in a housing of a computer device, a separate display device connected to a computer device, or the like, for example.

The display unit 77 executes display of images for various types of image processing, video images as processing targets, and the like on a display screen in response to an instruction from the CPU 71. Moreover, the display unit 77 presents various operation menus, icons, messages, and the like, i.e., display as a GUI (Graphical User Interface) in accordance with an instruction from the CPU 71.

The storage unit 79 including a hard disk, a solid-state memory, or the like and a communication unit 80 including a modem or the like are connected to the input/output interface 75 in some cases.

The communication unit 80 performs communication processing via a transfer path such as the Internet and establishes wired/wireless communication with various devices, bus communication, or the like.

In addition, a drive 81 is connected to the input/output interface 75 if necessary, and a removable storage medium 82 such as a magnetic disk, an optical disk, a magneto-optical disk, or a semiconductor memory is attached as necessary.

Data files and the like of programs or others to be used for various processes can be read from the removable storage medium 82 by using the drive 81. The read data files are stored in the storage unit 79, or images and sounds contained in the data files are output from the display unit 77 and the audio output unit 78. Moreover, computer programs and the like read from the removable storage medium 82 are installed in the storage unit 79 as necessary.

According to this computer device, software for performing processing of the present embodiment can be installed via network communication achieved by the communication unit 80 or via the removable storage medium 82, for example. Alternatively, this software may be stored in the ROM 72, the storage unit 79, or the like beforehand.

In addition, images captured by the cameras 3 or a processing result of AI image processing may be received and stored in the storage unit 79 or the removable storage medium 82 via the drive 81.

Information processing and communication processing required for the cloud server 1, the user terminal 2, the fog server 4, and the management server 5, each functioning as the information processing device including the foregoing arithmetic processing unit, are executed by processing operation performed by the CPU 71 in accordance with various programs.

Figure 36:
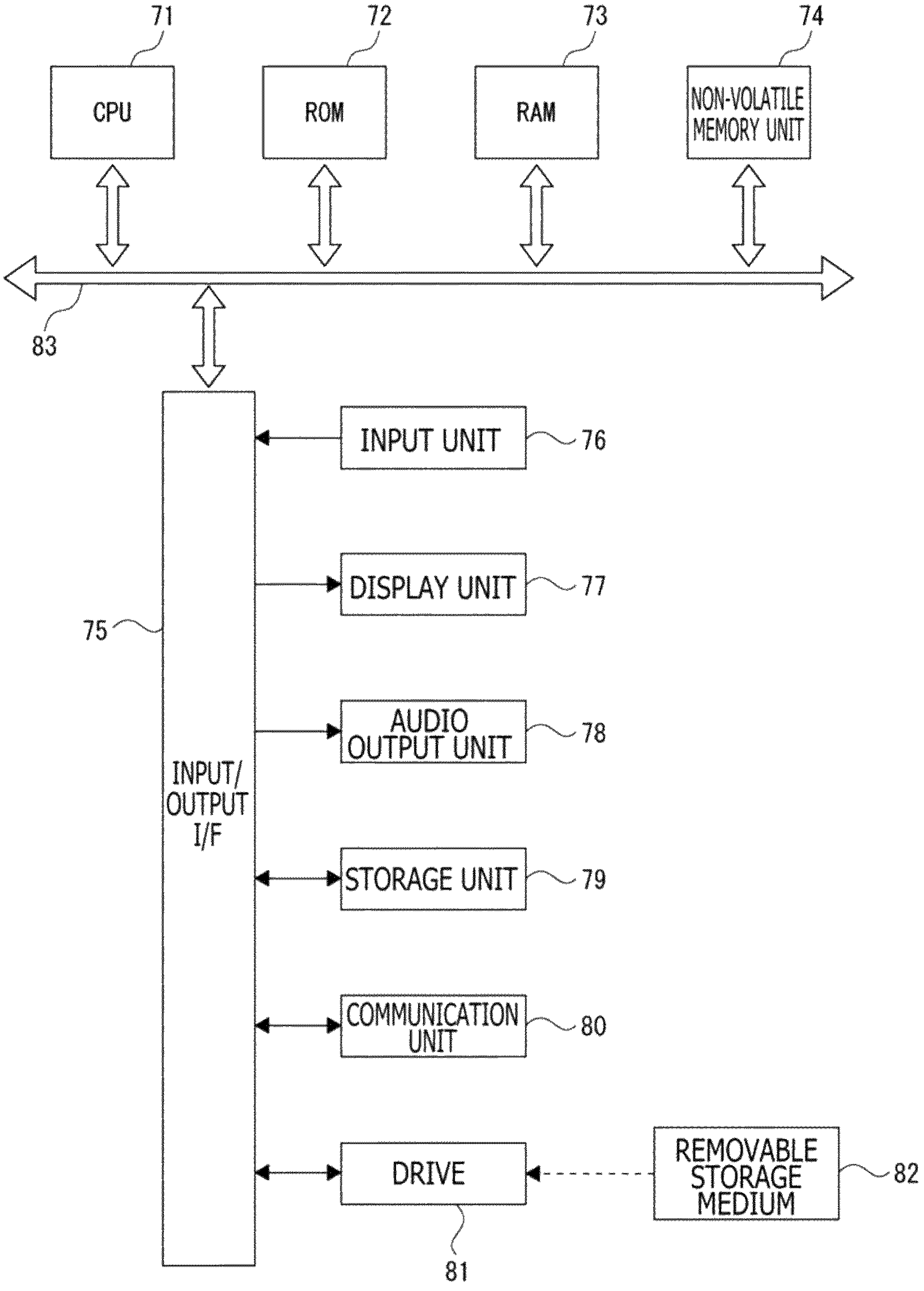
FIG. 36 is a block diagram illustrating an example of a hardware configuration of an information processing device.

Note that each of the cloud server 1, the user terminal 2, the fog server 4, and the management server 5 is not required to be constituted by a single computer device as the one illustrated in FIG. 36 and may include multiple computer devices constituting a system. The multiple computer devices may form a system by using a LAN (Local Area Network) or the like or may be disposed at remote areas and systematized via a VPN (Virtual Private Network) using the Internet or the like. The multiple computer devices may contain a computer device constituting a server group (cloud) available by a cloud computing service.

14. Others

Figure 37:
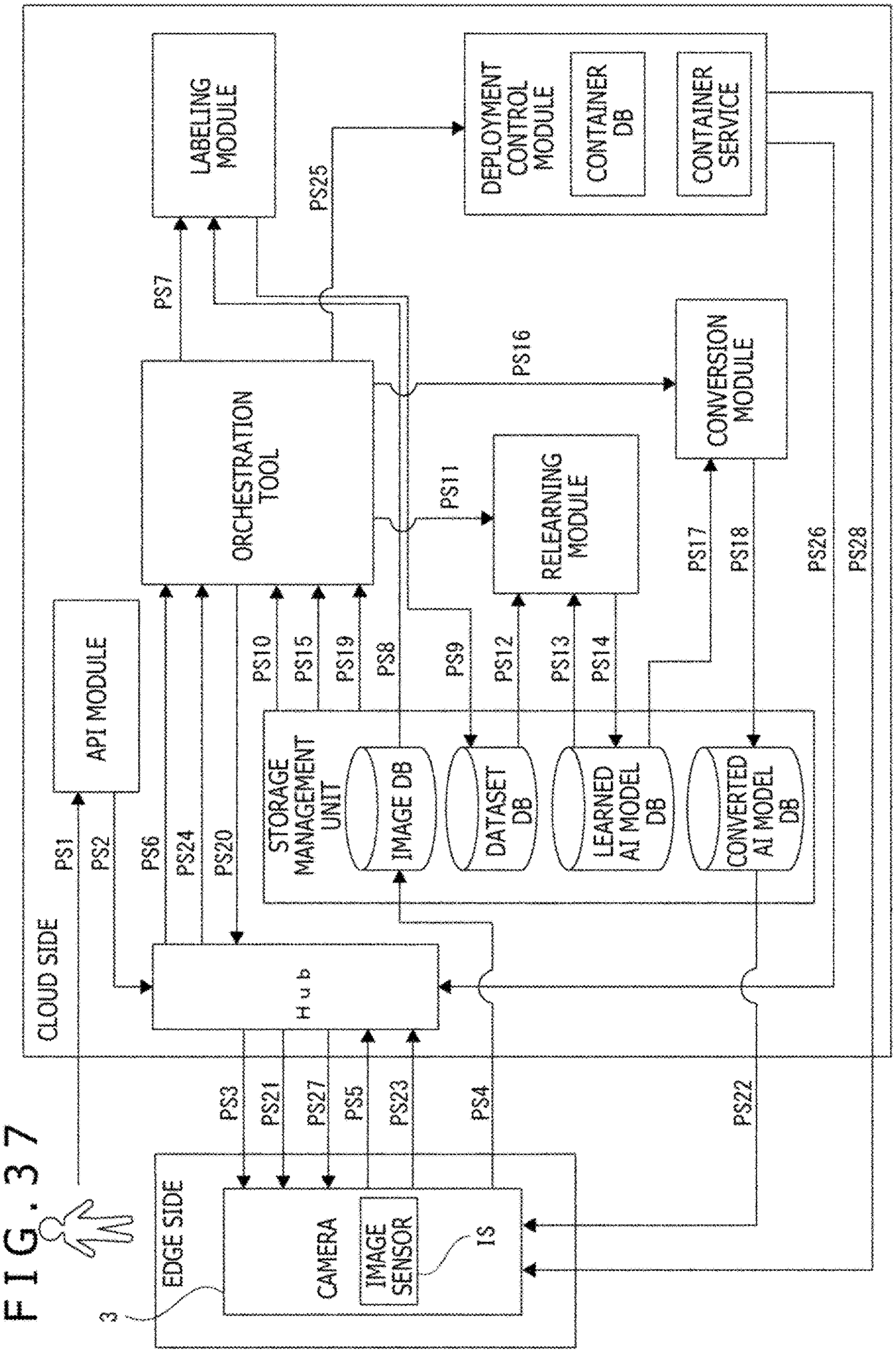
FIG. 37 is a diagram for explaining a flow of a process in another description.

Specifically described with reference to FIG. 24 will be a flow of a process performed at the time of relearning of an AI model, and update of an AI model deployed in the respective cameras 3 or the like (hereinafter referred to as an "edge side AI model") and an AI application in response to a trigger of operation from a service provider or a user after deployment of SW components of the AI application and the AI model as described above. Note that FIG. 37 is a figure focusing on one of the multiple cameras 3. In addition, for example, the edge side AI model corresponding to an update target in the following description is an AI model deployed in the image sensor IS included in the camera 3. Needless to say, the edge side AI model may be deployed outside the image sensor IS of the camera 3.

Initially, in processing step PS1, an AI model relearning instruction is issued from the service provider or the user. This instruction is given using an API (Application Programming Interface) function included in an API module equipped on the cloud side information processing device. Moreover, this instruction designates a volume of images (e.g., the number of images) to be used for learning. The volume of images to be used for learning will hereinafter be also referred to as the "predetermined number of images."

The API module receives this instruction and transmits a relearning request and information associated with the volume of images to a Hub (similar to the Hub illustrated in FIG. 5) in processing step PS2.

The Hub transmits an update notification and the information indicating the volume of images to the camera 3 corresponding to the edge side information processing device in processing step PS3.

The camera 3 transmits captured image data obtained by imaging to an image DB (Database) of a storage group in processing step PS4. The imaging process and the transmission process in this step are continued until a predetermined number of images necessary for relearning are obtained.

Note that the camera 3 having obtained an inference result by performing an inference process for the captured image data may store this inference result in the image DB as metadata of the captured image data in processing step PS4.

In the configuration where the inference result obtained by the camera 3 is stored in the image DB as metadata, data necessary for relearning of the AI model executed on the cloud side can carefully be selected from the image DB. Specifically, relearning is achievable by using only image data exhibiting a difference between the inference result obtained by the camera 3 and an inference result executed using a plenty of computer resources in the cloud side information processing device. Accordingly, reduction of a length of time required for relearning is achievable.

After completion of capturing the predetermined number of images and transmission, the camera 3 notifies the Hub of completion of transmission of the predetermined number of the captured image data in processing step PS5.

The Hub receives this notification and notifies the orchestration tool of completion of preparation of data for relearning in processing step PS6.

The orchestration tool transmits an instruction for execution of a labeling process to a labeling module in processing step PS7.

The labeling module acquires image data designated as a target of the labeling process from the image DB (processing step PS8) and performs the labeling process.

The labeling process herein may be a process for performing class identification described above, a process for estimating the gender or the age of a subject in an image and attaching a label, a process for estimating a pose of the subject and attaching a label, or a process for estimating a behavior of the subject and attaching a label.

The labeling process may be executed either manually or automatically. Moreover, the labeling process may be completed by the cloud side information processing device or may be achieved by utilizing a service provided by a different server device.

The labeling module having completed the labeling process stores information indicating a result of labeling in a dataset DB in processing step PS9. The information stored in the dataset DB herein may be a set of label information and image data or image ID (Identification) information for identifying image data instead of the image data itself.

A storage management unit having detected that the information indicating the result of labeling has been stored notifies the orchestration tool of this detection in processing step PS10.

The orchestration tool having received this notification confirms that the labeling process for the predetermined number of pieces of the image data has finished, and transmits a relearning instruction to a relearning module in processing step PS11.

The relearning module having received the relearning instruction acquires a dataset to be used for learning from the dataset DB in processing step PS12 and acquires an AI model corresponding to an update target from a learned AI model DB in processing step PS13.

The relearning module performs AI model relearning by using the acquired dataset and AI model. The AI model updated and thus obtained is again stored in the learned AI model DB in processing step PS14.

The storage management unit having detected that the updated AI model has been stored notifies the orchestration tool of this detection in processing step PS15.

The orchestration tool having received this notification transmits an AI model conversion instruction to a conversion module in processing step PS16.

The conversion module having received the conversion instruction acquires the updated AI model from the learned AI model DB in processing step PS17 and performs an AI model conversion process.

The conversion process is a process for conversion according to specification information and the like associated with the camera 3 as a device corresponding to a deployment destination. This process achieves downsizing with a lowest possible drop of performance of the AI model, necessary conversion of a file format for operation in the camera 3, and others.

The AI model converted by the conversion module is designated as the edge side AI model described above. The converted AI model is stored in a converted AI model DB in processing step PS18.

The storage management unit having detected that the converted AI model has been stored notifies the orchestration tool of this detection in processing step PS19.

The orchestration tool having received this notification transmits a notification for requesting execution of update of the AI model to the Hub in processing step PS20. This notification contains information for identifying the place where the AI model for update is stored.

The Hub having received the notification transmits an AI model update instruction to the camera 3. The update instruction also contains information for identifying the place where the AI model is stored.

The camera 3 performs a process for acquiring the targeted converted AI model from the converted AI model DB and deploying the acquired AI model in processing step PS22. In this manner, the AI model to be used by the image sensor IS of the camera 3 is updated.

The camera 3 after completion of update of the AI model by deployment of the AI model transmits an update completion notification to the Hub in processing step PS23.

The Hub having received the notification notifies the orchestration tool of completion of the AI model update process for the camera 3 in processing step PS24.

Note that, while described herein has been the example where the AI model is deployed and used within the image sensor IS of the camera 3 (e.g., memory unit 45 illustrated in FIG. 7), update of the AI model can similarly be carried out even in a case where the AI model is deployed and used outside the image sensor of the camera 3 (e.g., memory unit 34 in FIG. 7) or in a storage unit within the fog server 4.

In this case, the device (place) where the AI model is deployed is stored in the storage management unit or the like on the cloud side at the time of deployment of the corresponding AI model, and the Hub reads the device (place) where the AI model is deployed from the storage management unit, and transmits an AI model update instruction to the device where the AI model is deployed.

The device having received the update instruction performs a process for acquiring the targeted converted AI model from the converted AI model DB and deploying the acquired AI model in processing step PS22. In this manner, update of the AI model in the device having received the update instruction is achieved.

Note that, in a case where only update of the AI model is carried out, processing is completed by the foregoing steps.

In a case where an AI application using the AI model is updated in addition to the AI model, the following processing is further executed.

Specifically, the orchestration tool transmits an instruction for downloading an AI application such as updated firmware to a deployment control module in processing step PS25.

The deployment control module transmits an AI application deployment instruction to the Hub in processing step PS26. This instruction contains information for identifying the place where the updated AI application is stored.

The Hub transmits this deployment instruction to the camera 3 in processing step PS27.

The camera 3 downloads the updated AI application from a container DB of the deployment control module and deploys the AI application in processing step PS28.

Note that described above has been the example which sequentially performs update of the AI model that operates in the image sensor IS of the camera 3 and update of the AI application that operates outside the image sensor IS of the camera 3.

In addition, while the example of the AI application has been described herein for simplifying the explanation, the AI application is defined as a set of multiple SW components such as SW components B1, B2, B3, and up to Bn as described above. Accordingly, deployment destinations of the respective SW components are stored in the storage management unit on the cloud side at the time of deployment of the AI application, and the Hub reads the devices (places) as the deployment destinations of the respective SW components from the storage management unit and transmits a deployment instruction to each of the deployment destination devices at the time of processing of processing step PS27. Each of the devices having received the deployment instruction downloads the updated SW component from a container DB of the deployment control module and deploys the updated SW component in processing step PS28.

Note that the AI application referred to herein is an SW component other than the AI model.

Moreover, in a case where both the AI model and the AI application operate in one device, both the AI model and the AI application may collectively be updated as one container. In this case, update of the AI model and update of the AI application may be achieved not sequentially but simultaneously. In addition, this collective update is achievable by executing the respective steps of processing steps PS25, PS26, PS27, and PS28.

For example, in a case where both containers of the AI model and the AI application are allowed to be deployed in the image sensor IS of the camera 3, update of the AI model and the AI application is achievable by executing the respective steps of processing steps PS25, PS26, PS27, and PS28 as described above.

Relearning of the AI model based on captured image data captured in a use environment of the user is achievable by performing the processes described above. Accordingly, the edge side AI model capable of outputting a highly accurate recognition result in the use environment of the user can be produced.

Further, even if the imaging environment of the camera 3 changes, such as a case where a vehicle carrying the cameras 3 as in-vehicle cameras is traveling in a district different from previous district and a case where an amount of light entering an imaging device changes according to a change of the weather or time, relearning of the AI model is appropriately carried out for each of these occasions. Accordingly, recognition accuracy achievable by the AI model can be maintained without deterioration.

Note that the respective processes described above may be executed at the time of not only relearning of the AI model but also initial operation of the system under the use environment of the user.

15. Screen Example of Marketplace

An example of a screen presented to the user to indicate a marketplace will be described with reference to the respective figures.

Figure 38:
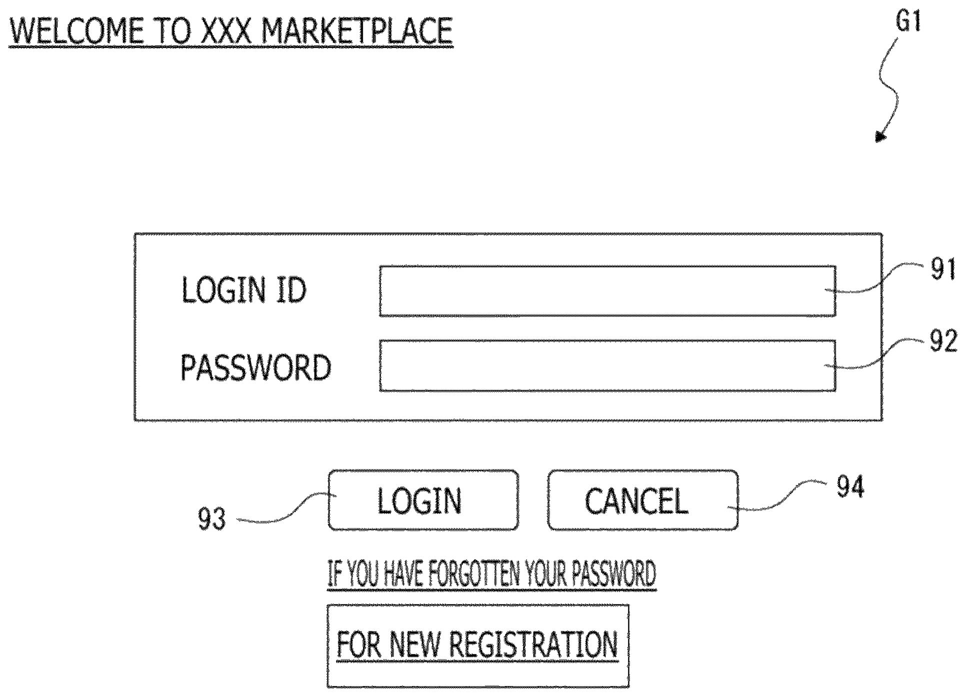
FIG. 38 is a diagram illustrating an example of a login screen for login to a marketplace.

FIG. 38 illustrates an example of a login screen G1.

The login screen G1 includes an ID input field 91 to which a user ID is input and a password input field 92 to which a password is input.

A login button 93 operated for login and a cancel button 94 operated to cancel login are disposed below the password input field 92.

In addition, further provided below the respective buttons are an operating element operated to shift to a page provided for a user who has forgotten the password, an operating element to shift to a page provided for new user registration, and the like as necessary.

With a press of the login button 93 after input of the correct user ID and password, each of the cloud server 1 and the user terminal 2 executes a process for shifting to a user-specific page.

Figure 39:
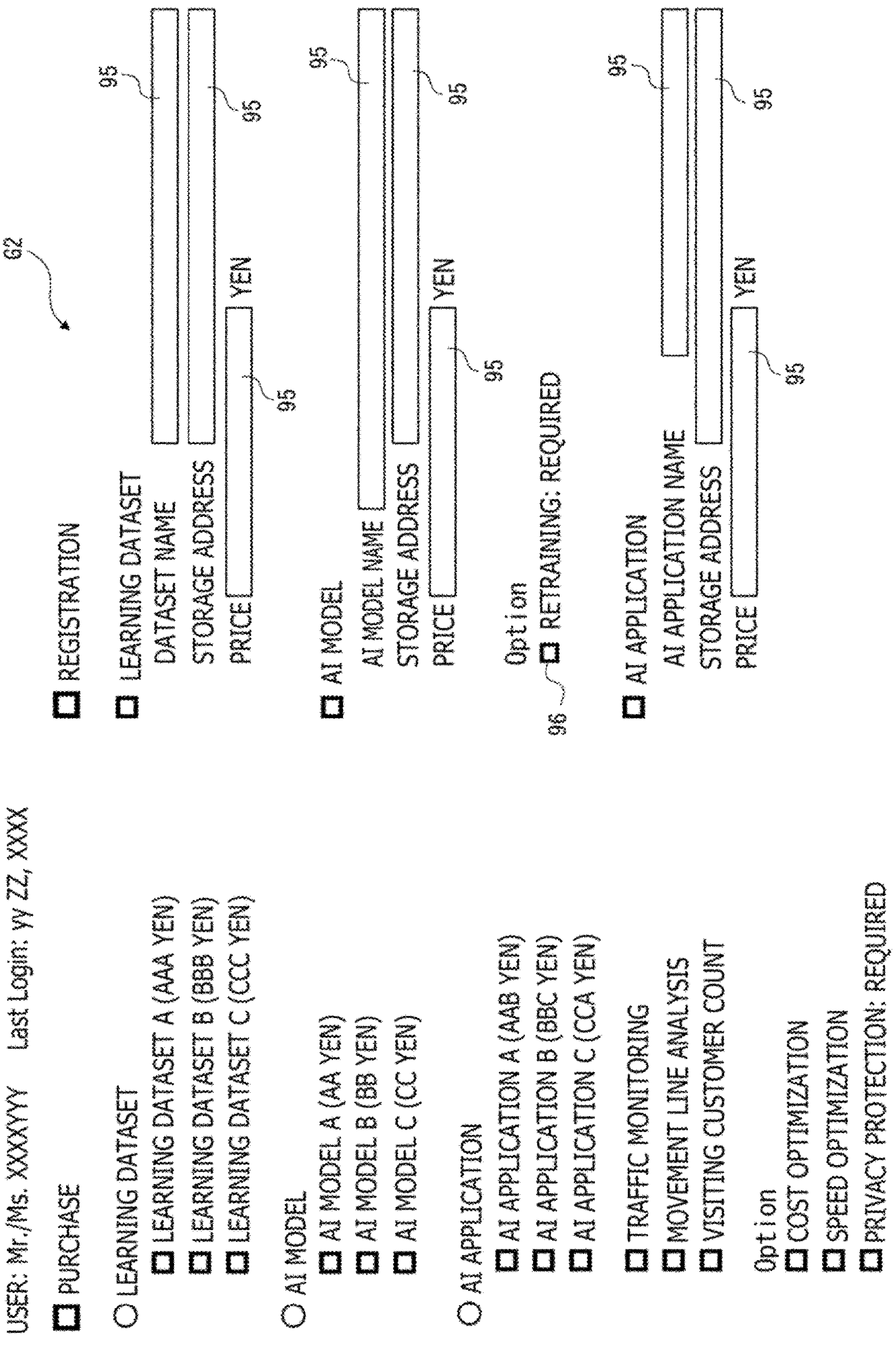
FIG. 39 is a diagram illustrating an example of a developer screen presented to respective developers using the marketplace.

For example, FIG. 39 illustrates an example of a screen presented to the AI application developer using the application developer terminal 2A and the AI model developer using the AI model developer terminal 2C.

Each of the developers is allowed to purchase a learning dataset, an AI model, and an AI application through the marketplace for the purpose of development. Moreover, each of the developers is allowed to register an AI application and an AI model developed by himself or herself in the marketplace.

Purchasable learning datasets, AI models, AI applications, and the like (hereinafter collectively referred to as "data") are displayed in a left part of a developer screen G2 illustrated in FIG. 39.

Note that, while not depicted in the figure, preparation of learning can be completed only by causing an image of learning datasets to be displayed on a display, drawing a frame surrounding only a desired portion of the image by using an input device such as a mouse, and inputting a name at the time of purchase of a learning dataset.

For example, for AI learning using an image of a cat, an image with an annotation of a cat added thereto can be prepared for AI learning by drawing a frame surrounding only a part of the cat in the image and inputting "cat" as text input.

Moreover, such a purpose as "traffic monitoring," "movement line analysis," and "visiting customer count" may be selectable for easy identification of desired data. That is, each of the cloud server 1 and the user terminal 2 executes a display process for displaying only data suited for the selected purpose.

Note that purchase prices of respective pieces of data may be displayed in the developer screen G2.

Further, input fields 95 for registration of learning datasets collected or created by the developer, and AI models and AI applications developed by the developer are provided in a right part of the developer screen G2.

The input field 95 to which a name or a data storage location is input is provided for each piece of the data. Moreover, a check box 96 for setting whether or not to execute retraining of the AI model is provided.

Note that price setting fields for setting prices required for purchasing the registration target data (indicated as input fields 95 in the figure) and other fields may be provided.

In addition, a user name, a final login date, and the like are displayed in an upper part of the developer screen G2 as a part of user information. Note that a volume of currencies, the number of points, and the like available for the user at the time of data purchase may be displayed as well as the foregoing items.

Figure 40:
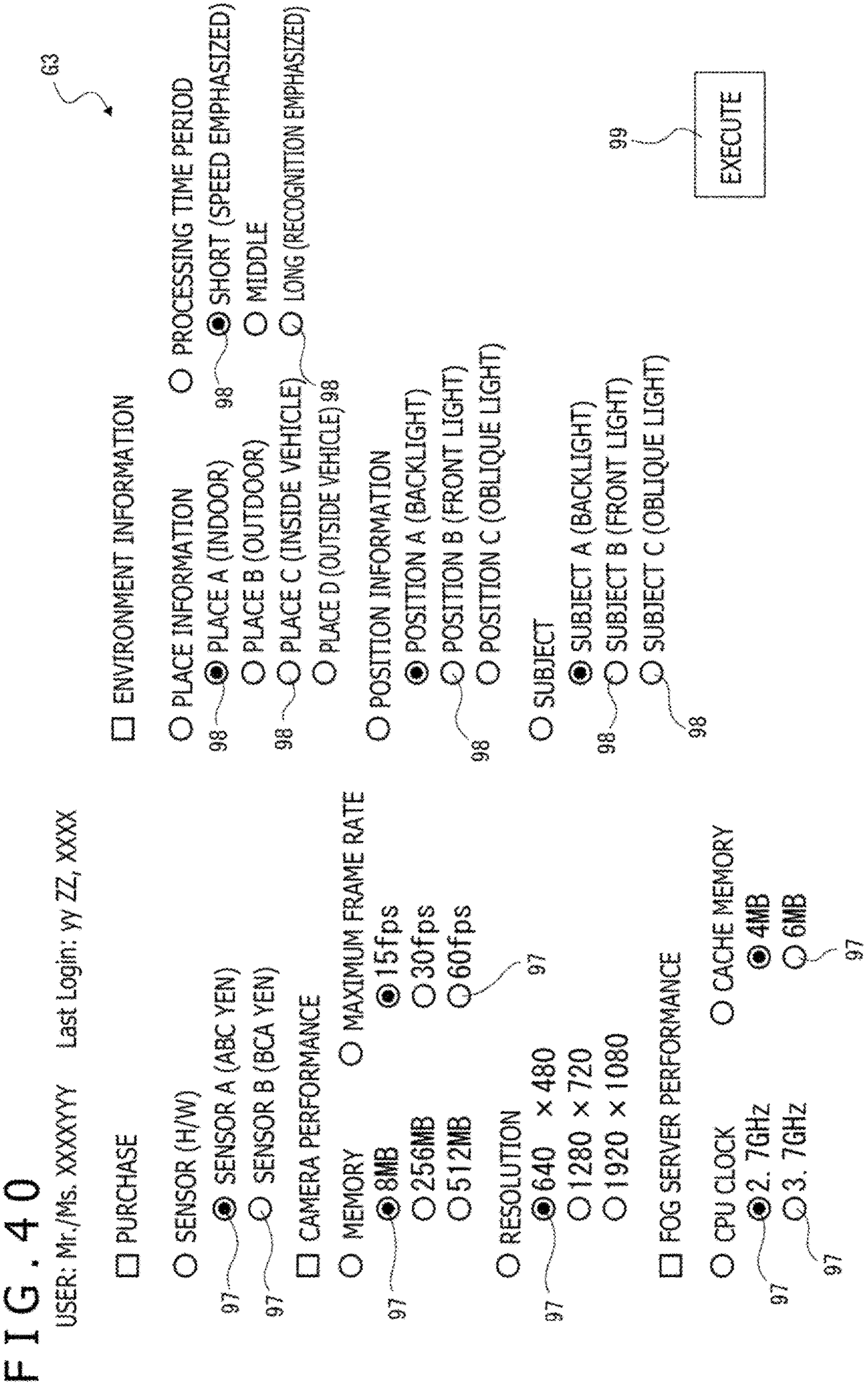
FIG. 40 is a diagram illustrating an example of a user screen presented to application users using the marketplace.

For example, FIG. 40 illustrates an example of a user screen G3 presented to the user desiring to conduct various types of analysis (application user described above) through deployment of an AI application and an AI model in the camera 3 as the edge side information processing device managed by the user.

The user is allowed to purchase, through the marketplace, the camera 3 disposed in a space corresponding to a monitoring target. Accordingly, radio buttons 97 operated to select a type and performance of the image sensor IS mounted on the camera 3, performance of the camera 3, and the like are disposed in a left part of the user screen G3.

Moreover, the user is allowed to purchase an information processing device functioning as the fog server 4 through the marketplace. Accordingly, radio buttons 97 operated to select respective items of performance of the fog server 4 are disposed in the left part of the user screen G3.

Further, the user who currently possesses the fog server 4 is allowed to register performance of the fog server 4 by inputting performance information associated with the fog server 4 to this field.

The user obtains a desired function by installing the purchased cameras 3 (or the cameras 3 purchased not through the marketplace) at any locations such as a store managed by the user. In this case, information associated with the installation locations of the cameras 3 is allowed to be registered in the marketplace so as to exert the maximum functions of the respective cameras 3.

Disposed in a right part of the user screen G3 are radio buttons 98 operated to select environment information associated with an environment where the cameras 3 are installed. The user selects appropriate environment information associated with the environment where the cameras 3 are installed, to set the optimal imaging settings described above for the target cameras 3.

Note that, in a case where the installation locations of the cameras 3 to be purchased are determined at the time of purchase of the cameras 3, the respective items in the left part and the respective items in the right part of the user screen G3 may be selected to purchase the cameras 3 for which optimal imaging settings are determined beforehand according to the planned installation locations.

An execution button 99 is provided in the user screen G3. With a press of the execution button 99, the screen shifts to a check screen for checking details of purchase or a check screen for checking settings of environment information. In this manner, the user is allowed to purchase the desired cameras 3 and the desired fog server 4 and set environment information associated with the cameras 3.

The environment information associated with the respective cameras 3 is changeable via the marketplace so as to handle a change of the installation locations of the cameras 3. The imaging settings for the cameras 3 can be reset to optimal settings by reinputting environment information associated with the installation locations of the cameras 3 through a not-illustrated change screen.

16. Summary

16-1. Summary 1

As described in the respective above examples, the image sensor IS has a layered structure which includes the first layer (die D1) containing the pixel array unit 41*a* where multiple pixels are two-dimensionally arrayed, the second layer (die D2) containing the conversion processing unit (analog circuit unit 41*b*) that performs A/D conversion for converting analog signals based on pixel signals output from the pixel array unit 41*a* into digital signals and the second layer storage unit 45*a* that stores image data corresponding to digital data based on the digital signals for each frame, and the third layer (die D3) containing the inference processing unit (AI image processing unit 44) that performs an inference process on the basis of the image data as an input tensor.

This configuration can reduce the sizes of the second layer and the third layer in comparison with a case of a configuration which has one layer collectively containing the respective components provided in the second and third layers.

In this case, each size of the layers can be made substantially equivalent to the size of the pixel array unit 41*a*. Accordingly, a surplus area containing no component is not produced in the first layer, and size reduction of the image sensor IS is therefore achievable.

Moreover, the second layer storage unit 45*a* functioning as a frame memory is provided in the second layer. Accordingly, in a case where an inference process using frame images and other processes using frame images (e.g., a process for outputting frame image data) are executed, these processes can be efficiently executed.

Further, in a case where the third layer contains the third layer storage unit 45*b*, the storage capacity of the third layer storage unit 45*b* can be reduced. Accordingly, size reduction of the third layer storage unit 45*b* and hence size reduction of the image sensor IS are achievable.

As described with reference to FIG. 8 and other figures, the second layer (die D2) of the image sensor IS may be provided between the first layer (die D1) and the third layer (die D3).

In this case, light is easily introduced into the pixel array unit 41*a* formed in the first layer. Moreover, the second layer adjacent to the first layer contains the conversion processing unit (analog circuit unit 41*b*) which performs A/D conversion of pixel signals read from the pixels included in the pixel array unit 41*a*. Accordingly, processing up to A/D conversion can smoothly be carried out.

Further, in the configuration where no other layer is disposed between the first layer and the second layer, wiring between these layers is facilitated, and therefore, the number of wiring members can be reduced.

In addition, the pixel array unit 41*a* formed in the first layer is disposed away from the inference processing unit (AI image processing unit 44) formed in the third layer in the lamination direction. Accordingly, effects of electromagnetic noise on charge accumulated on the pixels are allowed to decrease, and therefore, noise reduction is achievable.

As described with reference to FIGS. 8 and 10 and other figures, the third layer (die D3) of the image sensor IS may contain the third layer storage unit 45*b* functioning as a working memory for the inference process.

In this case, the inference process can be performed using an artificial intelligence model (AI model) stored in the third layer storage unit 45*b* formed in the same layer. Accordingly, a length of time required for the inference process can be shortened.

As described with reference to FIG. 15 and other figures, the conversion processing unit (analog circuit unit 41*b*) and the inference processing unit (AI image processing unit 44) in the image sensor IS may be disposed at positions not overlapping each other in the lamination direction of the respective layers.

This configuration can reduce the possibility that electromagnetic noise generated during execution of the inference process performed by the inference processing unit affects a result of A/D conversion. Accordingly, image data (RAW image data) containing less noise can be generated as digital data obtained after A/D conversion.

Moreover, this configuration allows synchronous execution of A/D conversion and the inference process. Accordingly, such an inference process complicated and requiring a long processing length of time is allowed to be executed.

As described with reference to FIG. 8 and other figures, a processor (e.g., CPU) different from a processor (e.g., DSP) functioning as the inference processing unit (AI image processing unit 44) may be provided in the third layer (die D3) of the image sensor IS.

For example, a CV process such as an edge emphasis process, a scaling process, and an affine transformation process can be performed using the CPU 43*a* having a high processing ability. In this manner, more reduction of a processing length of time is achievable than in a configuration performing the CV process by using the ISP 42*b*.

As described with reference to FIG. 9 and other figures, the third layer (die D3) of the image sensor IS may contain the authentication processing unit (authentication function F12) that performs an authentication process for permitting or prohibiting deployment of an artificial intelligence model to be used for the inference process.

For example, the authentication processing unit performs a process for obtaining authentication by the server device (cloud side information processing device) that deployment of the artificial intelligence model in the image sensor IS is permitted. For this purpose, the authentication processing unit manages necessary data such as a certificate. Moreover, in a case where the image sensor IS is authenticated, the image sensor IS is considered to receive the encrypted artificial intelligence model. Accordingly, the authentication processing unit manages a key for decoding this encrypted artificial intelligence model. Further, the authentication processing unit may manage a key for encrypting data to be output to the outside.

Various types of data managed by the authentication processing unit is stored in the storage units such as the ROM and the RAM (memory unit 45, second layer storage unit 45*a*, and third layer storage unit 45*b*) formed in the second layer (die D2) or the third layer.

In this case, only an artificial intelligence model received from an authorized server device is allowed to be deployed. Accordingly, security improves. Moreover, security of output data also improves.

As described with reference to FIG. 28 and other figures, the third layer (die D3) of the image sensor IS may contain the communication control unit (communication control function F14) that performs communication control for outputting a result of the inference process to the outside.

For example, the communication control unit for controlling an antenna provided outside the image sensor IS may be provided, enabling various types of communication achieved under LPWA such as SIGFOX and LTE-M.

Considering transmission of secure data from the image sensor IS, higher security is achievable by transmission of data under a program executed by the processing unit (communication control unit) within the image sensor IS than by transmission of data under a program executed by a processing unit outside the image sensor IS.

As described with reference to FIG. 10 and other figures, the first layer (die D1), the second layer (die D2), and the third layer (die D3) of the image sensor IS may have the same chip size.

In the case of the image sensor IS having the same chip size of the respective layers, dicing can be completed in only one step by carrying out dicing after overlapping the respective layers in a state of silicon wafer prior to dicing. Moreover, positioning of the respective chips is facilitated. Accordingly, facilitation of the manufacturing steps is achievable.

Note that the "same size" herein is defined such that the respective layers can be considered to have the same size in a case where the respective layers are laminated in the state of wafer and cut out by one dicing.

As described with reference to FIG. 12 and other figures, the third layer (die D3) of the image sensor IS may have a smaller chip size than the first layer (die D1) and the second layer (die D2).

In this case, cost reduction of the chips in the third layer is achievable. Moreover, the chips in the third layer are affixed to one surface of the second layer after dicing. Accordingly, only products determined as good products by inspection after dicing can be extracted and used. Improvement of yields of the image sensor IS is therefore achievable.

As described with reference to FIG. 13 and other figures, multiple chips may be provided in the third layer (die D3) of the image sensor IS.

For example, the memory formed in the third layer (third layer storage unit 45*b*) can be a high-integration type DRAM chip, while the chip functioning as a DSP or an ISP can be a chip manufactured by a most advanced process for 10 nm or shorter. In other words, chips manufactured by different semiconductor manufacturing processes can be mixed and formed in the same third layer. Accordingly, more size reduction is achievable than in a configuration where the multiple chips are formed in different layers.

Moreover, size reduction of the memory chip is achievable by providing the high-integration type chip as the memory formed in the third layer. In this case, multiple functions can be achieved by addition of a chip formed in a vacant space produced by this size reduction to function as a chip having a communication function.

As described with reference to FIG. 13 and other figures, each of the multiple chips in the image sensor IS may have a rectangular shape having long sides and short sides in a planar view, and the multiple chips may be disposed such that the long sides face each other.

For example, in the configuration where the long sides of the DRAM chip and the chip carrying the DSP are adjacent to each other, the number of wires between the processor and the memory is allowed to increase. Accordingly, speedup of processing is achievable.

As described with reference to FIGS. 25 and 27 and other figures, overlap in execution timing between A/D conversion performed in the second layer (die D2) and the inference process performed in the third layer (die D3) in the image sensor IS may be prevented.

This configuration can eliminate the possibility that electromagnetic noise generated during execution of the inference process by the inference processing unit (AI image processing unit 44) affects a result of A/D conversion.

16-2. Summary 2

As described in the respective above examples, the image sensor IS includes the pixel array unit 41*a* where multiple pixels are two-dimensionally arrayed, and the inference processing unit (AI image processing unit 44) which executes the first inference process using the first artificial intelligence model (first AI model M1) on the basis of image data output from the pixel array unit 41*a* and executes the second inference process using the second artificial intelligence model (second AI model M2) on the basis of a result of the first inference process.

For example, the first inference process achieves face detection, while the second inference process achieves feature value detection. Alternatively, the first inference process achieves noise removal, while the second inference process achieves feature value detection.

In this case, multiple artificial intelligence models more dedicated to the specific inference processes can be used to perform multiple inference processes. Accordingly, a more reliable inference result can be obtained on the whole in comparison with a case of a configuration which uses one artificial intelligence model integrating the first inference process and the second inference process to achieve inferences.

Moreover, functions of the image sensor IS are allowed to improve by performing multiple inference processes using multiple artificial intelligence models.

As described above, the inference processing unit (AI image processing unit 44) of the image sensor IS may switch the artificial intelligence model between the first artificial intelligence model (first AI model M1) and the second artificial intelligence model (second AI model M2) through setting switching of weighting factors of the artificial intelligence model.

In this manner, switching of the artificial intelligence model is achievable by easy processing.

As described above, the image sensor IS may include the image processing unit (CVDSP 42*c*) which performs image processing on the basis of a result of the first inference process. The inference processing unit (AI image processing unit 44) may perform the second inference process on the basis of an input tensor which is an image for which image processing has been applied by the image processing unit.

The image processing unit performs image processing for raising accuracy of the inference result of the second inference process. Accordingly, the second inference process is appropriately achievable.

As described above, the image sensor IS may include a frame memory (second layer storage unit 45*a*) which stores image data, and the image processing unit (CVDSP 42*c*) may perform image processing corresponding to an inference result of the first inference process (first AI image processing) for the image data stored in the frame memory.

For example, the first inference process performs a process for detecting a predetermined subject from image data. Moreover, the image processing unit performs a process for cutting out a region containing a predetermined captured subject from image data (frame image) stored in the frame memory, on the basis of coordinate information associated with the detected subject, and generating a partial image. In addition, the second inference process (second AI image processing) performs a process for switching an artificial intelligence model and extracting a feature point of the predetermined subject from the cut out partial image.

The image sensor IS including the frame memory can perform image processing using image data obtained before the first inference process is applied, i.e., image data designated as an input tensor for the first inference process.

As described above, the first inference process (first AI image processing) of the image sensor IS may be a process for detecting a specific target, and the second inference process (second AI image processing) may be a process for detecting a feature value of a detected target. The image processing unit (CVDSP 42*c*) may perform a process for cutting out an image region associated with the target detected by the first inference process from image data stored in the frame memory (second layer storage unit 45*a*) as image processing.

For example, the detection target is the face or body of a person or a license plate of a vehicle. For example, the process for detecting the feature value is a process for detecting a feature value of the face of a person corresponding to a detection target, a feature value for detecting the skeleton or posture of the body of a person corresponding to a detection target, a feature value of numerals of a license plate corresponding to a detection target, or the like.

In this manner, a process for detecting attribute information associated with a person, posture information and skeleton information associated with a person, a character string of a license plate, and the like by using OCR can appropriately be achieved by the second inference process.

As described above, the inference processing unit (AI image processing unit 44) of the image sensor IS may output image data associated with a result of the first inference process (first AI image processing), and the image processing unit (CVDSP 42*c*) may perform image processing for the image data output from the first inference process.

For example, image data after removal of noise from image data corresponding to frame images can be obtained as an inference result of the first inference process. The image processing unit performs image processing such as an edge emphasis process for the image data obtained after noise removal. Thereafter, the second inference process (second AI image processing) performs a subject recognition process on the basis of an input tensor which is image data obtained after noise removal and edge emphasis. In this manner, a subject can more accurately be inferred.

As described above, the first inference process (first AI image processing) of the image sensor IS may be a process for correcting deterioration of image data as an input tensor, and the image processing unit (CVDSP 42*c*) may perform a process for clarifying the corrected image data as image processing.

In this manner, appropriate image data from which a feature value is easily extractable can be input to the second artificial intelligence model as an input tensor.

As described with reference to FIG. 28 and other figures, the image sensor IS may include the mask processing unit (AI image processing unit 44 or privacy mask processing unit PM) which performs a mask process (privacy mask process) for masking a predetermined region in image data, and the communication control unit (communication control function F14) which performs transmission control for transmitting image data to which the mask process has been applied to another device.

For example, a part of image data transmitted from the image sensor IS is masked by the mask process. In this manner, only image data considering privacy is allowed to be output, for example. Moreover, in the configuration of the image sensor IS including the communication control unit that controls transmission of data to the outside of the cameras, data transmission under a malicious program is difficult to conduct, and therefore, security is allowed to improve.

As described with reference to FIGS. 18, 19, and 28, and others, the predetermined region designated by the image sensor IS may be a region containing a captured image of a person.

In this case, an image containing a person to which masking is applied is output from the image sensor IS. Accordingly, privacy protection of a subject is achievable.

As described above with reference to FIG. 29 and others, the image sensor IS may include the image processing unit (CVDSP 42*c*) which performs image processing for image data input to the first artificial intelligence model (first AI model M1) or the second artificial intelligence model (second AI model M2). In addition, the mask processing unit (AI image processing unit 44 or privacy mask processing unit PM) may perform a mask process for the image data obtained after image processing, and the image data input to the first artificial intelligence model or the second artificial intelligence model may be image data for which the mask process is not applied.

In this manner, image data as an input tensor for which the mask process is applied for privacy protection can be output in a case where image data input to the artificial intelligence model is desired to be checked using an external device for the purpose of inspection or the like.

As described above, the image sensor IS may include the frame memory (second layer storage unit 45*a*) which stores image data, and the mask processing unit (privacy mask processing unit PM) may change pixel values in a predetermined region of image data stored in the frame memory to predetermined values to achieve the mask process.

In this manner, the mask process is achievable by a process requiring only small processing loads, i.e., by changing a part of data stored in the frame memory.

As described with reference to FIG. 29 and other figures, the mask processing unit (privacy mask processing unit PM) of the image sensor IS may perform the mask process (privacy mask process) by using an artificial intelligence model.

For example, the mask processing unit may use an artificial intelligence model which detects a person contained in image data and which also performs a process for masking the corresponding image region.

As described with reference to FIGS. 30 and 31 and other figures, the mask processing unit (privacy mask processing unit PM) of the image sensor IS may perform the mask process by using an inference result of the first inference process or an inference result of the second inference process.

For example, in a case where the image sensor IS executes the first inference process using an artificial intelligence model for detecting a person, the mask processing unit may execute a process for masking a part of the image region on the basis of a result of this inference process.

In this manner, the mask process is efficiently achievable on the basis of the inference result.

Note that, in a case where the mask process is performed for input image data of the first inference process, one artificial intelligence model that performs both the first inference process and the mask process may be used.

As described with reference to FIGS. 29, 30, and 32 and other figures, the image sensor IS may include the ROM (memory unit 45) storing a program executed by the mask processing unit (privacy mask processing unit PM).

In this case, an illegal mask process and an illegal process for avoiding the mask process for privacy protection can be made difficult to execute. In other words, the possibility that an appropriate mask process is definitely executed is allowed to increase.

An information processing method according to the present technology is a method executed by a computer device constituting the image sensor IS. This method includes the first inference process performed using the first artificial intelligence model on the basis of image data output from the pixel array unit 41*a* where multiple pixels are two-dimensionally arrayed and the second inference process performed using the second artificial intelligence model on the basis of a result of the first inference process.

In addition, a program according to the present technology is a program readable by a computer device. This program causes an arithmetic processing unit of the image sensor IS to execute the respective processes illustrated in FIGS. 22, 23, and 24.

Such a program may be recorded beforehand in an HDD (Hard Disk Drive) as a recording medium built in a device such as a computer device, a ROM within a microcomputer including a CPU, or the like. Alternatively, the program may temporarily or permanently be stored (recorded) in a removable recording medium such as a flexible disk, a CD-ROM (Compact Disk Read Only Memory), an MO (Magnet Optical) disk, a DVD (Digital Versatile Disc), a Blu-ray Disc (registered trademark), a magnetic disk, a semiconductor memory, and a memory card. Such a removable recording medium may be provided as what is generally called package software.

In addition, such a program may be installed into a personal computer or the like from the removable recording medium or may be downloaded from a download site via a network such as a LAN (Local Area Network) and the Internet.

16-3. Summary 3

As described in the respective above examples, the image sensor IS includes the pixel array unit 41*a* where multiple pixels are two-dimensionally arrayed, the frame memory (second layer storage unit 45*a*) storing image data output from the pixel array unit 41*a*, the image processing unit (CVDSP 42*c*) which performs image processing for the image data stored in the frame memory, and the inference processing unit (AI image processing unit 44) which performs an inference process using an artificial intelligence model on the basis of an input tensor which is the image data for which image processing has been performed by the image processing unit.

In this case, image processing is achieved not for input data for each line but for input data which is image data containing at least multiple lines of image data. Accordingly, the image processing unit is capable of executing processing for the entire input images.

The process performed for the entire input image as the image data stored in the frame memory does not require processing for line data unlike in a case performing similar processing using an ISP that carries out data processing for each line. Accordingly, speedup of processing and reduction of processing loads are achievable.

As described with reference to FIGS. 16 and 17 and other figures, the image processing unit (CVDSP 42*c*) and the inference processing unit (AI image processing unit 44) of the image sensor IS may be different processors.

In this case, appropriate processors can be employed according to respective processing details of the image processing unit and the inference processing unit.

As described with reference to FIGS. 16 and 17 and other figures, the image processing unit (CVDSP 42*c*) of the image sensor IS may perform a CV process.

In addition, the CV process performed by the image sensor IS may include at least a part of an edge emphasis process, a scaling process, and an affine transformation process.

Such a CV process for the frame images is carried out by the image processing unit (CVDSP 42*c*). Accordingly, efficient processing is achievable. Specifically, in a case where the CV process is carried out using an ISP, the ISP conducts processing for each line data. Accordingly, the CV process requires conversion from image data into line data. Meanwhile, the image processing unit including a DSP or the like can achieve the CV process without conversion from frame images into line data. Accordingly, processing efficiency improves.

As described in the fourth example of AI image processing and others, the image processing unit (CVDSP 42*c*) of the image sensor IS may generate an input tensor of an artificial intelligence model.

In this case, image data or the like appropriately corrected by the image processing unit is input to the artificial intelligence model as an input tensor. Accordingly, a highly accurate inference process is achievable.

An information processing method according to the present technology is a method executed by a computer device. This method includes a process for storing image data output from the pixel array unit 41*a* where multiple pixels are two-dimensionally arrayed, image processing for the stored image data, and an inference process using an artificial intelligence model on the basis of an input tensor which is the image data for which image processing has been performed.

A program according to the present technology is a program readable by a computer device. This program causes an arithmetic processing unit of the image sensor IS to execute the respective processes illustrated in FIGS. 22, 23, and 24.

Note that advantageous effects described in the present description are presented only by way of example and not by way of limitation. In addition, other advantageous effects may be offered.

Moreover, the respective examples described above may be combined in any manners. The various operations and effects described above can be achieved even by these various combinations.

17. Present Technology

The present technology can also adopt the configurations as described below.

(1)

An image sensor including:

a layered structure that includes a first layer that includes a pixel array unit where multiple pixels are two-dimensionally arrayed, a second layer that includes a conversion processing unit configured to perform A/D conversion for converting an analog signal based on a pixel signal output from the pixel array unit, into a digital signal, and a second layer storage unit configured to store image data for each frame, the image data being digital data based on the digital signal, and a third layer that includes an inference processing unit configured to perform an inference process on the basis of the image data as an input tensor.

(2)

The image sensor according to (1) above, in which the second layer is provided between the first layer and the third layer.

(3)

The image sensor according to (1) or (2) above, in which a third layer storage unit designated as a working memory for the inference process is provided in the third layer.

(4)

The image sensor according to any of (1) through (3) above, in which the conversion processing unit and the inference processing unit are disposed at positions not overlapping each other in a lamination direction of the respective layers.

(5)

The image sensor according to any of (1) through (4) above, in which a processor different from a processor functioning as the inference processing unit is provided in the third layer.

(6)

The image sensor according to any of (1) through (5) above, in which an authentication processing unit that performs an authentication process for permitting or prohibiting deployment of an artificial intelligence model to be used for the inference process is provided in the third layer.

(7)

The image sensor according to any of (1) through (6) above, in which a communication control unit that performs communication control for outputting a result of the inference process to an outside is provided in the third layer.

(8)

The image sensor according to any of (1) through (7) above, in which the first layer, the second layer, and the third layer have an identical chip size.

(9)

The image sensor according to any of (1) through (7) above, in which the third layer has a smaller chip size than the first layer and the second layer.

(10)

The image sensor according to any of (1) through (7) above, in which multiple chips are provided in the third layer.

(11)

The image sensor according to (10) above, in which each of the multiple chips has a rectangular shape having long sizes and short sizes in a planar view, and the multiple chips are provided such that the long sizes face each other.

(12)

The image sensor according to any of (1) through (11) above, in which overlap in execution timing between the A/D conversion in the second layer and the inference process in the third layer is prevented.

REFERENCE SIGNS LIST

41*a*: Pixel array unit
41*b*: Analog circuit unit (conversion processing unit)
44: AI image processing unit (inference processing unit)
45*a*: Second layer storage unit
45*b*: Third layer storage unit
D1: Die (first layer)
D2: Die (second layer)
D3, D3*a*, D3*b*: Die (third layer)
F12: Authentication function (authentication processing unit)
F13: Communication control function (communication control unit)
IS: Image sensor

The invention claimed is:

1. An image sensor comprising:

a layered structure that includes a first layer that includes a pixel array where multiple pixels are two-dimensionally arrayed, a second layer that includes conversion processing circuitry configured to perform A/D conversion for converting an analog signal based on a pixel signal output from the pixel array, into a digital signal, and a second layer memory configured to store image data for each frame, the image data being digital data based on the digital signal, and a third layer that includes inference processing circuitry configured to perform an inference process based on the image data as an input tensor, wherein the conversion processing circuitry and the inference processing circuitry are disposed at positions not overlapping each other in a lamination direction of the respective layers.

2. The image sensor according to claim 1, wherein the second layer is provided between the first layer and the third layer.

3. The image sensor according to claim 1, wherein a third layer memory designated as a working memory for the inference process is provided in the third layer.

4. The image sensor according to claim 1, wherein a processor different from a processor functioning as the inference processing circuitry is provided in the third layer.

5. The image sensor according to claim 1, wherein authentication processing circuitry that performs an authentication process for permitting or prohibiting deployment of an artificial intelligence model to be used for the inference process is provided in the third layer.

6. The image sensor according to claim 1, wherein communication control circuitry that performs communication control for outputting a result of the inference process to an outside is provided in the third layer.

7. The image sensor according to claim 1, wherein the first layer, the second layer, and the third layer have an identical chip size.

8. The image sensor according to claim 1, wherein the third layer has a smaller chip size than the first layer and the second layer.

9. The image sensor according to claim 1, wherein multiple chips are provided in the third layer.

10. The image sensor according to claim 9, wherein each of the multiple chips has a rectangular shape having long sides and short sides in a planar view, and the multiple chips are provided such that the long sides face each other.

11. The image sensor according to claim 1, wherein overlap in execution timing between the A/D conversion in the second layer and the inference process in the third layer is prevented.

* * * * *